(12) United States Patent
Kawashima et al.

(10) Patent No.: US 9,324,726 B2
(45) Date of Patent: Apr. 26, 2016

(54) METHOD FOR MANUFACTURING A SEMICONDUCTOR DEVICE

(71) Applicant: Renesas Electronics Corporation, Kawasaki-shi, Kanagawa (JP)

(72) Inventors: Yoshiyuki Kawashima, Kanagawa (JP); Hiraku Chakihara, Kanagawa (JP); Kyoko Umeda, Kanagawa (JP); Akio Nishida, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/802,050

(22) Filed: Jul. 17, 2015

(65) Prior Publication Data
US 2016/0035734 A1      Feb. 4, 2016

(30) Foreign Application Priority Data
Aug. 1, 2014     (JP) ................................. 2014-158245

(51) Int. Cl.
*H01L 21/336*     (2006.01)
*H01L 27/115*     (2006.01)
*H01L 21/28*      (2006.01)

(52) U.S. Cl.
CPC ...... *H01L 27/1157* (2013.01); *H01L 21/28273* (2013.01); *H01L 27/11524* (2013.01)

(58) Field of Classification Search
CPC ....... H01L 27/115; H01L 27/11563–27/11575
See application file for complete search history.

(56) References Cited

U.S. PATENT DOCUMENTS

| | | | |
|---|---|---|---|
| 7,011,999 B2 | 3/2006 | Minami et al. | |
| 2011/0095348 A1* | 4/2011 | Chakihara | H01L 21/28273 257/298 |

FOREIGN PATENT DOCUMENTS

JP          2004-200504 A        7/2004

* cited by examiner

*Primary Examiner* — Daniel Shook
(74) *Attorney, Agent, or Firm* — Shapiro, Gabor and Rosenberger, PLLC

(57) ABSTRACT

The performances of a semiconductor device are improved. In a method for manufacturing a semiconductor device, in a memory cell region, a control gate electrode formed of a first conductive film is formed over the main surface of a semiconductor substrate. Then, an insulation film and a second conductive film are formed in such a manner as to cover the control gate electrode, and the second conductive film is etched back. As a result, the second conductive film is left over the sidewall of the control gate electrode via the insulation film, thereby to form a memory gate electrode. Then, in a peripheral circuit region, a p type well is formed in the main surface of the semiconductor substrate. A third conductive film is formed over the p type well. Then, a gate electrode formed of the third conductive film is formed.

13 Claims, 37 Drawing Sheets

| APPLIED VOLTAGE / OPERATION | Vd | Vcg | Vmg | Vs | Vb |
|---|---|---|---|---|---|
| WRITE | Vdd | 1V | 12V | 6V | 0 |
| ERASE | 0 | 0 | -6V | 6V | 0 |
| READ | Vdd | Vdd | 0 | 0 | 0 |

Vdd = 1.5V

METHOD FOR MANUFACTURING A SEMICONDUCTOR DEVICE

CROSS-REFERENCE TO RELATED APPLICATIONS

The disclosure of Japanese Patent Application No. 2014-158245 filed on Aug. 1, 2014 including the specification, drawings and abstract is incorporated herein by reference in its entirety.

BACKGROUND

The present invention relates to a method for manufacturing a semiconductor device, and is preferably applicable to, for example, a method for manufacturing a semiconductor device including a semiconductor element formed in a semiconductor substrate therein.

A semiconductor device has been widely used which has a memory cell region where a memory cell such as a nonvolatile memory is formed over a semiconductor substrate, and a peripheral circuit region where a peripheral circuit including, for example, a MISFET (Metal Insulator Semiconductor Field Effect Transistor) is formed over the semiconductor substrate.

For example, as a nonvolatile memory, there may be formed a memory cell formed of a split gate type cell using a MONOS (Metal-Oxide-Nitride-Oxide-Semiconductor) film. In this case, the memory cell is formed of two MISFETs of a control transistor having a control gate electrode, and a memory transistor having a memory gate electrode. Whereas, the gate insulation film of the memory transistor is formed of a lamination film including, for example, a silicon oxide film, a silicon nitride film, and a silicon oxide film, and called an ONO (Oxide Nitride Oxide) film.

Japanese Unexamined Patent Application Publication NO. 2004-200504 (Patent Document 1) discloses the following technology: in a semiconductor integrated circuit device, a memory cell is formed in a memory cell formation region at a main surface of a substrate, and a low breakdown voltage p type MISFET is formed in a low voltage p MIS (Metal Insulator Semiconductor) formation region at the main surface of the substrate.

CITED DOCUMENT

Patent Document

[Patent Document 1]
Japanese Unexamined Patent Application Publication NO. 2004-200504

SUMMARY

In the manufacturing steps of the semiconductor device having the memory cell region and the peripheral circuit region, after forming an active region in the peripheral circuit region, an ONO film, and a conductive film for a memory gate electrode may be formed.

However, the ONO film is formed at relatively higher temperatures. Therefore, when, before forming an ONO film, a well as a semiconductor region has been already formed in the peripheral circuit region, the impurity doped into the well in the peripheral circuit region is diffused at a high temperature during the formation of the ONO film, resulting in a change in concentration distribution of the impurity in the well. Accordingly, the threshold voltage of the MISFET formed in the peripheral circuit region, or the like varies. As a result, it is not possible to improve the performances of the semiconductor device including a nonvolatile memory.

Other objects and novel features will be apparent from the description of this specification and the accompanying drawings.

In accordance with one embodiment, with a method for manufacturing a semiconductor device, in a first region, a control gate electrode formed of a first conductive film is formed over the main surface of a semiconductor substrate. Then, an insulation film and a second conductive film are formed in such a manner as to cover the control gate electrode, and the second conductive film is etched back. As a result, the second conductive film is left over the sidewall of the control gate electrode via the insulation film, thereby to form a memory gate electrode. Then, in a second region, a semiconductor region is formed in the main surface of the semiconductor substrate. Over the semiconductor region, there is formed a third conductive film. Then, there is formed a gate electrode formed of the third conductive film.

In accordance with one embodiment, it is possible to improve the performances of a semiconductor device.

DETAILED DESCRIPTION

Figure 1:
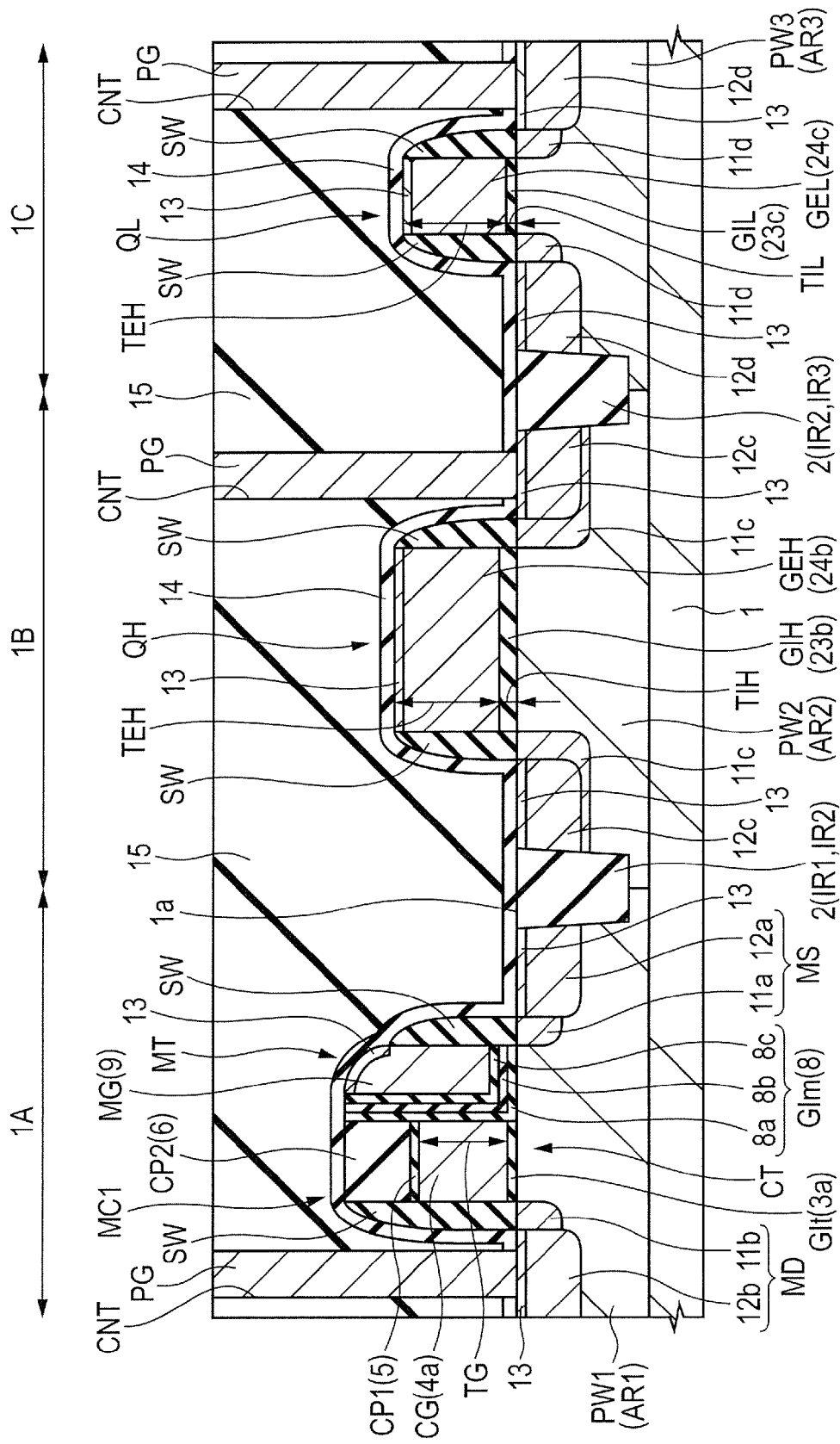
FIG. 1 is an essential part cross sectional view of a semiconductor device of First Embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other.

Further, in the following embodiments, when a reference is made to the number of elements, and the like (including number, numerical value, quantity, range, or the like), the number of elements is not limited to the specific number, but may be greater than or less than the specific number, unless otherwise specified, except for the case where the number is apparently limited to the specific number in principle, and except for other cases.

Further, in the following embodiments, it is needless to say that the constitutional elements (including element steps, or the like) are not always essential, unless otherwise specified, except for the case where they are apparently considered essential in principle, and except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, representative embodiments will be described in details by reference to the accompanying drawings. Incidentally, in all the drawings for describing the following embodiments, the members having the same function are given the same reference signs and numerals, and a repeated description thereon is omitted. Further, in the following embodiments, unless otherwise required, a description on the same or similar portions will not be repeated in principle.

Further, in the drawing for use in the embodiment, hatching may be omitted even in cross section for ease of understanding of the drawing.

First Embodiment

Structure of Semiconductor Device

Figures 2, 3:
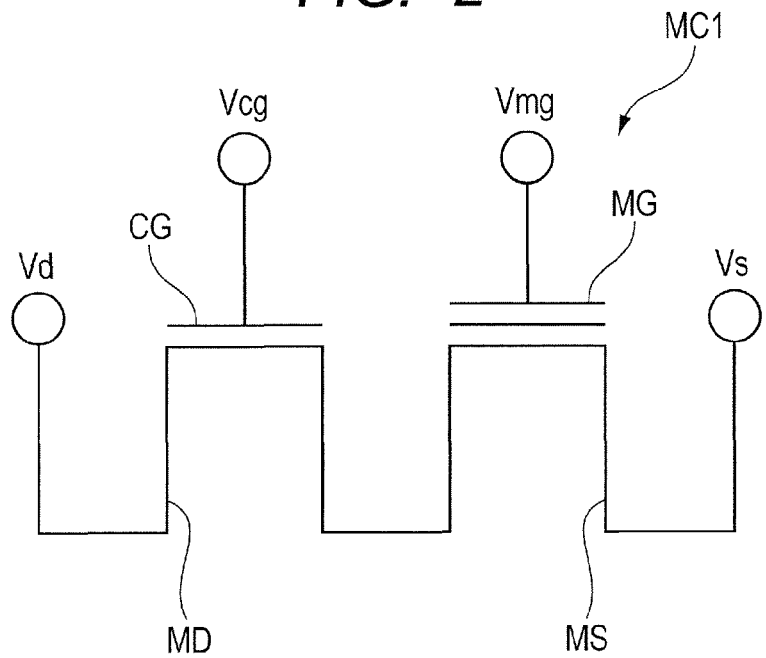
FIG. 2 is an equivalent circuit diagram of a memory cell in the semiconductor device of First Embodiment.
FIG. 3 is a table showing one example of the conditions for application of a voltage to each site of the memory cell at the times of "write", "erase", and "read"

First, the structure of a semiconductor device of First Embodiment will be described by reference to the accompanying drawings. FIG. 1 is an essential part cross sectional view of the semiconductor device of First Embodiment. FIG. 2 is an equivalent circuit diagram of a memory cell in the semiconductor device of First Embodiment.

As shown in FIG. 1, the semiconductor device has a semiconductor substrate 1. The semiconductor substrate 1 is a semiconductor wafer formed of, for example, a p type single crystal silicon having a specific resistance of about 1 to 10 $\Omega$cm.

The semiconductor device has a memory cell region 1A and peripheral circuit regions 1B and 1C as some regions of the main surface 1a of the semiconductor substrate 1. In the memory cell region 1A, there is formed a memory cell MC1.

In the peripheral circuit region 1B, there is formed a MISFET QH. In the peripheral circuit region 1C, there is formed a MISFET QL. The memory cell region 1A and the peripheral circuit region 1B are not required to be adjacent to each other. The memory cell region 1A and the peripheral circuit region 1C are not required to be adjacent to each other. The peripheral circuit region 1B and the peripheral circuit region 1C are not required to be adjacent to each other. However, for ease of understanding, in the cross sectional view of FIG. 1, the peripheral circuit region 1B is shown adjacent to the memory cell region 1A, and the peripheral circuit region 1C is shown adjacent to the peripheral circuit region 1B.

Herein, the peripheral circuit is a circuit other than a nonvolatile memory, and is a processor such as a CPU (Central Processing Unit), a control circuit, a sense amplifier, a column decoder, a row decoder, an input/output circuit, or the like. The MISFET QH formed in the peripheral circuit region 1B, and the MISFET QL formed in the peripheral circuit region 1C are each a MISFET for a peripheral circuit.

The peripheral circuit region 1B is a high voltage type MIS (Metal Insulator Semiconductor) region. The peripheral circuit region 1C is a low voltage type MIS region. Therefore, the MISFET QH formed in the peripheral circuit region 1B is a high breakdown voltage MISFET. The MISFET QL formed in the peripheral circuit region 1C is a low breakdown voltage MISFET. The peripheral circuit region includes a high voltage type MIS region and a low voltage type MIS region, which enables the formation of various circuits.

First, the structure of the memory cell MC1 formed in the memory cell region 1A will be specifically described.

In the memory cell region 1A, the semiconductor device has an active region AR1 and an element isolation region IR1. The element isolation region IR1 is for isolating elements. In the element isolation region IR1, there is formed an element isolation film 2. The active region AR1 is defined, namely, partitioned by the element isolation region IR1, and is electrically isolated from other active regions by the element isolation region IR1. In the active region AR1, there is formed a p type well PW1. Namely, the active region AR1 is a region including the p type well PW1 formed therein. The p type well PW1 has a p type conductivity type.

As shown in FIG. 1, in the p type well PW1 in the memory cell region 1A, there is formed a memory cell MC1 formed of a memory transistor MT and a control transistor CT. In the memory cell region 1A, in actuality, a plurality of memory cells MC1 are formed in an array. FIG. 1 shows a cross section of one memory cell MC1 of them. The memory cell MC1 is included in the nonvolatile memory provided in the semiconductor device.

The memory cell MC1 is a split gate type memory cell. Namely, as shown in FIG. 1, the memory cell MC1 has a control transistor CT having a control gate electrode CG, and a memory transistor MT coupled to the control transistor CT, and having a memory gate electrode MG.

As shown in FIG. 1, the memory cell MC1 has an n type semiconductor region MS, an n type semiconductor region MD, a control gate electrode CG, and a memory gate electrode MG. The n type semiconductor region MS and the n type semiconductor region MD each have an n type conductivity type which is a conductivity type opposite to the p type conductivity type. Further, the memory cell MC1 has a cap insulation film CP1 formed over the control gate electrode CG, and a cap insulation film CP2 formed over the cap insulation film CP1. Still further, the memory cell MC1 has a gate insulation film GIt formed between the control gate electrode CG and the p type well PW1 of the semiconductor substrate 1, and a gate insulation film GIm formed between the memory gate electrode MG and the p type well PW1 of the semiconductor substrate 1, and between the memory gate electrode MG and the control gate electrode CG.

The control gate electrode CG and the memory gate electrode MG extend along the main surface 1a of the semiconductor substrate 1, and are arranged side by side with the gate insulation film GIm interposed between mutually opposing side surfaces, namely, sidewalls thereof. The direction of extension of the control gate electrode CG and the memory gate electrode MG is the direction perpendicular to the paper plane of FIG. 1. The control gate electrode CG is formed over the p type well PW1 at a portion thereof situated between the semiconductor region MD and the semiconductor region MS, namely, over the main surface 1a of the semiconductor substrate 1 with the gate insulation film GIt interposed therebetween. Whereas, the memory gate electrode MG is formed over the p type well PW1 at a portion thereof situated between the semiconductor region MD and the semiconductor region MS, namely, over the main surface 1a of the semiconductor substrate 1 with the gate insulation film GIm interposed therebetween. Further, on the semiconductor region MS side, there is arranged the memory gate electrode MG. On the semiconductor region MD side, there is arranged the control gate electrode CG. The control gate electrode CG and the memory gate electrode MG are each a gate electrode forming the memory cell MC1, namely, the nonvolatile memory.

Incidentally, the cap insulation film CP1 and the cap insulation film CP2 formed over the control gate electrode CG also extend along the main surface 1a of the semiconductor substrate 1.

The control gate electrode CG and the memory gate electrode MG are adjacent to each other with the gate insulation film GIm interposed therebetween. The memory gate electrode MG is formed in a sidewall spacer shape over the side surface, namely, the sidewall of the control gate electrode CG with the gate insulation film GIm interposed therebetween. Whereas, the gate insulation film GIm extends over both the regions of a region between the memory gate electrode MG and the p type well PW1 of the semiconductor substrate 1, and a region between the memory gate electrode MG and the control gate electrode CG.

The gate insulation film GIt formed between the control gate electrode CG and the p type well PW1 functions as the gate insulation film of the control transistor CT. Whereas, the gate insulation film GIm formed between the memory gate electrode MG and the p type well PW1 functions as the gate insulation film of the memory transistor MT.

The gate insulation film GIt is formed of an insulation film 3a. The insulation film 3a is formed of a silicon oxide film, a silicon nitride film, or a silicon oxynitride film, or a high dielectric constant film having a higher relative dielectric constant than that of a silicon nitride film, namely, a so-called High-k film. Incidentally, the term "a High-k film or a high dielectric constant film" used in the present application means a film higher in dielectric constant (relative dielectric constant) than silicon nitride. As the insulation film 3a, there can be used, for example, a metal oxide film such as a hafnium oxide film, a zirconium oxide film, an aluminum oxide film, a tantalum oxide film, or a lanthanum oxide film.

The gate insulation film GIm is formed of an insulation film 8. The insulation film 8 is formed of a lamination film including a silicon oxide film 8a, a silicon nitride film 8b as a charge accumulation part over the silicon oxide film 8a, and a silicon oxide film 8c over the silicon nitride film 8b, and referred to as an ONO film. Incidentally, the gate insulation film GIm between the memory gate electrode MG and the p type well PW1 functions as the gate insulation film of the memory transistor MT as described previously. On the other hand, the gate insulation film GIm between the memory gate electrode MG and the control gate electrode CG functions as an insulation film for establishing an insulation, namely, an electrical isolation between the memory gate electrode MG and the control gate electrode CG.

Of the insulation film 8, the silicon nitride film 8b is an insulation film for accumulating electrical charges, and functions as a charge accumulation part. Namely, the silicon nitride film 8b is a trapping insulation film formed in the insulation film 8. Accordingly, the insulation film 8 can be regarded as an insulation film having a charge accumulation part in the inside thereof.

The silicon oxide film 8c and the silicon oxide film 8a situated over and under the silicon nitride film 8b, respectively, can each function as a charge block layer for confining electrical charges therein. The silicon nitride film 8b is interposed between the silicon oxide film 8c and the silicon oxide film 8a. This structure enables accumulation of electrical charges into the silicon nitride film 8b. The silicon oxide film 8a, the silicon nitride film 8b, and the silicon oxide film 8c can also be regarded as an ONO film as described previously.

The control gate electrode CG is formed of a conductive film 4a. The conductive film 4a is formed of silicon, and is formed of, for example, an n type polysilicon film which is a polycrystal silicon film doped with an n type impurity. Specifically, the control gate electrode CG is formed of a patterned conductive film 4a.

The memory gate electrode MG is formed of a conductive film 9. The conductive film 9 is formed of silicon, and is formed of, for example, an n type polysilicon film which is a polycrystal silicon film doped with an n type impurity. The memory gate electrode MG is formed in the following manner: the conductive film 9 formed over the semiconductor substrate 1 in such a manner as to cover the control gate electrode CG is anisotropically etched, namely, etched back; as a result, the conductive film 9 is left over the sidewall of the control gate electrode CG via the insulation film 8. Accordingly, the memory gate electrode MG is formed in a sidewall spacer shape over the sidewall situated on a first side of the control gate electrode CG adjacent to the memory gate electrode MG via the insulation film 8.

Over the control gate electrode CG, the cap insulation film CP2 is formed via the cap insulation film CP1. Accordingly, the memory gate electrode MG is formed in a sidewall spacer shape over the sidewall situated on a first side of the cap insulation film CP2 formed over the control gate electrode CG adjacent to the memory gate electrode MG via the insulation film 8.

The cap insulation film CP1 is formed of an insulation film 5 containing silicon and oxygen. The insulation film 5 is formed of, for example, a silicon oxide film. The cap insulation film CP2 is formed of an insulation film 6 containing silicon and nitrogen. The insulation film 6 is formed of, for example, a silicon nitride film.

The cap insulation film CP2 is a protective film for protecting the control gate electrode CG, a hard mask film for patterning the conductive film 4, and forming the control gate electrode CG, or a spacer film for adjusting the height of the memory gate electrode MG when the conductive film 9 is etched back to form the memory gate electrode MG. By forming the cap insulation film CP2 as a spacer film, it is possible to make the film thickness of the control gate electrode CG smaller than the height of the memory gate electrode MG.

The semiconductor region MS is a semiconductor region functioning as one of a source region or a drain region. The semiconductor region MD is a semiconductor region functioning as the other of the source region or the drain region. Herein, the semiconductor region MS is a semiconductor region functioning as, for example, a source region. The semiconductor region MD is a semiconductor region functioning as, for example, a drain region. The semiconductor region MS and the semiconductor region MD are each formed of a semiconductor region doped with an n type impurity, and each include a LDD (Lightly doped drain) structure.

The semiconductor region MS for source has an $n^-$ type semiconductor region 11a, and an $n^+$ type semiconductor region 12a having a higher impurity concentration than that of the $n^-$ type semiconductor region 11a. Whereas, the semiconductor region MD for drain has an $n^-$ type semiconductor region 11b, and an $n^+$ type semiconductor region 12b having a higher impurity concentration than that of the $n^-$ type semiconductor region 11b. The $n^+$ type semiconductor region 12a is deeper in junction depth and higher in impurity concentration than the $n^-$ type semiconductor region 11a. Whereas, the $n^+$ type semiconductor region 12b is deeper in junction depth, and higher in impurity concentration than the $n^-$ type semiconductor region 11b.

Over the sidewalls of the memory gate electrode MG and the control gate electrode CG on respective sides thereof not adjacent to each other, there are formed sidewall spacers SW formed of an insulation film such as a silicon oxide film or a silicon nitride film, or a lamination film thereof, respectively. In other words, over the sidewall, namely, over the side surface of the memory gate electrode MG opposite to the side thereof adjacent to the control gate electrode CG via the gate insulation film GIm, and over the sidewall, namely, over the side surface of the control gate electrode CG opposite to the side thereof adjacent to the memory gate electrode MG via the gate insulation film GIm, there are formed the sidewall spacers SW, respectively.

Incidentally, between the memory gate electrode MG and the sidewall spacer SW, between the control gate electrode CG and the sidewall spacer SW, and between the control gate electrode CG and the gate insulation film GIm, there may be interposed sidewall insulation films not shown, respectively.

The $n^-$ type semiconductor region 11a is formed in self-alignment with the side surface of the memory gate electrode MG. The $n^+$ type semiconductor region 12a is formed in self-alignment with the side surface of the sidewall spacer SW. Accordingly, the low-concentration $n^-$ type semiconductor region 11a is formed under the sidewall spacer SW over the sidewall of the memory gate electrode MG. The high-concentration $n^+$ type semiconductor region 12a is formed at the outside of the low-concentration $n^-$ type semiconductor region 11a. Therefore, the low-concentration $n^-$ type semiconductor region 11a is formed in such a manner as to be adjacent to the p type well PW1 as a channel region of the memory transistor MT. Whereas, the high-concentration $n^+$ type semiconductor region 12a is formed in such a manner as to be in contact with the low-concentration $n^-$ type semiconductor region 11a, and to be separated from the p type well PW1 as a channel region of the memory transistor MT by the distance corresponding to the $n^-$ type semiconductor region 11a.

The $n^-$ type semiconductor region 11b is formed in self-alignment with the side surface of the control gate electrode CG. The $n^+$ type semiconductor region 12b is formed in self-alignment with the side surface of the sidewall spacer SW. Accordingly, the low-concentration $n^-$ type semiconductor region 11b is formed under the sidewall spacer SW over the sidewall of the control gate electrode CG. The high-concentration $n^+$ type semiconductor region 12b is formed at the outside of the low-concentration n⁻ type semiconductor region 11b. Therefore, the low-concentration n⁻ type semiconductor region 11b is formed in such a manner as to be adjacent to the p type well PW1 as the channel region of the control transistor CT. Whereas, the high-concentration n⁺ type semiconductor region 12b is formed in such a manner as to be in contact with the low-concentration n⁻ type semiconductor region 11b, and to be separated from the p type well PW1 as the channel region of the control transistor CT by the distance corresponding to the n⁻ type semiconductor region 11b.

Under the gate insulation film GIm under the memory gate electrode MG, there is formed the channel region of the memory transistor. Under the gate insulation film GIt under the control gate electrode CG, there is formed the channel region of the control transistor CT.

Over the n⁺ type semiconductor region 12a, or over the n⁺ type semiconductor region 12b, namely, at the top surface of the n⁺ type semiconductor region 12a or the n⁺ type semiconductor region 12b, a metal silicide layer 13 is formed by a Salicide: Self Aligned Silicide) technology, or the like. The metal silicide layer 13 is formed of, for example, a cobalt silicide layer, a nickel silicide layer, or a platinum-doped nickel silicide layer. The metal silicide layer 13 can reduce the diffusion resistance and the contact resistance. Incidentally, the metal silicide layer 13 may be formed over the memory gate electrode MG.

Then, the configuration of a high breakdown voltage MISFET QH formed in the peripheral circuit region 1B will be specifically described.

In the peripheral circuit region 1B, the semiconductor device has an active region AR2 and an element isolation region IR2. The element isolation region IR2 is for isolating elements. In the element isolation region IR2, there is formed an element isolation film 2. The active region AR2 is defined, namely, partitioned by the element isolation region IR2, and is electrically isolated from other active regions by the element isolation region IR2. In the active region AR2, there is formed a p type well PW2. Namely, the active region AR2 is a region including the p type well PW2 formed therein. The p type well PW2 has a p type conductivity type.

Incidentally, as described previously, in the cross sectional view of FIG. 1, for ease of understanding, the peripheral circuit region 1B is shown adjacent to the memory cell region 1A. Accordingly, in the cross sectional view of FIG. 1, there is shown an example in which the element isolation region IR1 in the memory cell region 1A is also the element isolation region IR2 in the peripheral circuit region 1B.

As shown in FIG. 1, in the p type well PW2 in the peripheral circuit region 1B, there is formed a high breakdown voltage MISFET QH. In the peripheral circuit region 1B, in actuality, there are formed a plurality of high breakdown voltage MISFETs QH. FIG. 1 shows a cross section perpendicular to the gate width direction of one high breakdown voltage MISFET QH of them.

As shown in FIG. 1, the high breakdown voltage MISFET QH has a semiconductor region formed of an n⁻ type semiconductor region 11c and an n⁺ type semiconductor region 12c, a gate insulation film GIH formed over the p type well PW2, and a gate electrode GEH formed over the gate insulation film GIH. The n⁻ type semiconductor region 11c and the n⁺ type semiconductor region 12c are formed in the upper layer part of the p type well PW2 of the semiconductor substrate 1. The n⁻ type semiconductor region 11c and the n⁺ type semiconductor region 12c each have an n type conductivity type which is an opposite conductivity type to the p type conductivity type.

The gate insulation film GIH functions as the gate insulation film of the MISFET QH. The gate insulation film GIH is formed of an insulation film 23b. The insulation film 23b is formed of a silicon oxide film, a silicon nitride film, or a silicon oxynitride film, or a high dielectric constant film having a higher relative dielectric constant than that of a silicon nitride film, namely, a so-called High-k film. As the insulation film 23b formed of a High-k film, there can be used, for example, a metal oxide film such as a hafnium oxide film, a zirconium oxide film, an aluminum oxide film, a tantalum oxide film, or a lanthanum oxide film The gate electrode GEH is formed of a conductive film 24b. The conductive film 24b is formed of silicon, and is formed of, for example, an n type polysilicon film which is a polycrystal silicon film doped with an n type impurity. Specifically, the gate electrode GEH is formed of a patterned conductive film 24b. As the conductive film 24b, there can be used a conductive film different from the conductive film 4a included in the control gate electrode CG. Accordingly, the film thickness TEH of the gate electrode GEH can be set different from the film thickness TG of the control gate electrode CG.

Incidentally, when the metal silicide layer 13 is formed over the gate electrode GEH, the film thickness TEH of the gate electrode GEH can be defined as the distance from the bottom surface of the gate electrode GEH to the top surface of the metal silicide layer 13 formed over the gate electrode GEH.

The semiconductor regions each formed of the n⁻ type semiconductor region 11c and the n⁺ type semiconductor region 12c are semiconductor regions for source and for drain, doped with an n type impurity, and each include a LDD structure as with the semiconductor regions MS and MD of the memory cell MC1. Namely, the n⁺ type semiconductor region 12c is shallower in junction depth, and higher in impurity concentration than the n⁻ type semiconductor region 11c.

Over the sidewall of the gate electrode GEH, there is formed a sidewall spacer SW formed of an insulation film such as a silicon oxide film or a silicon nitride film, or a lamination film thereof.

Over the n⁺ type semiconductor region 12c, namely, over the top surface of the n⁺ type semiconductor region 12c, as with over the n⁺ type semiconductor region 12a, or over the n⁺ type semiconductor region 12b of the memory cell MC1, a metal silicide layer 13 is formed by a salicide technology, or the like. Incidentally, the metal silicide layer 13 may also be formed over the gate electrode GEH.

Then, the configuration of the low breakdown voltage MISFET QL formed in the peripheral circuit region 1C will be specifically described.

In the peripheral circuit region 1C, the semiconductor device has an active region AR3 and an element isolation region IR3. The element isolation region IR3 is for isolating elements. In the element isolation region IR3, there is formed an element isolation film 2. The active region AR3 is defined, namely, partitioned by the element isolation region IR3, and is electrically isolated from other active regions by the element isolation region IR3. In the active region AR3, there is formed a p type well PW3. Namely, the active region AR3 is a region including the p type well PW3 formed therein. The p type well PW3 has a p type conductivity type.

Incidentally, as described previously, in the cross sectional view of FIG. 1, for ease of understanding, the peripheral circuit region 1C is shown adjacent to the peripheral circuit region 1B. Accordingly, in the cross sectional view of FIG. 1, there is shown an example in which the element isolation region IR2 in the peripheral circuit region 1B is also the element isolation region IR3 in the peripheral circuit region 1C.

As shown in FIG. 1, in the p type well PW3 in the peripheral circuit region 1C, there is formed a low breakdown voltage MISFET QL. In the peripheral circuit region 1C, in actuality, there are formed a plurality of MISFETs QL. FIG. 1 shows a cross section perpendicular to the gate width direction of one MISFET QL of them.

As shown in FIG. 1, the low breakdown voltage MISFET QL has a semiconductor region formed of an $n^-$ type semiconductor region $11d$ and an $n^+$ type semiconductor region $12d$, a gate insulation film GIL formed over the p type well PW3, and a gate electrode GEL formed over the gate insulation film GIL. The $n^-$ type semiconductor region $11d$ and the $n^+$ type semiconductor region $12d$ are formed in the upper layer part of the p type well PW3 of the semiconductor substrate 1. The $n^-$ type semiconductor region $11d$ and the $n^+$ type semiconductor region $12d$ each have an n type conductivity which is the opposite conductivity type to the p type conductivity type.

The gate insulation film GIL functions as the gate insulation film of the MISFET QL. The gate insulation film GIL is formed of an insulation film $23c$. As the insulation film $23c$, there can be used an insulation film formed at the same layer as the insulation film $23b$ included in the gate insulation film GIH of the MISFET QH.

The gate electrode GEL is formed of a conductive film $24c$. As the conductive film $24c$, there can be used a conductive film formed at the same layer as the conductive film $24b$ included in the gate electrode GEH of the MISFET QH. Further, the film thickness TEL of the gate electrode GEL can be set equal to the film thickness TEH of the gate electrode GEH.

Incidentally, when a metal silicide layer 13 is formed over the gate electrode GEL, the film thickness TEL of the gate electrode GEL can be defined as the distance from the bottom surface of the gate electrode GEL to the top surface of the metal silicide layer 13 formed over the gate electrode GEL.

The semiconductor regions each formed of the $n^-$ type semiconductor region $11d$ and the $n^+$ type semiconductor region $12d$ are semiconductor regions for source and for drain, doped with an n type impurity, and each include a LDD structure as with the semiconductor regions MS and MD of the memory cell MC1. Namely, the $n^+$ type semiconductor region $12d$ is deeper in junction depth, and higher in impurity concentration than the $n^-$ type semiconductor region $11d$.

Over the sidewall of the gate electrode GEL, there is formed a sidewall spacer SW formed of an insulation film such as a silicon oxide film or a silicon nitride film, or a lamination film thereof.

Over the $n^+$ type semiconductor region $12d$, namely, over the top surface of the $n^+$ type semiconductor region $12d$, as with over the $n^+$ type semiconductor region $12a$, or over the $n^+$ type semiconductor region $12b$ of the memory cell MC1, a metal silicide layer 13 is formed by a salicide technology, or the like. Incidentally, the metal silicide layer 13 may also be formed over the gate electrode GEL.

Incidentally, although not shown, the low breakdown voltage MISFET QL may have a hollow region. The conductivity type of the hollow region is the opposite conductivity type to the $n^-$ type semiconductor region $11d$, and the same conductivity type as that of the p type well PW3. The hollow region is formed for suppressing the short channel characteristics (punch through). The hollow region is formed in such a manner as to include the $n^-$ type semiconductor region $11d$ therein. The p type impurity concentration in the hollow region is higher than the p type impurity concentration in the p type well PW3.

As described previously, the MISFET QH formed in the peripheral circuit region 1B is a high breakdown voltage MISFET. The MISFET QL formed in the peripheral circuit region 1C is a low breakdown voltage MISFET. The high breakdown voltage MISFET QH is an element for use in a circuit for performing input/output of a current between, for example, a semiconductor device and an external device thereof. On the other hand, the low breakdown voltage MISFET QL is an element which forms, for example, a logic circuit, and is required to operate at a high speed. For this reason, the gate length of the high breakdown voltage MISFET QH is longer than the gate length of the low breakdown voltage MISFET QL. Further, the driving voltage of the high breakdown voltage MISFET QH is higher than the driving voltage of the low breakdown voltage MISFET QL. The breakdown voltage of the high breakdown voltage MISFET QH is higher than the breakdown voltage of the low breakdown voltage MISFET QL.

Preferably, the film thickness TIH of the gate insulation film GIH is larger than the film thickness TIL of the gate insulation film GIL. As a result, the driving voltage of the high breakdown voltage MISFET QH can be set higher than the driving voltage of the low breakdown voltage MISFET QL.

Alternatively, preferably, the p type impurity concentration in the p type well PW2 is lower than the p type impurity concentration in the p type well PW3. As a result, the driving voltage of the high breakdown voltage MISFET QH can be set higher than the driving voltage of the low breakdown voltage MISFET QL.

Incidentally, the depth position of the bottom surface of the $n^-$ type semiconductor region $11c$ can be set deeper than the depth position of the bottom surface of the $n^-$ type semiconductor region $11d$. The depth position of the bottom surface of the $n^+$ type semiconductor region $12c$ can be set substantially equal to the depth position of the bottom surface of the $n^+$ type semiconductor region $12d$. In this case, in the high breakdown voltage MISFET QH, the depth position of the bottom surface of the $n^+$ type semiconductor region $12c$ is shallower than the depth position of the bottom surface of the $n^-$ type semiconductor region $11c$. On the other hand, in the low breakdown voltage MISFET QL, the depth position of the bottom surface of the $n^+$ type semiconductor region $12d$ is deeper than the depth position of the bottom surface of the $n^-$ type semiconductor region $11d$.

Then, the configuration over the memory cell MC1 formed in the memory cell region 1A, over the MISFET QH formed in the peripheral circuit region 1B, and over the MISFET QL formed in the peripheral circuit region 1C will be specifically described.

Over the semiconductor substrate 1, an insulation film 14 is formed in such a manner as to cover the cap insulation film CP2, the gate insulation film GIm, the memory gate electrode MG, the gate electrode GEH, the gate electrode GEL, and the sidewall spacers SW. The insulation film 14 is formed of, for example, a silicon nitride film.

Over the insulation film 14, there is formed an interlayer insulation film 15. The interlayer insulation film 15 is formed of a single film of a silicon oxide film, a lamination film of a silicon nitride film and a silicon oxide film, or the like. The top surface of the interlayer insulation film 15 is planarized.

In the interlayer insulation film 15, there are formed contact holes CNT. In each contact hole CNT, there is embedded a conductive plug PG as a conductor part.

The plug PG is formed of a thin barrier conductor film formed at the bottom, and over the sidewall, namely, over the side surface of the contact hole CNT, and a main conductor film formed over the barrier conductor film in such a manner as to fill the contact hole CNT. In FIG. 1, for simplification of the drawing, the barrier conductor film and the main conductor film forming the plug PG are integrally shown. Incidentally, the barrier conductor film forming the plug PG can be set to be, for example, a titanium (Ti) film, a titanium nitride (TiN) film, or a lamination film thereof. The main conductor film forming the plug PG can be set to be a tungsten (W) film.

The contact holes CNT and the plugs PG embedded therein are formed over the n$^+$ type semiconductor regions 12a, 12b, 12c, and 12d, over the control gate electrode CG, over the memory gate electrode MG, over the gate electrode GEH, over the gate electrode GEL, and the like. At the bottom of each contact hole CNT, there are exposed, for example, a part of the metal silicide layer 13 over the surface of each of the n$^+$ type semiconductor regions 12a, 12b, 12c, and 12d, a part of the metal silicide layer 13 over the surface of the control gate electrode CG, or a part of the metal silicide layer 13 over the surface of the memory gate electrode MG. Alternatively, at the bottom of each contact hole CNT, there is exposed, for example, a part of the metal silicide layer 13 over the surface of the gate electrode GEH or the gate electrode GEL. Then, the plug PG is coupled to each exposed part. Incidentally, FIG. 1 shows a cross section in which a part of the metal silicide layer 13 over the surface of each of the n$^+$ type semiconductor regions 12b, 12c, and 12d is exposed at the bottom of each contact hole CNT, and is electrically coupled with the plug PG filling the contact hole CNT.

Over the interlayer insulation film 15 filled with the plug PG, as a damascene wire as an embedded wire including, for example, copper (Cu) as a main conductive material, there is formed a first layer wire. Over the first layer wire, overlying layer wires are also formed as damascene wires, but herein, are not shown and are not described. Further, the first layer wire and wires at layers thereabove are not limited to damascene wires, can also be formed by patterning a wiring conductive film, and can be set to be, for example, a tungsten (W) wire or an aluminum (AL) wire.

Then, a description will be given to the operation of the memory cell MC1 formed in the memory cell region 1A. FIG. 3 is a table showing one example of the conditions for application of a voltage to each site of the memory cell at the times of "write", "erase", and "read".

In the table of FIG. 3, there are described the voltages Vmg to be applied to the memory gate electrode MG, the voltages VS to be applied to the semiconductor region MS, the voltages Vcg to be applied to the control gate electrode CG, and the voltages Vd to be applied to the semiconductor region MD at respective times of "write", "erase", and "read". Further, in the table of FIG. 3, there are described the voltages Vb to be applied to the p type well PW1 at respective times of "write", "erase", and "read". Incidentally, the example shown in the table of FIG. 3 is one preferable example of the conditions for application of a voltage, is not exclusive, and if required, can be variously changed.

In the present First Embodiment, the injection of electrons into the silicon nitride film 8b which is the charge accumulation part in the insulation film 8 of the memory transistor is defined as "write". The injection of holes, namely, positive holes is defined as "erase". Further, the power supply voltage Vdd is set at 1.5 V.

For the writing method, there can be used hot electron writing referred to as a so-called source side injection: SSI method. For example, such a voltage as shown in the row of "write" of FIG. 3 is applied to each site of the memory cell MC1 for performing write. Thus, electrons are injected into the silicon nitride film 8b in the gate insulation film GIm of the memory cell MC1. Hot electrons are generated mainly in the channel region at a portion thereof situated under the memory gate electrode MG via the gate insulation film GIm, and are injected into the silicon nitride film 8b which is the charge accumulation part in the gate insulation film GIm. The injected hot electrons are trapped by the trap level in the silicon nitride film 8b in the gate insulation film GIm. As a result, the threshold voltage (Vth) of the memory transistor increases.

For the erasing method, there can be used a hot hole injection erasing method by a band-to-band tunneling: BTBT phenomenon. In other words, by injecting the holes, namely, positive holes generated by the BTBT phenomenon into the charge accumulation part, namely, the silicon nitride film 8b in the gate insulation film GIm, erase is performed. For example, such a voltage as shown in the row of "erase" of FIG. 3 is applied to each site of the memory cell MC1 for performing erase. Thus, holes are generated by a BTBT phenomenon, and accelerated under an electric field. Accordingly, the holes are injected into the silicon nitride film 8b in the gate insulation film GIm of the memory cell MC1. As a result, the threshold voltage of the memory transistor is reduced.

For the erasing method, there can also be used an erasing method by hole injection using a direct tunneling phenomenon. In other words, by a direct tunneling phenomenon, holes are injected into the charge accumulation part, namely, the silicon nitride film 8b in the gate insulation film GIm, thereby to perform erase. Although not shown in the row of "erase" of FIG. 3, the voltage Vmg to be applied to the memory gate electrode MG is set at, for example, a positive voltage of 12 V, and the voltage Vb to be applied to the p type well PW1 is set at, for example, 0 V. As a result, holes are injected from the memory gate electrode MG side via the silicon oxide film 8c into the charge accumulation part, namely, the silicon nitride film 8b by a direct tunneling phenomenon, and cancel electrons in the silicon nitride film 8b. As a result, erase is performed. Alternatively, the holes injected into the silicon nitride film 8b are trapped by the trap level in the silicon nitride film 8b. As a result, erase is performed. This reduces the threshold voltage of the memory transistor, resulting in an erase state. When such an erasing method is used, the current consumption can be more reduced as compared with the case where the erasing method by a BTBT phenomenon is used.

For read, for example, such a voltage as shown in the row of "read" of FIG. 3 is applied to each site of the memory cell MC1 for performing read. The voltage Vmg to be applied to the memory gate electrode MG for read is set at a value between the threshold voltage of the memory transistor in the write state and the threshold voltage of the memory transistor in the erase state. As a result, it is possible to discriminate between the write state and the erase state.

<Method for Manufacturing a Semiconductor Device>

Then, a description will be given to a method for manufacturing the semiconductor device of the present First Embodiment.

Figure 4:
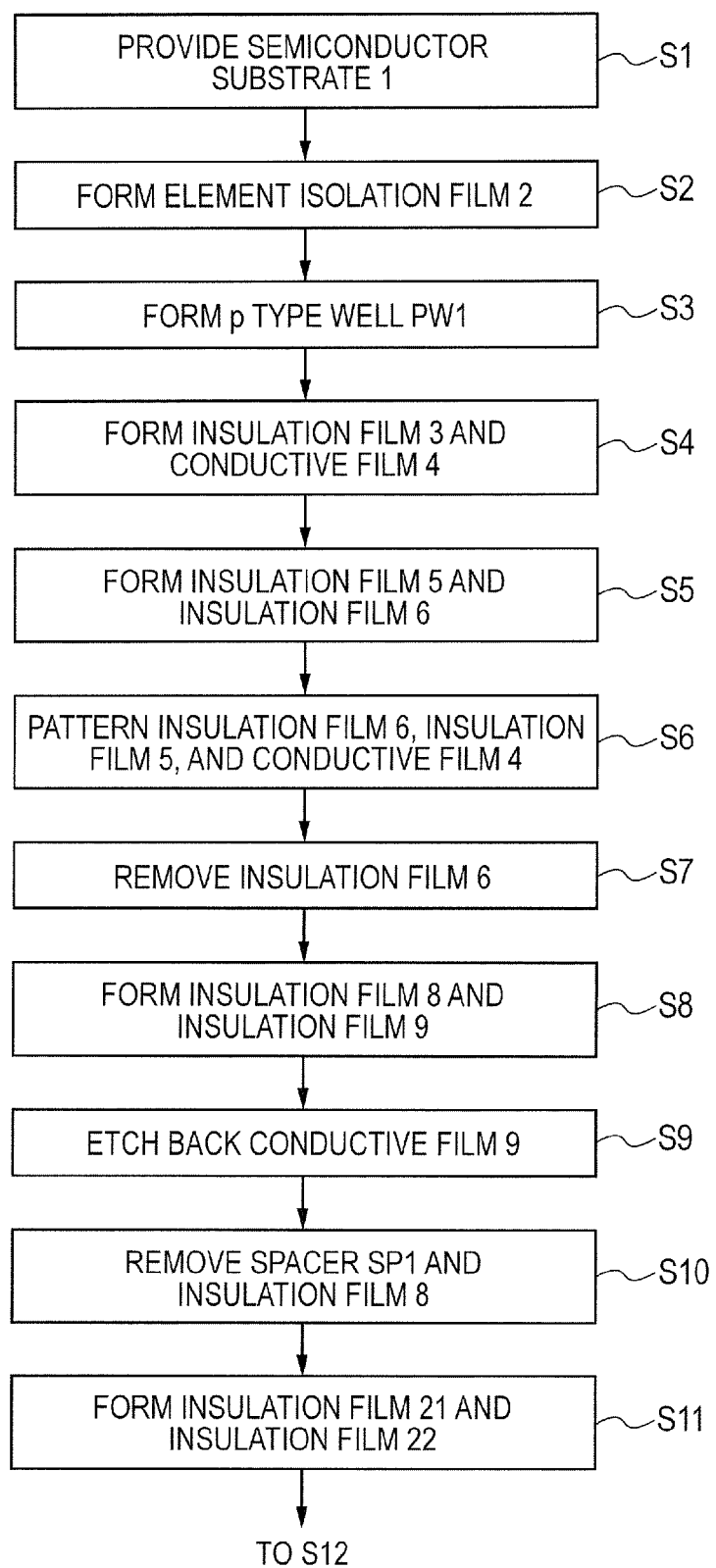
FIG. 4 is a process flowchart showing some of manufacturing steps of the semiconductor device of First Embodiment.
Figure 5:
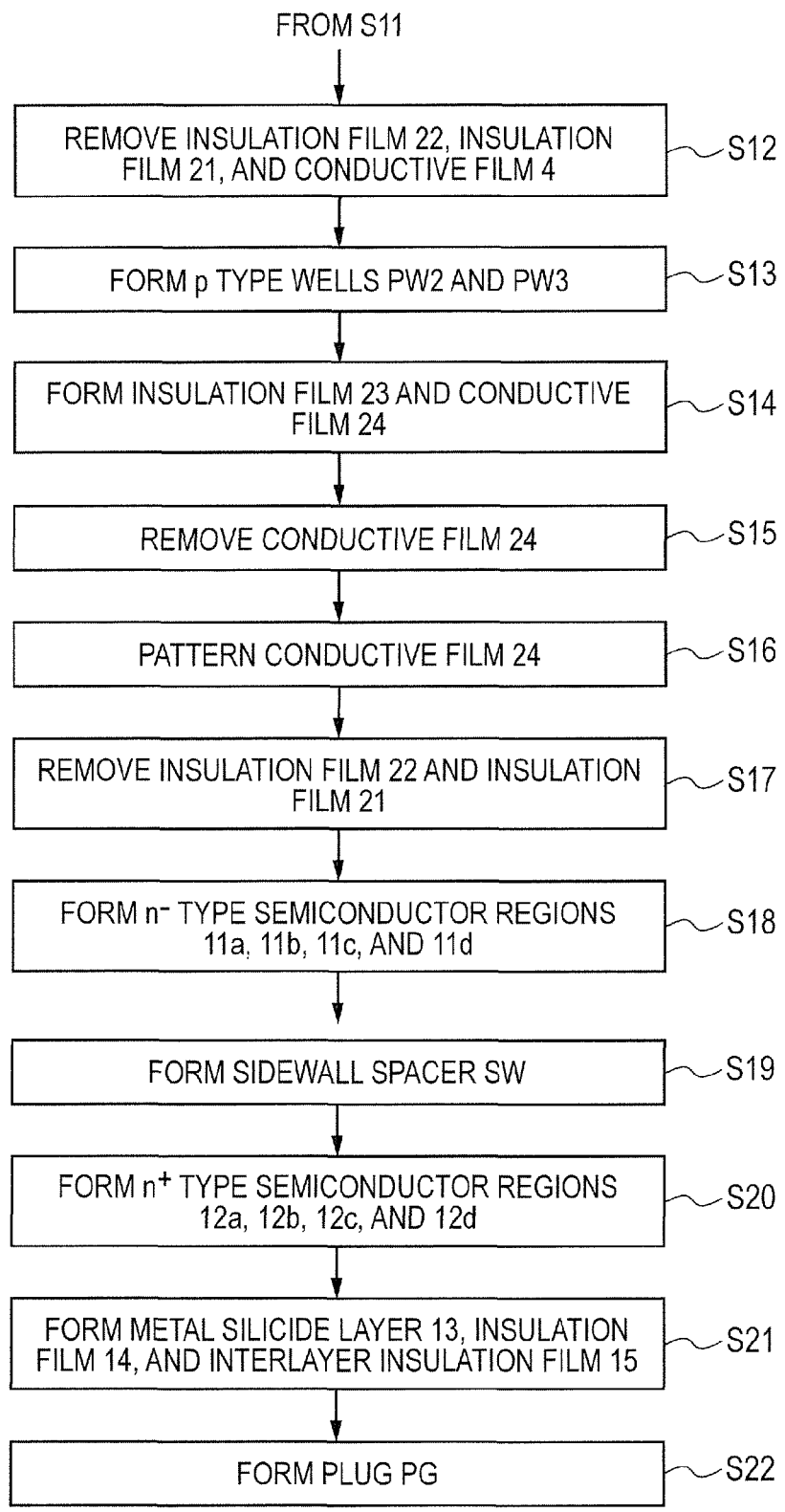
FIG. 5 is a process flowchart showing others of manufacturing steps of the semiconductor device of First Embodiment.

FIGS. 4 and 5 are each a process flowchart showing some of the manufacturing steps of the semiconductor device of First Embodiment. FIGS. 6 to 20 are each an essential part cross sectional view of the semiconductor device of First Embodiment during a manufacturing step. Each cross sectional view of FIGS. 6 to 20 shows an essential part cross sectional view of the memory cell region 1A, and the peripheral circuit regions 1B and 1C, and shows the manner in which a memory cell MC1 is formed in the memory cell region 1A, a MISFET QH is formed in the peripheral circuit region 1B, and a MISFET QL is formed in the peripheral circuit region 1C.

As described previously, the memory cell region 1A and the peripheral circuit region 1B are not required to be adjacent to each other. The memory cell region 1A and the peripheral circuit region 1C are not required to be adjacent to each other. The peripheral circuit region 1B and the peripheral circuit region 1C are not required to be adjacent to each other. However, for ease of understanding, in each cross sectional view of FIGS. 6 to 20, the peripheral circuit region 1B is shown adjacent to the memory cell region 1A, and the peripheral circuit region 1C is shown adjacent to the peripheral circuit region 1B.

Further, in the present First Embodiment, a description will be given to the case where n channel type control transistor CT and memory transistor MT are formed in the memory cell region 1A. However, the conductivity type can also be reversed to form p channel type control transistor CT and memory transistor MT in the memory cell region 1A.

Similarly, in the present First Embodiment, a description will be given to the case where an n channel type MISFET QH is formed in the peripheral circuit region 1B. However, the conductivity type can also be reversed to form a p channel type MISFET QH in the peripheral circuit region 1B. Further, a CMISFET (Complementary MISFET) and the like can also be formed in the peripheral circuit region 1B. Further, similarly, in the present First Embodiment, a description will be given to the case where an n channel type MISFET QL is formed in the peripheral circuit region 1C. However, the conductivity type can also be reversed to form a p channel type MISFET QL in the peripheral circuit region 1C. Further, a CMISFET and the like can also be formed in the peripheral circuit region 1C.

Figure 6:
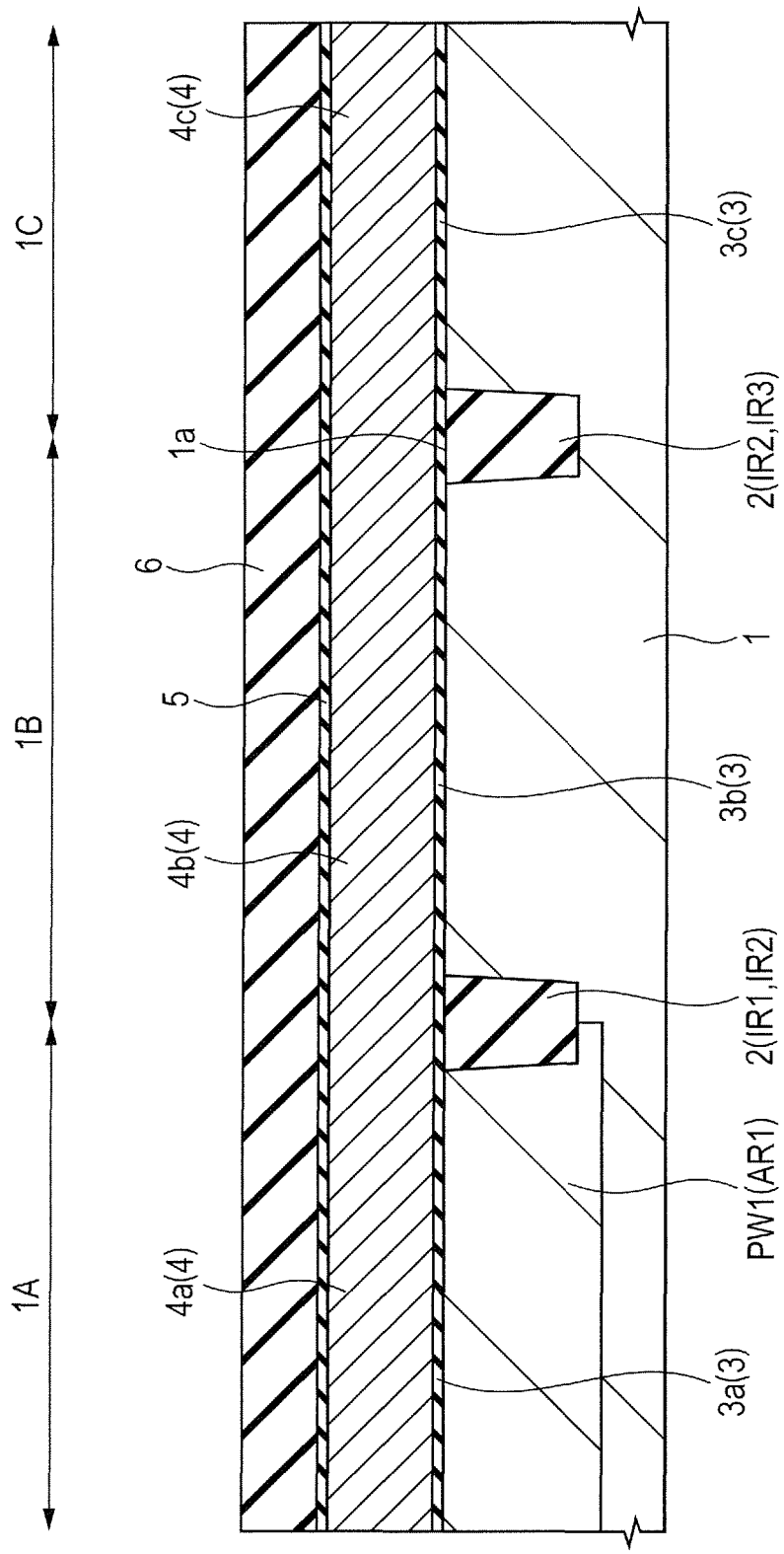
FIG. 6 is an essential part cross sectional view of the semiconductor device of First Embodiment during a manufacturing step.

As shown in FIG. 6, first, there is provided, namely, prepared a semiconductor substrate 1 as a semiconductor wafer formed of, for example, a p type single crystal silicon having a specific resistance of about 1 to 10 Ωcm (Step S1 of FIG. 4).

Then, as shown in FIG. 6, there is formed an element isolation film 2 (Step S2 of FIG. 4). The element isolation film 2 serves as an element isolation region IR1 for defining an active region AR1 in the memory cell region 1A at the main surface 1a of the semiconductor substrate 1. Further, the element isolation film 2 serves as an element isolation region IR2 for defining an active region AR2 in the peripheral circuit region 1B at the main surface 1a of the semiconductor substrate 1, and serves as an element isolation region IR3 for defining an active region AR3 in the peripheral circuit region 1C at the main surface 1a of the semiconductor substrate 1.

The element isolation film 2 is formed of an insulator such as silicon oxide, and can be formed by, for example, a STI (Shallow Trench Isolation) method or a LOCOS (Local Oxidization of Silicon) method. For example, in the element isolation regions IR1, IR2, and IR3, there are formed trenches for element isolation, respectively. Then, an insulation film formed of, for example, silicon oxide is embedded in each of the trenches for element isolation. As a result, the element isolation film 2 can be formed.

Then, as shown in FIG. 6, in the memory cell region 1A, a p type well PW1 is formed in the active region AR1 (Step S3 of FIG. 4). The p type well PW1 can be formed by doping a p type impurity such as boron (B) into the semiconductor substrate 1 by an ion implantation method or the like. The p type well PW1 is formed to a prescribed depth from the main surface 1a of the semiconductor substrate 1.

Then, by wet etching using, for example, hydrofluoric acid (HF) aqueous solution, or the like, the natural oxide film at the surface of the semiconductor substrate 1 is removed, and the surface of the semiconductor substrate 1 is cleaned. Thus, the surface of the semiconductor substrate 1 is purified. As a result, the surface of the semiconductor substrate 1 is exposed, and the surface of the p type well PW1 is exposed in the memory cell region 1A.

Then, as shown in FIG. 6, entirely over the main surface 1a of the semiconductor substrate 1, there are formed an insulation film 3 and a conductive film 4 (Step S4 of FIG. 4).

In Step S4, first, as shown in FIG. 6, in the memory cell region 1A, and the peripheral circuit regions 1B and 1C, the insulation film 3 is formed over the main surface 1a of the semiconductor substrate 1. Of the insulation film 3, a portion formed in the memory cell region 1A is referred to as an insulation film 3a; a portion formed in the peripheral circuit region 1B is referred to as an insulation film 3b; and a portion formed in the peripheral circuit region 1C is referred to as an insulation film 3c. The insulation film 3b is formed at the same layer as the insulation film 3a, and the insulation film 3c is formed at the same layer as the insulation film 3a. The insulation film 3a is an insulation film for the gate insulation film GIt (see FIG. 7 described later) of the memory cell MC1. Further, the insulation film 3a is formed over the p type well PW1.

In the example shown in FIG. 6, the insulation film 3b is formed integrally with the insulation film 3a, and the insulation film 3c is formed integrally with the insulation film 3a. However, the insulation film 3b may be formed apart from the insulation film 3a, and the insulation film 3c may be formed apart from the insulation film 3a.

As described previously as the insulation film 3a, as the insulation film 3, there can be used a silicon oxide film, a silicon nitride film, or a silicon oxynitride film, or a High-k film, namely, a high dielectric constant film. Examples of the material usable as the insulation film 3 are as described previously as the insulation film 3a. Further, the insulation film 3c can be formed using a thermal oxidation method, a sputtering method, an Atomic Layer Deposition: ALD method, a Chemical Vapor Deposition: CVD method, or the like.

In Step S4, then, as shown in FIG. 6, in the memory cell region 1A, and the peripheral circuit regions 1B and 1C, over the insulation film 3, there is formed a conductive film 4. Of the conductive film 4, a portion formed in the memory cell region 1A is referred to as a conductive film 4a; a portion formed in the peripheral circuit region 1B is referred to as a conductive film 4b; and a portion formed in the peripheral circuit region 1C is referred to as a conductive film 4c. The conductive film 4b is formed at the same layer as the conductive film 4a, and the conductive film 4c is formed at the same layer as the conductive film 4a. The conductive film 4a is a conductive film for the control gate electrode CG (see FIG. 7 described later) of the memory cell MC1.

In the example shown in FIG. 6, the conductive film 4b is formed integrally with the conductive film 4a, and the conductive film 4c is formed integrally with the conductive film 4a. However, the conductive film 4b may be formed apart from the conductive film 4a, and the conductive film 4c may be formed apart from the conductive film 4a.

Preferably, the conductive film 4 is formed of a polycrystal silicon film, namely, a polysilicon film. Such a conductive film 4 can be formed using a CVD method, or the like. The film thickness of the conductive film 4 can be set at a thickness enough to cover the insulation film 3. Alternatively, the following is also possible: for deposition, the conductive film 4 is deposited as an amorphous silicon film; then, by a subsequent heat treatment, the amorphous silicon film is turned into a polycrystal silicon film.

As the conductive film 4, it is preferable to use a film reduced in resistivity by being doped with an n type impurity such as phosphorus (P) or arsenic (As), or a p type impurity such as boron (B). The impurity can be doped during the deposition, or after the deposition of the conductive film 4. When the impurity is doped during the deposition of the conductive film 4, by allowing the gas for deposition of the conductive film 4 to contain a doping gas, it is possible to deposit the conductive film 4 doped with the impurity. On the other hand, when the impurity is doped, after the deposition of a silicon film after depositing a silicon film without doping an impurity intentionally, the silicon film is doped with an impurity by an ion implantation method or the like. As a result, it is possible to form a conductive film 4 doped with an impurity.

Then, as shown in FIG. 6, entirely over the main surface 1a of the semiconductor substrate 1, namely, over the conductive film 4, there are formed an insulation film 5 and an insulation film 6 (Step S5 of FIG. 4).

In Step S5, first, as shown in FIG. 6, in the memory cell region 1A, and the peripheral circuit regions 1B and 1C, over the conductive film 4, there is formed an insulation film 5. The insulation film 5 is an insulation film for a cap insulation film CP1 (see FIG. 7 described later).

By thermally oxidizing the surface of the conductive film 4 formed of, for example, a silicon film, it is possible to form an insulation film 5 formed of a silicon oxide film having a thickness of, for example, about 6 nm. Alternatively, the insulation film 5 formed of a silicon oxide film can also be formed using a CVD method in place of thermally oxidizing the surface of the conductive film 4 formed of a silicon film.

Further, for the materials for the insulation film 5, insulation films formed of other materials can also be used in place of a silicon oxide film. Alternatively, without forming the insulation film 5, the insulation film 6 can also be formed directly on the conductive film 4.

In Step S5, then, as shown in FIG. 6, in the memory cell region 1A, and the peripheral circuit regions 1B and 1C, over the insulation film 5, there is formed the insulation film 6. The insulation film 6 formed of, for example, a silicon nitride film can be formed using, for example, a CVD method.

Figure 7:
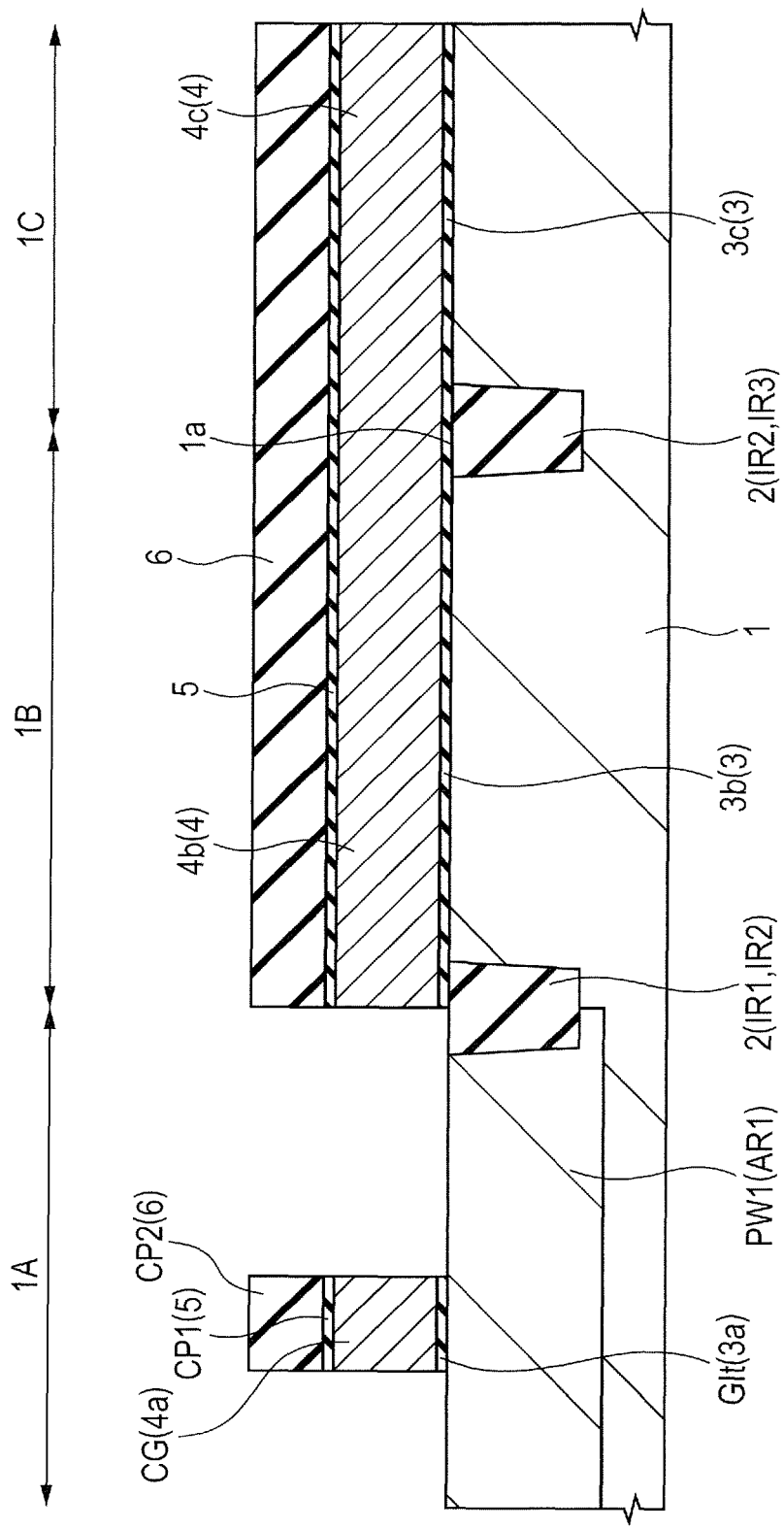
FIG. 7 is an essential part cross sectional view of the semiconductor device of First Embodiment during a manufacturing step.

Then, as shown in FIG. 7, the insulation film 6, the insulation film 5, and the conductive film 4 are patterned (Step S6 of FIG. 4). In the Step S6, using, for example, photolithography and etching, the insulation film 6, the insulation film 5, and the conductive film 4 are patterned.

First, over the insulation film 6, there is formed a resist film. Then, of the memory cell region 1A, in a region other than the region in which the control gate electrode CG is to be formed, there is formed an opening penetrating through the resist film, and reaching the insulation film 6. This results in the formation of a resist pattern formed of a resist film including an opening formed therein. At this step, the insulation film 6 at a portion thereof arranged in a region in which the control gate electrode CG is to be formed in the memory cell region 1A, and the insulation film 6 at a portion thereof arranged in the peripheral circuit regions 1B and 1C are covered with the resist film.

Then, using the resist pattern as an etching mask, the insulation film 6, the insulation film 5, and the conductive film 4 are etched and patterned by, for example, dry etching. As a result, in the memory cell region 1A, there is formed a control gate electrode CG formed of the conductive film 4a, and there is formed a gate insulation film GIt formed of the insulation film 3a between the control gate electrode CG and the p type well PW1 of the semiconductor substrate 1. Namely, the control gate electrode CG is formed over the p type well PW1 of the semiconductor substrate 1 via the gate insulation film GIt in the memory cell region 1A.

Further, there is formed a cap insulation film CP1 formed of the insulation film 5 at a portion thereof formed over the control gate electrode CG. Thus, there is formed a cap insulation film CP2 formed of the insulation film 6 at a portion thereof formed over the control gate electrode CG via the cap insulation film CP1. On the other hand, in the peripheral circuit regions 1B and 1C, the insulation film 6, the insulation film 5, and the conductive film 4 are left. In the peripheral circuit region 1B, the conductive film 4b is left. In the peripheral circuit region 1C, the conductive film 4c is left. Then, the resist pattern, namely, the resist film is removed.

Incidentally, in the memory cell region 1A, the insulation film 3a at a portion thereof not covered with the control gate electrode CG can be removed by being subjected to dry etching of Step S6, or by being subjected to wet etching after dry etching of Step S6. Then, in a portion of the memory cell region 1A in which the control gate electrode CG is not formed, there is exposed the p type well PW1 of the semiconductor substrate 1.

Incidentally, although not shown, in Step S6, after forming the control gate electrode CG and the cap insulation film CP1, using the cap insulation film CP1 and the control gate electrode CG as a mask, the p type well PW1 may be doped with an n type impurity by an ion implantation method.

Figure 8:
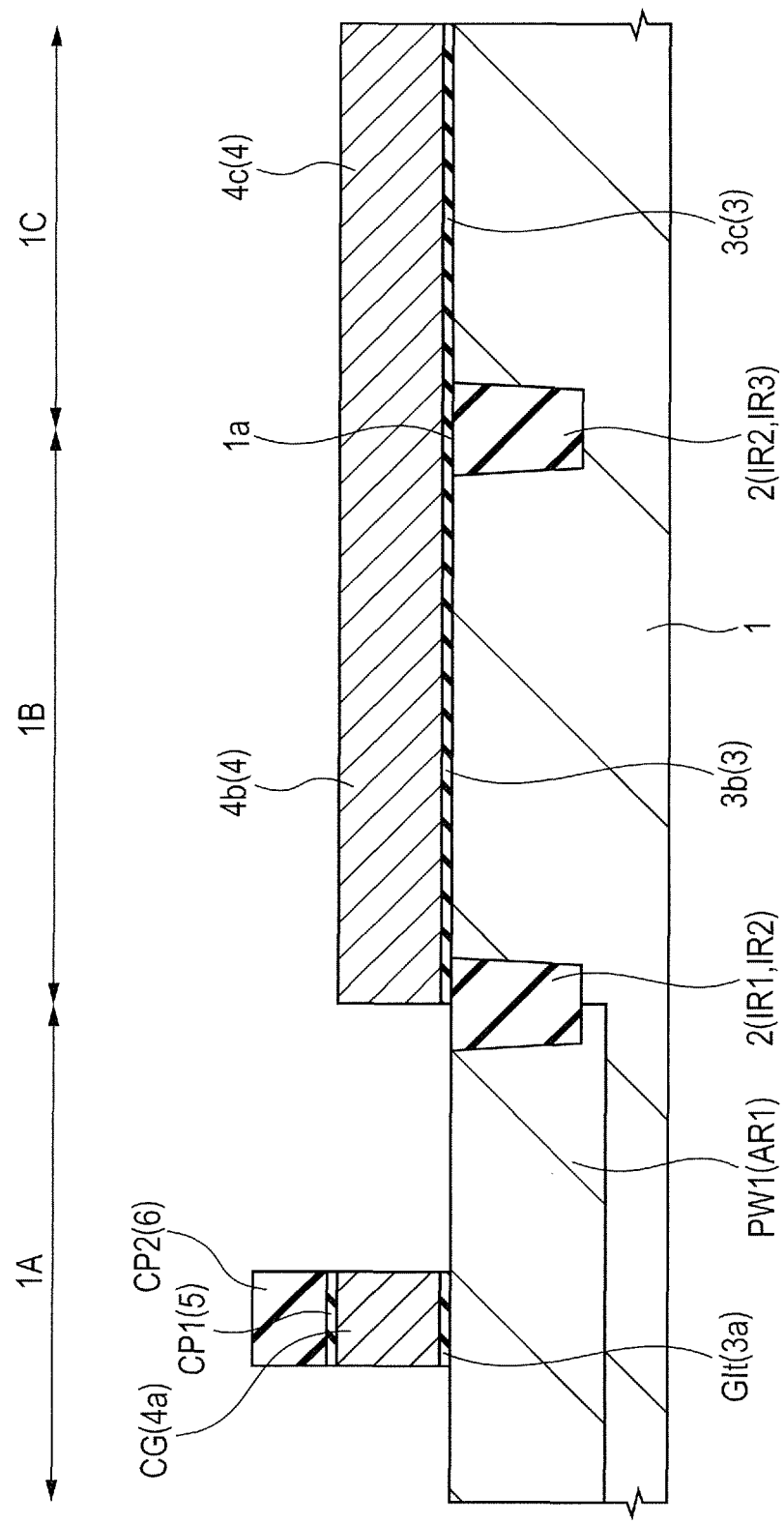
FIG. 8 is an essential part cross sectional view of the semiconductor device of First Embodiment during a manufacturing step.

Then, as shown in FIG. 8, in the peripheral circuit regions 1B and 1C, the insulation film 6 is removed (Step S7 of FIG. 4).

In the Step S7, first, in the memory cell region 1A, a resist film (not shown) is formed in such a manner as to cover the cap insulation film CP2 and the control gate electrode CG. Whereas, a resist film (not shown) is formed in such a manner as to cover the insulation film 6 at a portion thereof left in the peripheral circuit regions 1B and 1C, and the conductive film 4 at a portion thereof left in the peripheral circuit regions 1B and 1C, namely, the conductive films 4b and 4c, respectively.

Then, the resist film is subjected to pattern exposure, followed by development. As a result, the resist film is patterned. Thus, the resist film is removed in the peripheral circuit regions 1B and 1C, and the resist film is left in the memory cell region 1A. This results in the formation of a resist pattern formed of the resist film at a portion thereof left in the memory cell region 1A.

Then, using the resist pattern as an etching mask, the insulation film 6 is etched and removed by, for example, dry etching. As a result, as shown in FIG. 8, the insulation film 6 at a portion thereof left in the peripheral circuit regions 1B and 1C can be fully removed. Then, the resist film at a portion thereof left in the memory cell region 1A, namely, the resist pattern is removed.

Incidentally, as shown in FIG. 8, the film thickness of the insulation film 5 is smaller than the film thickness of the insulation film 6. For this reason, when the insulation film 6 at a portion thereof left in the peripheral circuit regions 1B and 1C is etched and removed, the insulation film 5 at a portion thereof left in the peripheral circuit regions 1B and 1C is also removed.

Figure 9:
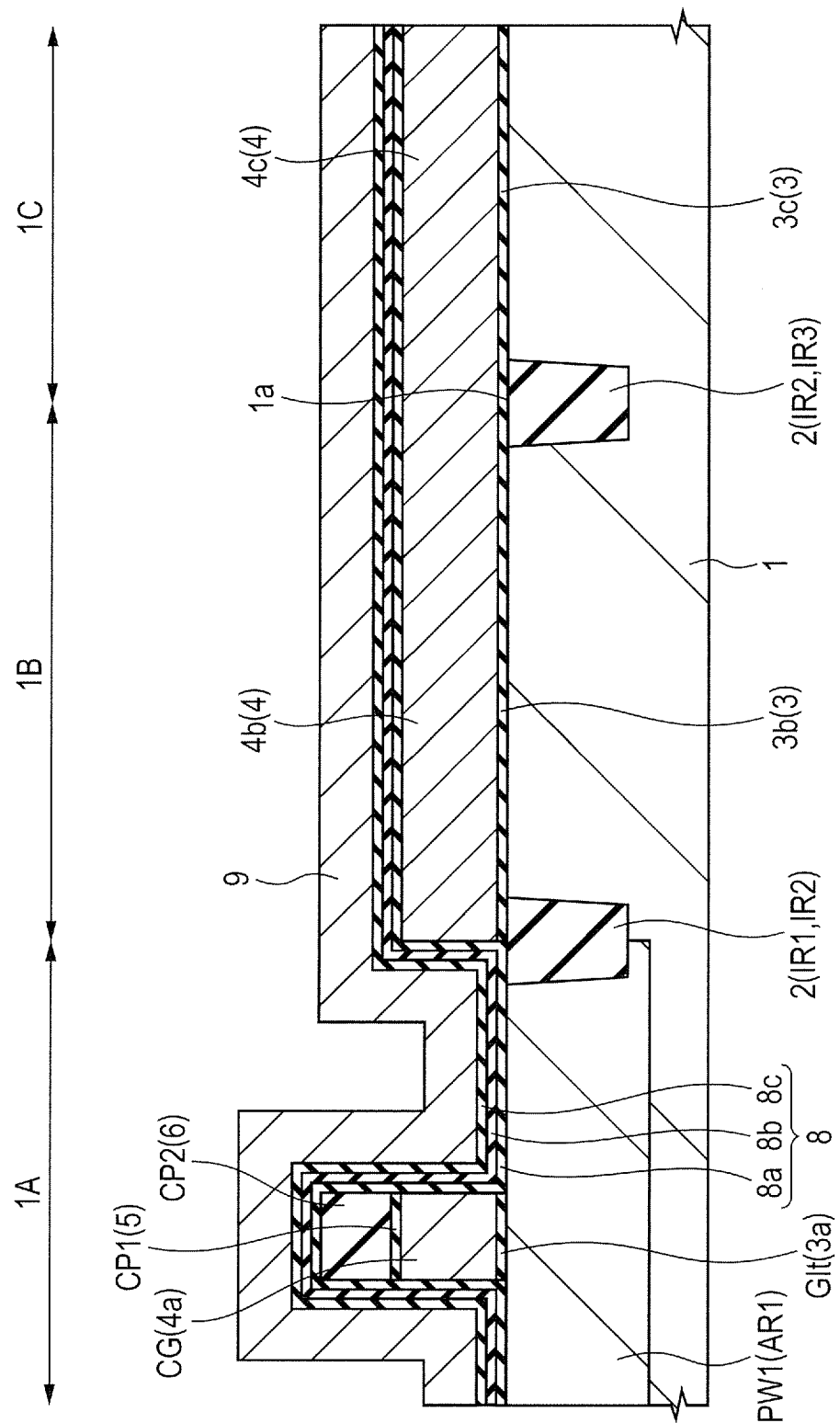
FIG. 9 is an essential part cross sectional view of the semiconductor device of First Embodiment during a manufacturing step.

Then, as shown in FIG. 9, there are formed an insulation film 8 and a conductive film 9 (Step S8 of FIG. 4).

In Step S8, first, as shown in FIG. 9, in the memory cell region 1A, and the peripheral circuit regions 1B and 1C, at the main surface 1a of the semiconductor substrate 1, there is formed an insulation film 8 for the gate insulation film GIm of a memory transistor MT (see FIG. 11 described later). At this step, in the memory cell region 1A, the insulation film 8 is formed at the exposed portions of the main surface 1a of the semiconductor substrate 1, the side surface of the control gate electrode CG, and the top surface and the side surface of the cap insulation film CP2. Whereas, the insulation film 8 is formed at the top surface and the side surface of the conductive film 4 at a portion thereof left in the peripheral circuit regions 1B and 1C. Namely, the insulation film 8 is formed in such a manner as to cover the main surface 1a of the semiconductor substrate 1, the side surface of the control gate electrode CG, the surface of the cap insulation film CP2, and the surface of the conductive film 4 at a portion thereof left in the peripheral circuit regions 1B and 1C.

The insulation film 8 is, as described previously, an insulation film having a charge accumulation part in the inside thereof, and is formed of a lamination film of a silicon oxide film 8a, a silicon nitride film 8b, and a silicon oxide film 8c stacked sequentially from the bottom as insulation films.

Of the insulation film 8, the silicon oxide film 8a can be formed at a temperature of, for example, about 900° C. by a thermal oxidation method, an ISSG oxidation method, or the like. Then, a nitriding treatment may be carried out at a temperature as high as, for example, about 1025° C. Whereas, of the insulation film 8, the silicon nitride film 8b can be formed by, for example, a CVD method. Further, of the insulation film 8, the silicon oxide film 8c can be formed by, for example, a CVD method.

First, at the exposed portions of the main surface 1a of the semiconductor substrate 1, the side surface of the control gate electrode CG, the top surface and the side surface of the cap insulation film CP2, and the top surface and the side surface of the conductive film 4 at a portion thereof left in the peripheral circuit regions 1B and 1C, the silicon oxide film 8a is formed by, for example, a thermal oxidation method or an ISSG oxidation method. At this step, there are oxidized the exposed portions of the main surface 1a of the semiconductor substrate 1, the side surface of the control gate electrode CG, the top surface and the side surface of the cap insulation film CP2, and the top surface and the side surface of the conductive film 4 at a portion thereof left in the peripheral circuit regions 1B and 1C. The thickness of the silicon oxide film 8a can be set at, for example, about 4 nm.

As another form, the silicon oxide film 8a can also be formed by an ALD method. At this step, silicon oxide is grown at the exposed portions of the main surface 1a of the semiconductor substrate 1, the side surface of the control gate electrode CG, the top surface and the side surface of the cap insulation film CP2, and the top surface and the side surface of the conductive film 4 at a portion thereof left in the peripheral circuit regions 1B and 1C. Therefore, also in this case, the exposed portions of the main surface 1a of the semiconductor substrate 1, the side surface of the control gate electrode CG, the top surface and the side surface of the cap insulation film CP2, and the top surface and the side surface of the conductive film 4 at a portion thereof left in the peripheral circuit regions 1B and 1C are covered with an oxide film.

Then, over the silicon oxide film 8a, the silicon nitride film 8b is formed by, for example, a CVD method. Further, over the silicon nitride film 8b, the silicon oxide film 8c is formed by, for example, a CVD method or a thermal oxidation method, or both thereof. As a result, it is possible to form the insulation film 8 formed of a lamination film of the silicon oxide film 8a, the silicon nitride film 8b, and the silicon oxide film 8c.

The insulation film 8 formed in the memory cell region 1A functions as the gate insulation film of the memory gate electrode MG (see FIG. 10 described later), and has an electrical charge holding function. The insulation film 8 has a structure in which the silicon nitride film 8b as a charge accumulation part is interposed between the silicon oxide film 8a and the silicon oxide film 8c as charge block layers. Then, each potential barrier height of the charge block layers formed of silicon oxide films 8a and 8c is higher than the potential barrier height of the charge accumulation part formed of the silicon nitride film 8b.

Incidentally, in the present First Embodiment, the silicon nitride film 8b is used as an insulation film having a trap level. Use of the silicon nitride film 8b is preferable in terms of reliability. However, the insulation film having a trap level is not limited to a silicon nitride film. There can be used a high dielectric constant film having a higher dielectric constant than that of a silicon nitride film such as an aluminum oxide (alumina) film, a hafnium oxide film, or a tantalum oxide film.

In the present First Embodiment, after performing the step of forming the insulation film 8 of Step S8, the conductive film 4 at a portion thereof left in the peripheral circuit regions 1B and 1C is removed. In the peripheral circuit region 1B, there is formed a p type well PW2 (see FIG. 13 described later). In the peripheral circuit region 1C, there is formed a p type well PW3 (see FIG. 13 described later). In the step of forming the insulation film 8, as described previously, a high temperature treatment at, for example, about 1025° C. is performed. Therefore, in the present First Embodiment in which after forming the insulation film 8, the p type wells PW2 and PW3 are formed, the n type impurity doped into the p type well PW2 or PW3 can be prevented from being diffused at high temperatures when the insulation film 8 is formed. Then, it is possible to prevent a change in impurity concentration distribution in the p type well PW2, or the impurity concentration distribution in the p type well PW3.

In Step S8, then, as shown in FIG. 9, in the memory cell region 1A, and the peripheral circuit regions 1B and 1C, over the insulation film 8, there is formed a conductive film 9.

Preferably, the conductive film 9 is formed of, for example, a polycrystal silicon film, namely, a polysilicon film. Such a conductive film 9 can be formed using a CVD method, or the like. Alternatively, the following is also possible: for deposition, the conductive film 9 is deposited as an amorphous silicon film; then, by a subsequent heat treatment, the amorphous silicon film is turned into a polycrystal silicon film.

As the conductive film 9, it is preferable to use a film reduced in resistivity by being doped with an n type impurity such as phosphorus (P) or arsenic (As), or a p type impurity such as boron (B). The impurity can be doped during the deposition, or after the deposition of the conductive film 9. Although the conductive film 9 can be doped with an impurity by ion implantation after the deposition of the conductive film 9, the conductive film 9 can also be doped with an impurity during the deposition of the conductive film 9. When the impurity is doped during the deposition of the conductive film 9, by allowing the gas for deposition of the conductive film 9 to contain a doping gas, it is possible to deposit the conductive film 9 doped with the impurity.

Figure 10:
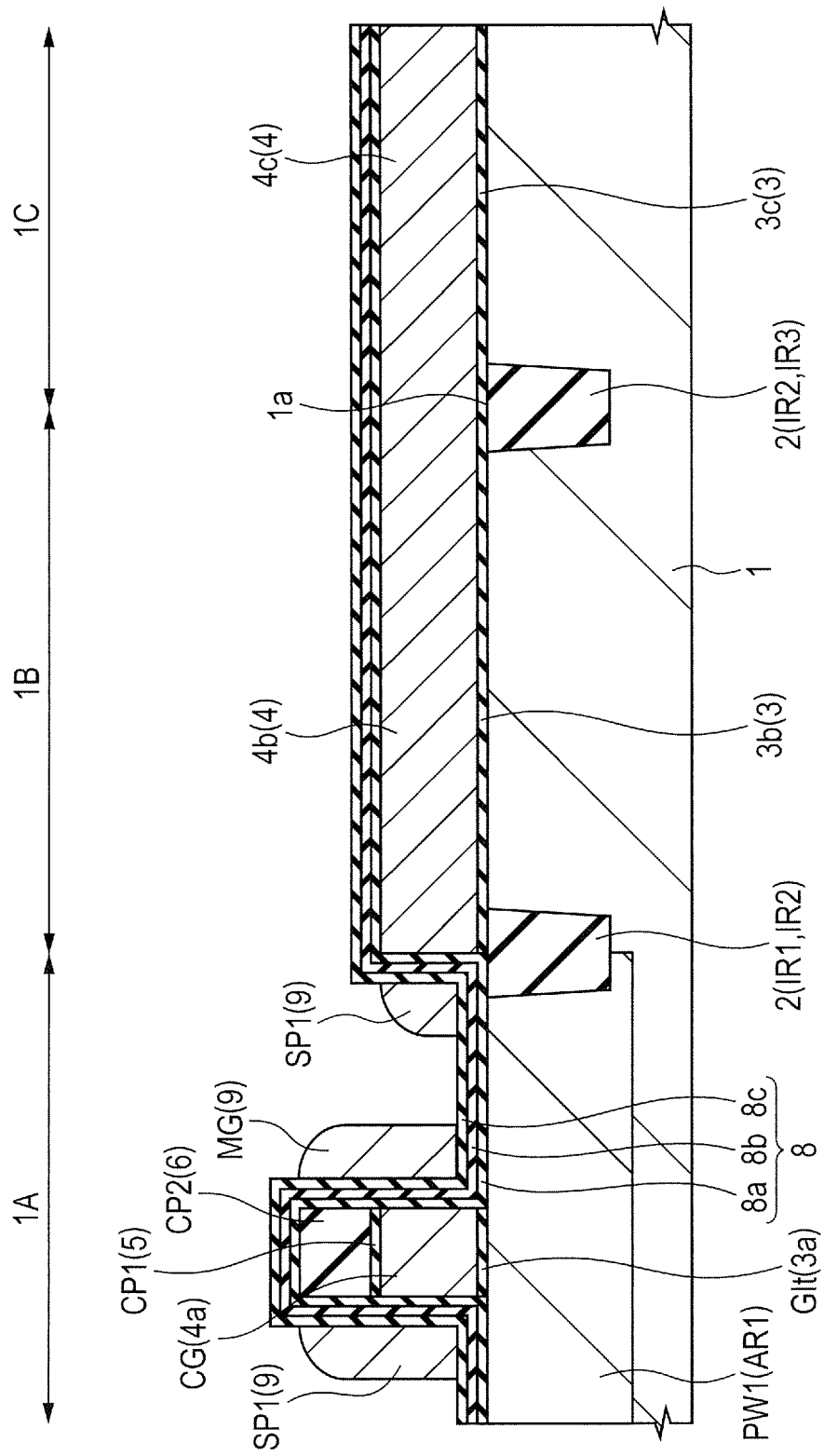
FIG. 10 is an essential part cross sectional view of the semiconductor device of First Embodiment during a manufacturing step.

Then, as shown in FIG. 10, by an anisotropical etching technology, the conductive film 9 is etched back, thereby to form a memory gate electrode MG (Step S9 of FIG. 4).

In the Step S9, the conductive film 9 is etched back by the film thickness of the conductive film 9. As a result, the conductive film 9 is left in a sidewall spacer shape via the insulation film 8 over the sidewalls, namely, over the side surfaces on the opposite sides of the control gate electrode CG, and the conductive film 9 in other regions is removed.

As a result, as shown in FIG. 10, in the memory cell region 1A, there is formed a memory gate electrode MG formed of the conductive film 9 left in a sidewall spacer shape via the insulation film 8 over the sidewall of the control gate electrode CG on a first side, namely, on the side on which the memory gate electrode MG adjacent to the control gate electrode CG is arranged, of the sidewalls on the opposite sides of the control gate electrode CG. Whereas, there is formed a spacer SP1 formed of the conductive film 9 left in a sidewall spacer shape via the insulation film 8 over the sidewall of the control gate electrode CG opposite to the first side, namely, opposite to the side on which the memory gate electrode MG adjacent to the control gate electrode CG is arranged, of the sidewalls on the opposite sides of the control gate electrode CG.

The memory gate electrode MG is formed over the insulation film 8 in such a manner as to be adjacent to the control gate electrode CG via the insulation film 8. The memory gate electrode MG and the spacer SP1 are formed over the sidewalls on the mutually opposite sides of the control gate electrode CG, and have a substantially symmetric structure across the control gate electrode CG.

Over the control gate electrode CG, a cap insulation film CP2 is formed via the cap insulation film CP1. Therefore, the memory gate electrode MG is formed of the conductive film 9 left in a sidewall spacer shape over the sidewall of the cap insulation film CP2 on the first side via the insulation film 8. Whereas, the spacer SP1 is formed of the conductive film 9 left in a sidewall spacer shape via the insulation film 8 over the sidewall of the cap insulation film CP2 opposite to the first side thereof.

Incidentally, over the side surface of the conductive film 4 at a portion thereof left in the peripheral circuit region 1B, namely, the conductive film 4b, and, over the side surface of the conductive film 4 at a portion thereof left in the peripheral circuit region 1C, namely, the conductive film 4c, each spacer SP1 is also formed of the conductive film 9 left in a sidewall spacer shape via the insulation film 8.

Between the memory gate electrode MG formed in Step S9 and the p type well PW1 of the semiconductor substrate 1, and between the memory gate electrode MG and the control gate electrode CG, the insulation film 8 is interposed. The memory gate electrode MG is formed of the conductive film 9 in contact with the insulation film 8.

At the stage of having performed the etch back step of Step S9, portions of the insulation film 8 not covered with any of the memory gate electrode MG and the spacer SP1, namely, portions of the insulation film 8 not covered with any of the memory gate electrode MG and the spacer SP1 are exposed. The insulation film 8 under the memory gate electrode MG in the memory cell region 1A serves as the gate insulation film GIm of the memory transistor MT (see FIG. 11 described later). Further, by adjusting the film thickness of the conductive film 9 formed in Step S8, it is possible to adjust the memory gate length.

Figure 11:
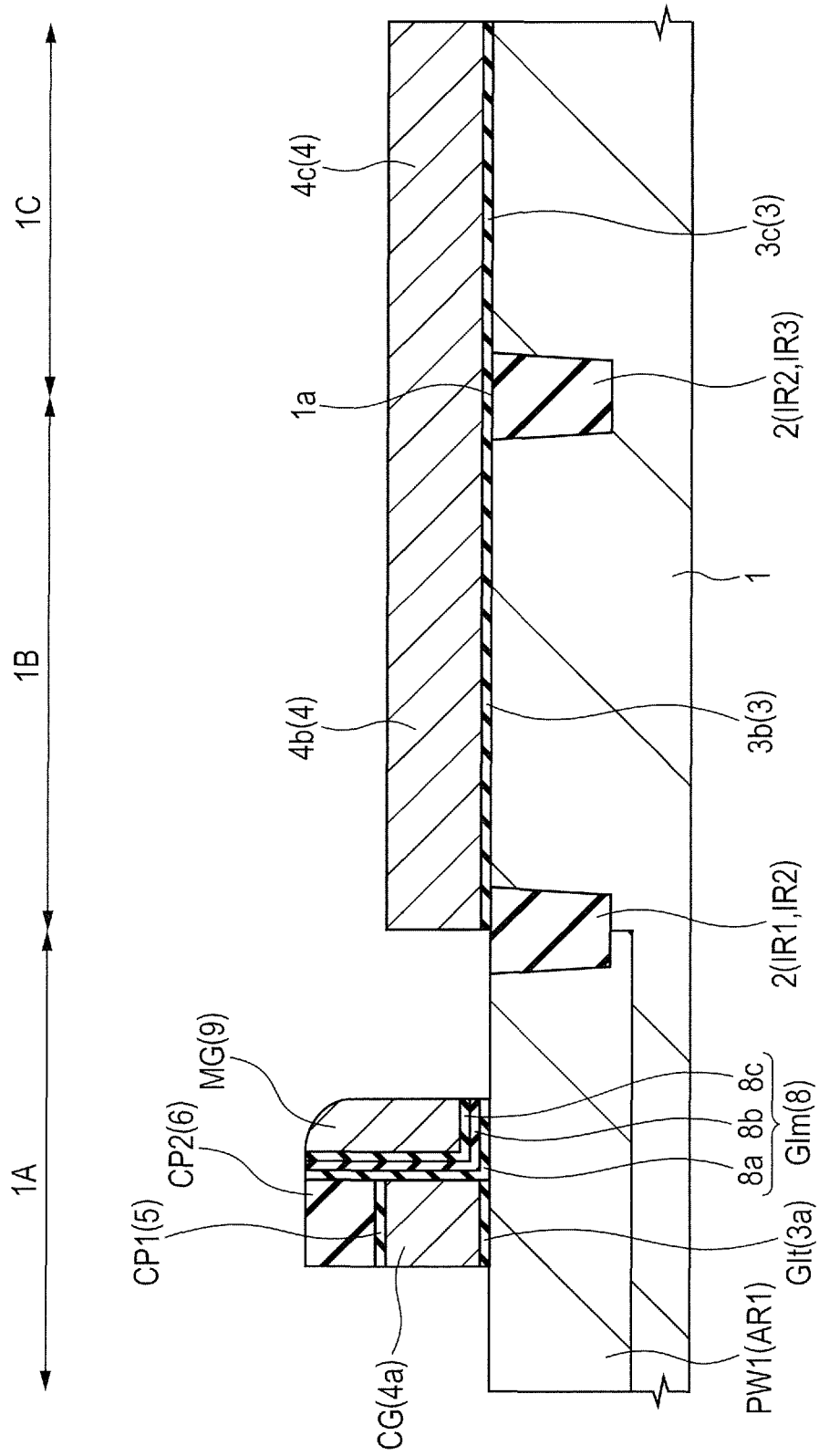
FIG. 11 is an essential part cross sectional view of the semiconductor device of First Embodiment during a manufacturing step.

Then, as shown in FIG. 11, the spacer SP1 and the insulation film 8 are removed (Step S10 of FIG. 4).

In Step S10, first, using photolithography, such a resist pattern (not shown) as to cover the memory gate electrode MG, and to expose the spacer SP1 is formed over the semiconductor substrate 1. Then, by dry etching using the formed resist pattern as an etching mask, the spacer SP1 is removed. On the other hand, the memory gate electrode MG has been covered with a resist pattern, and hence is left without being etched. Then, the resist pattern is removed.

In Step S10, then, the insulation film 8 at portions thereof not covered with the memory gate electrode MG is removed by etching such as wet etching. At this step, in the memory cell region 1A, the insulation film 8 situated between the memory gate electrode MG and the p type well PW1, and between the memory gate electrode MG and the control gate electrode CG is left without being removed. The insulation film 8 in other regions is removed. At this step, in the memory cell region 1A, there is formed the gate insulation film GIm formed of the insulation film 8 at a portion thereof left between the memory gate electrode MG and the p type well PW1, and at a portion thereof left between the memory gate electrode MG and the control gate electrode CG.

Incidentally, in Step S10, etching can also be performed so that, of the insulation film 8, the silicon oxide film 8c and the silicon nitride film 8b are removed, and the silicon oxide film 8a is left without being removed.

Figure 12:
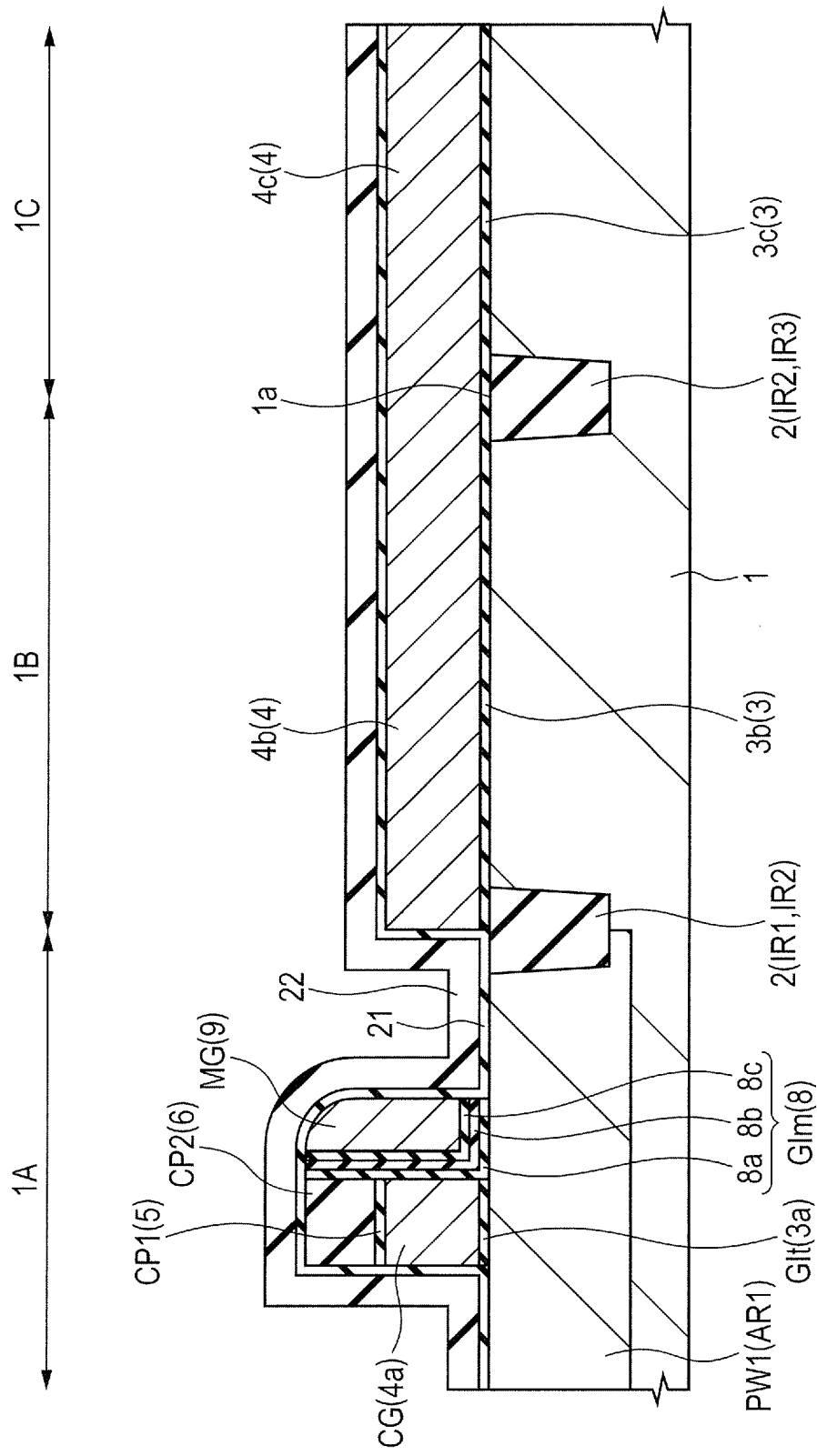
FIG. 12 is an essential part cross sectional view of the semiconductor device of First Embodiment during a manufacturing step.

Then, as shown in FIG. 12, there are formed an insulation film 21 and an insulation film 22 (Step S11 of FIG. 4).

In Step S11, first, in the memory cell region 1A, and the peripheral circuit regions 1B and 1C, an insulation film 21 is formed at the main surface 1a of the semiconductor substrate 1. At this step, the insulation film 21 is formed in the memory cell region 1A in such a manner as to cover the exposed portions of the main surface 1a of the semiconductor substrate 1, the control gate electrode CG, the cap insulation film CP2, and the memory gate electrode MG. Further, the insulation film 21 is formed in such a manner as to cover the conductive film 4 at a portion thereof left in the peripheral circuit region 1B, namely, the conductive film 4b, and the conductive film 4 at a portion thereof left in the peripheral circuit region 1C, namely, the conductive film 4c.

For example, at the exposed portions of the main surface 1a of the semiconductor substrate 1, the side surface of the control gate electrode CG, the top surface and the side surface of the cap insulation film CP2, the surface of the memory gate electrode MG, and the top surface and the side surface of the conductive film 4 at a portion thereof left in the peripheral circuit regions 1B and 1C, the insulation film 21 formed of a silicon oxide film is formed by a CVD method. At this step, the exposed portions of the main surface 1a of the semiconductor substrate 1, the side surface of the control gate electrode CG, the top surface and the side surface of the cap insulation film CP2, the surface of the memory gate electrode MG, and the top surface and the side surface of the conductive film 4 at a portion thereof left in the peripheral circuit regions 1B and 1C are covered with an oxide film.

As another form, the insulation film 21 formed of a silicon oxide film can also be formed by an ALD method. At this step, the exposed portions of the main surface 1a of the semiconductor substrate 1, the side surface of the control gate electrode CG, the top surface and the side surface of the cap insulation film CP2, the surface of the memory gate electrode MG, and the top surface and the side surface of the conductive film 4 at a portion thereof left in the peripheral circuit regions 1B and 1C are heat treated under an oxidizing atmosphere. Therefore, also at this step, the exposed portions of the main surface 1a of the semiconductor substrate 1, the side surface of the control gate electrode CG, the top surface and the side surface of the cap insulation film CP2, the surface of the memory gate electrode MG, and the top surface and the side surface of the conductive film 4 at a portion thereof left in the peripheral circuit regions 1B and 1C are oxidized.

In Step S11, then, in the memory cell region 1A, and the peripheral circuit regions 1B and 1C, over the insulation film 21, there is formed an insulation film 22. The insulation film 22 formed of, for example, a silicon nitride film is formed using, for example, a CVD method.

Figure 13:
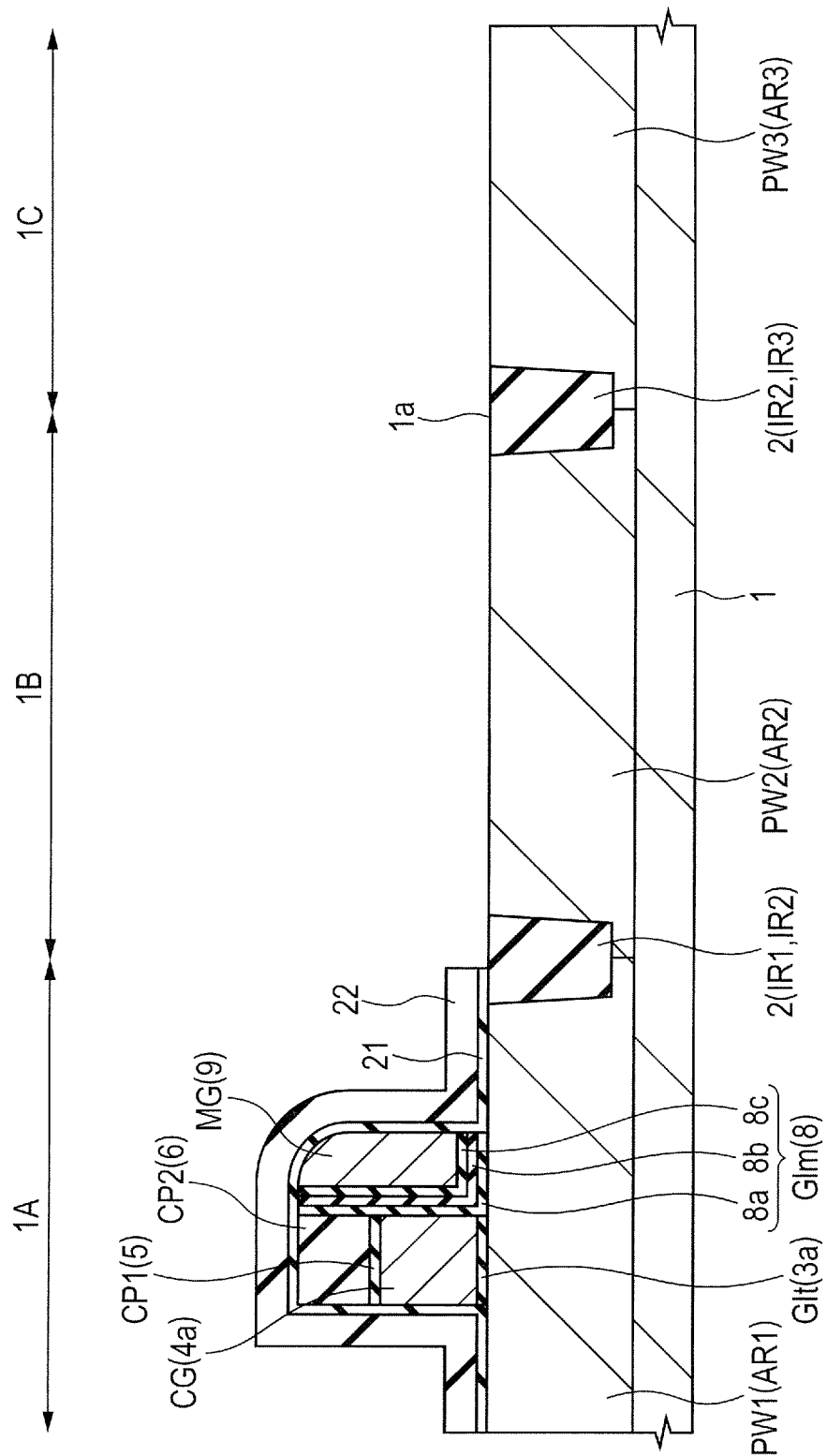
FIG. 13 is an essential part cross sectional view of the semiconductor device of First Embodiment during a manufacturing step.

Then, as shown in FIG. 13, in the peripheral circuit regions 1B and 1C, the insulation film 22, the insulation film 21, and the conductive film 4 are removed (Step S12 of FIG. 5).

In Step S12, first, in the memory cell region 1A, a resist film (not shown) is formed in such a manner as to cover the cap insulation film CP2 and the control gate electrode CG via the insulation film 21 and the insulation film 22. Whereas, a resist film (not shown) is formed in such a manner as to cover the conductive film 4 at a portion thereof left in the peripheral circuit regions 1B and 1C via the insulation film 21 and insulation film 22.

Then, the resist film is subjected to pattern exposure, followed by development. As a result, the resist film is patterned. Thus, the resist film is removed in the peripheral circuit regions 1B and 1C, and the resist film is left in the memory cell region 1A. This results in the formation of a resist film formed of the resist film at a portion thereof left in the memory cell region 1A.

Then, using the resist pattern as an etching mask, the insulation film 22, the insulation film 21, and the conductive film 4 are etched and removed by, for example, dry etching. As a result, as shown in FIG. 13, the conductive film 4 at a portion thereof left in the peripheral circuit regions 1B and 1C can be fully removed. Namely, in the peripheral circuit region 1B, the conductive film 4b can be removed, and in the peripheral circuit region 1C, the conductive film 4c can be removed. Then, the resist film at a portion thereof left in the memory cell region 1A, namely, the resist pattern is removed.

Step S11 and Step S12 are performed, thereby to leave the insulation film 21 and the insulation film 22 in the memory cell region 1A. As a result, the following can be prevented or inhibited: in the steps subsequent to Step S12 (Step S13 to Step S16), for example, when the insulation film 23 is formed, the upper layer part of the p type well PW1 situated at a portion thereof adjacent to the control gate electrode CG or the memory gate electrode MG is oxidized to form a gate bird's beak. Alternatively, the following can be prevented or inhibited: in the steps subsequent to Step S12 (Step S13 to Step S16), for example, when the insulation film 23 is formed, the surface of the control gate electrode CG or the memory gate electrode MG is oxidized, so that, for example, the gate length varies. Therefore, it is possible to prevent or inhibit the deterioration of the characteristics of the nonvolatile memory. This can improve the performances of the semiconductor device having a nonvolatile memory.

Incidentally, when a high breakdown voltage MISFET QH (see FIG. 19 described later) is not formed in the peripheral circuit region 1B, the insulation film 21 and the insulation film 22 are not required to be formed. Namely, when a high breakdown voltage MISFET QH is not formed in the peripheral circuit region 1B, the following procedure may be adopted: after performing Step S10, Step S11 is not performed; and in Step S12, the conductive film 4 is removed, and then, the step of Step S13 is performed. When a high breakdown voltage MISFET QH is not formed in the peripheral circuit region 1B, the heat treatment time in an oxidizing atmosphere is shortened, for example, for forming the insulation film 23 in Step S14 described later. For this reason, even when the insulation film 21 and the insulation film 22 are not formed, it is possible to prevent or inhibit the formation of the gate bird's beak, or the oxidation of the surface of the control gate electrode CG or the memory gate electrode MG.

Further, the step of removing the conductive films 4b and 4c in Step S12 can be performed, for example, at any time after Step S6 and before Step S12. However, by removing the conductive films 4b and 4c in Step S12, namely, immediately before Step S13 described later, it is possible to protect the main surface 1a of the semiconductor substrate 1 at portions thereof at which the p type wells PW2 and PW3 are formed.

Then, as shown in FIG. 13, in the peripheral circuit region 1B, the p type well PW2 is formed in the active region AR2, and in the peripheral circuit region 1C, the p type well PW3 is formed in the active region AR3 (Step S13 of FIG. 5). The p type well PW2 and the p type well PW3 can be formed in the same manner as with the p type well PW1 by doping a p type impurity such as boron (B) into the semiconductor substrate 1 by an ion implantation method or the like. The p type well PW2 and the p type well PW3 are formed to a prescribed depth from the main surface 1a of the semiconductor substrate 1.

Preferably, the p type impurity concentration in the p type well PW2 is lower than the p type impurity concentration in the p type well PW3. As a result, the driving voltage of the high breakdown voltage MISFET QH (see FIG. 19 described later) can be set higher than the driving voltage of the low breakdown voltage MISFET QL (see FIG. 19 described later).

Then, for example, by wet etching using a hydrofluoric acid (HF) aqueous solution, the natural oxide film over the surface of the semiconductor substrate 1 is removed. Thus, the surface of the semiconductor substrate 1 is cleaned, and thereby, the surface of the semiconductor substrate 1 is purified. As a result, in the peripheral circuit regions 1B and 1C, the surface of the semiconductor substrate 1, namely, the surfaces of the p type wells PW2 and PW3 are exposed.

Figure 14:
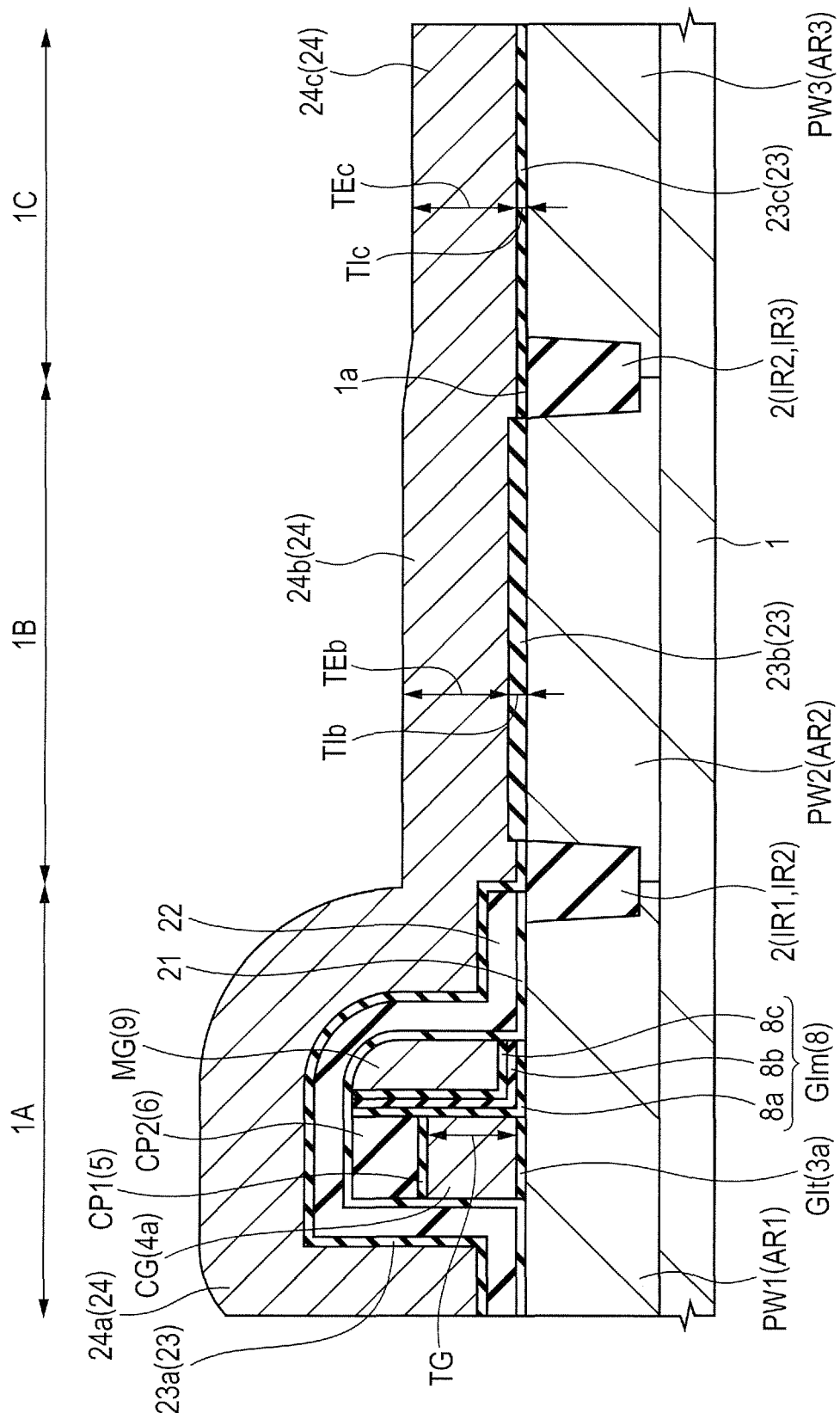
FIG. 14 is an essential part cross sectional view of the semiconductor device of First Embodiment during a manufacturing step.

Then, as shown in FIG. 14, entirely over the main surface 1a of the semiconductor substrate 1, there are formed an insulation film 23 and a conductive film 4 (Step S14 of FIG. 5).

In Step S14, first, as shown in FIG. 14, in the memory cell region 1A, and the peripheral circuit regions 1B and 1C, the insulation film 23 is formed over the main surface 1a of the semiconductor substrate 1. Of the insulation film 23, a portion formed in the memory cell region 1A is referred to as an insulation film 23a; a portion formed in the peripheral circuit region 1B is referred to as an insulation film 23b; and a portion formed in the peripheral circuit region 1C is referred to as an insulation film 23c. The insulation film 23b is formed at the same layer as the insulation film 23a, and the insulation film 23c is formed at the same layer as the insulation film 23a. The insulation film 23b is an insulation film for a gate insulation film GIH (see FIG. 16 described later) of a MISFET QH (see FIG. 19 described later). The insulation film 23c is an insulation film for a gate insulation film GIL (see FIG. 16 described later) of a MISFET QL (see FIG. 19 described later). Further, the insulation film 23b is formed over the p type well PW2, and the insulation film 23c is formed over the p type well PW3.

In the example shown in FIG. 14, the insulation film 23b is formed integrally with the insulation film 23a. The insulation film 23c is formed integrally with the insulation film 23a. However, the insulation film 23b may be formed apart from the insulation film 23a. The insulation film 23c may be formed apart from the insulation film 23a.

As described previously as the insulation film 23b, as the insulation film 23, there can be used a silicon oxide film, a silicon nitride film, or a silicon oxynitride film, or a High-k film, namely, a high dielectric constant film. Examples of the material usable as the insulation film 23 are as described previously as the insulation film 23b. Further, the insulation film 23 can be formed using a thermal oxidation method, a sputtering method, an ALD method, a CVD method, or the like.

As described previously, the MISFET QH (see FIG. 19 described later) formed in the peripheral circuit region 1B is a high breakdown voltage MISFET. The MISFET QL (see FIG. 19 described later) formed in the peripheral circuit region 1C is a low breakdown voltage MISFET. Accordingly, preferably, the film thickness TIb of the insulation film 23b for the gate insulation film GIH (see FIG. 16 described later) is larger than the film thickness TIc of the insulation film 23c for the gate insulation film GIL (see FIG. 16 described later). In such a case, the insulation film 23b is formed of a lamination film of the insulation film formed by oxidizing the upper surface of the p type well PW2, and the insulation film formed by, for example, a CVD method. Whereas, the insulation film 23c is formed of the insulation film formed by oxidizing the upper surface of the p type well PW3. With such a method, the film thickness TIb of the insulation film 23b can be set larger than the film thickness TIc of the insulation film 23c.

In Step S14, then, as shown in FIG. 14, in the memory cell region 1A, and the peripheral circuit regions 1B and 1C, a conductive film 24 is formed over the insulation film 23. Of the conductive film 24, a portion formed in the memory cell region 1A is referred to as a conductive film 24a; a portion formed in the peripheral circuit region 1B is referred to as a conductive film 24b; and a portion formed in the peripheral circuit region 1C is referred to as a conductive film 24c. The conductive film 24b is formed at the same layer as the conductive film 24a, and the conductive film 24c is formed at the same layer as the conductive film 24a. The conductive film 24b is a conductive film for a gate electrode GEH (see FIG. 16 described later) of a MISFET QH (see FIG. 19 described later). The conductive film 24c is a conductive film for a gate electrode GEL (see FIG. 16 described later) of a MISFET QL (see FIG. 19 described later).

In the example shown in FIG. 14, the conductive film 24b is formed integrally with the conductive film 24a. The conductive film 24c is formed integrally with the conductive film 24a. However, the conductive film 24b may be formed apart from the conductive film 24a. The conductive film 24c may be formed apart from the conductive film 24a.

Preferably, the conductive film 24 is formed of a polycrystal silicon film, namely, a polysilicon film. Such a conductive film 24 can be formed using a CVD method, or the like. The film thickness of the conductive film 24 can be set at a thickness enough to cover the insulation film 23. Alternatively, the following is also possible: for deposition, the conductive film 24 is deposited as an amorphous silicon film; then, by a subsequent heat treatment, the amorphous silicon film is turned into a polycrystal silicon film.

As the conductive film 24, it is preferable to use a film reduced in resistivity by being doped with an n type impurity such as phosphorus (P) or arsenic (As), or a p type impurity such as boron (B). The impurity can be doped during the deposition, or after the deposition of the conductive film 24. When the impurity is doped during the deposition of the conductive film 24, by allowing the gas for deposition of the conductive film 24 to contain a doping gas, it is possible to deposit the conductive film 24 doped with the impurity. On the other hand, when the impurity is doped after the deposition of a silicon film, after depositing a silicon film without doping an impurity intentionally, the silicon film is doped with an impurity by an ion implantation method or the like. As a result, it is possible to form a conductive film 24 doped with an impurity.

The film thickness TEc of the conductive film 24c can be set equal to the film thickness TEb of the conductive film 24b. Each of the film thickness TEb of the conductive film 24b and the film thickness TEc of the conductive film 24c can be set different from the film thickness TG of the control gate electrode CG.

Figure 15:
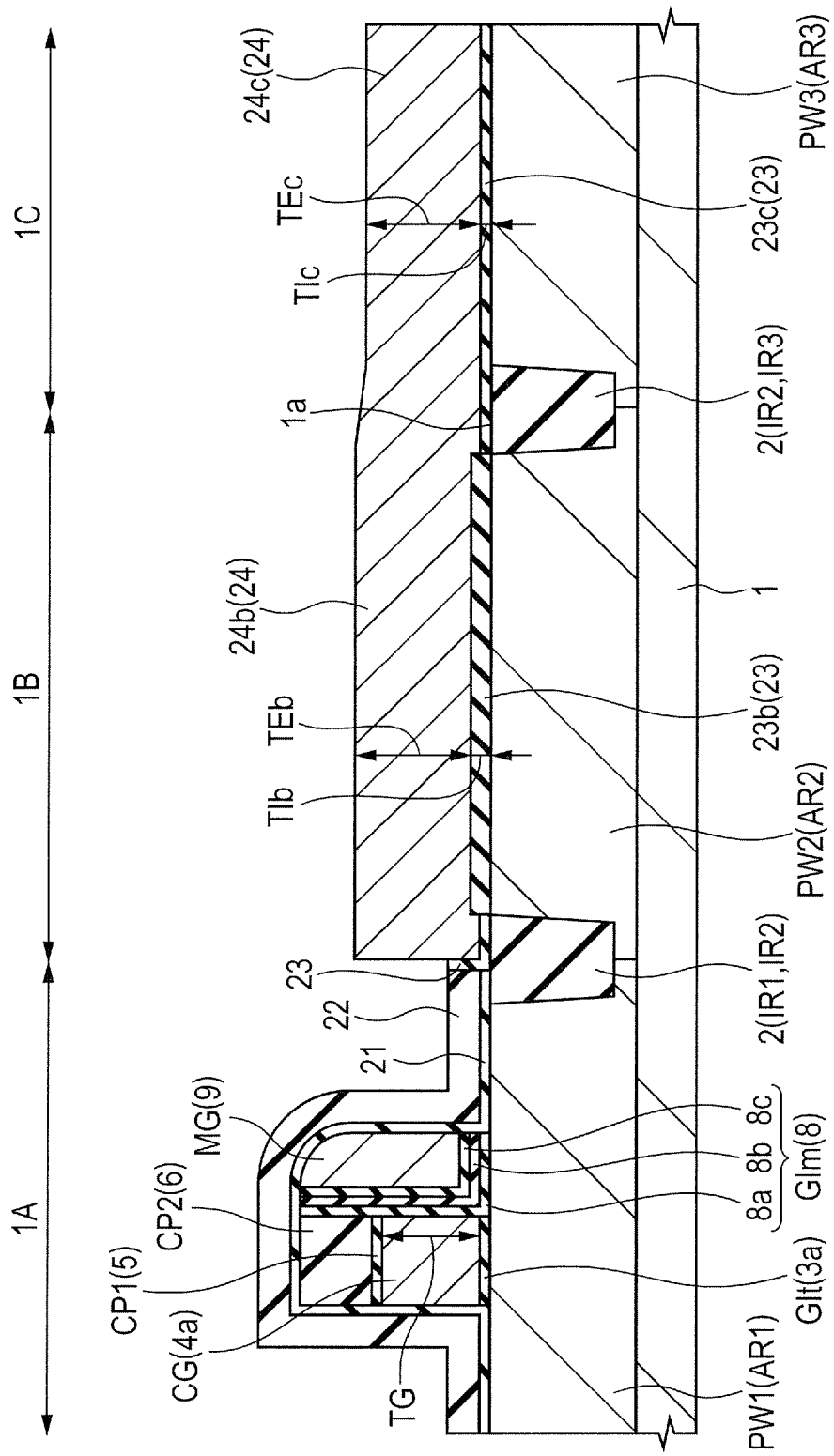
FIG. 15 is an essential part cross sectional view of the semiconductor device of First Embodiment during a manufacturing step.

Then, as shown in FIG. 15, in the memory cell region 1A, there is removed the conductive film 24 (Step S15 of FIG. 5).

In Step S15, first, in the memory cell region 1A, and the peripheral circuit regions 1B and 1C, a resist film (not shown) is formed in such a manner as to cover the conductive film 24. Then, the resist film is subjected to pattern exposure, followed by development. As a result, the resist film is patterned. Thus, the resist film is removed in the memory cell region 1A, and the resist film is left in the peripheral circuit regions 1B and 1C. This results in the formation of a resist pattern formed of the resist film at a portion thereof left in the peripheral circuit regions 1B and 1C.

Then, using the resist pattern as an etching mask, the conductive film 24 is etched and removed by, for example, dry etching. As a result, as shown in FIG. 15, the conductive film 24 at a portion thereof left in the memory cell region 1A, namely, the conductive film 24a can be removed. Then, the resist film at a portion thereof left in the peripheral circuit regions 1B and 1C, namely, the resist pattern is removed.

Incidentally, in Step S15, as shown in FIG. 15, when the conductive film 24 is removed in the memory cell region 1A, the insulation film 23 may be removed together with the conductive film 24 in the memory cell region 1A.

Alternatively, in Step S15, when the conductive film 24 and the insulation film 23 are removed in the memory cell region 1A, the insulation film 22 and the insulation film 21 at portions thereof left in the memory cell region 1A may be removed. However, in the case where the insulation film 22 and the insulation film 21 at portions thereof left in the memory cell region 1A are removed when the conductive film 24 and the insulation film 23 are removed, subsequently, before performing the step of Step S16 described later, preferably, insulation films corresponding to the insulation film 21 and the insulation film 22 are formed again in the memory cell region 1A.

Figure 16:
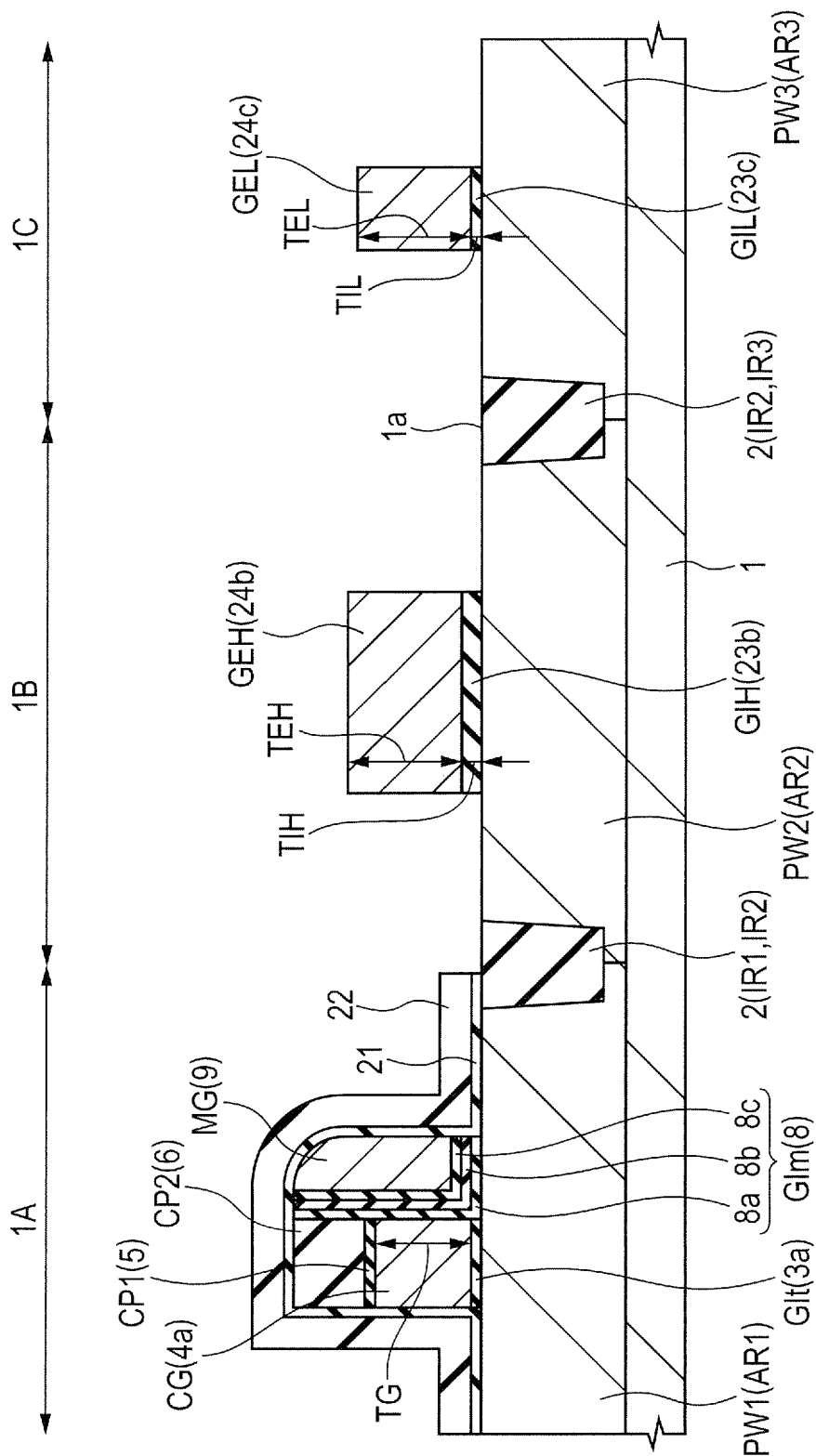
FIG. 16 is an essential part cross sectional view of the semiconductor device of First Embodiment during a manufacturing step.

Then, as shown in FIG. 16, in the peripheral circuit regions 1B and 1C, the conductive film 24 is patterned (Step S16 of FIG. 5). In the Step S16, using, for example, photolithography and etching, in the peripheral circuit regions 1B and 1C, the conductive film 24 is patterned.

First, entirely over the main surface 1a of the semiconductor substrate 1, there is formed a resist film. Then, of the peripheral circuit region 1B, in a region other than the region in which the gate electrode GEH is to be formed, there is formed an opening penetrating through the resist film, and reaching the conductive film 24. Of the peripheral circuit region 1C, in a region other than the region in which the gate electrode GEL is to be formed, there is formed an opening penetrating through the resist film, and reaching the conductive film 24. Then, there is formed a resist pattern formed of the resist film including the openings formed in the peripheral circuit regions 1B and 1C. At this step, the conductive film 24b at a portion thereof arranged in the region in which the gate electrode GEH is to be formed of the peripheral circuit region 1B, and the conductive film 24c at a portion thereof arranged in a region in which the gate electrode GEL is to be formed of the peripheral circuit region 1C are covered with the resist film. Whereas, the insulation film 22 at a portion thereof left in the memory cell region 1A is covered with the resist film.

Then, using the resist pattern as an etching mask, the conductive film 24 is etched and patterned by, for example, dry etching.

As a result, in the peripheral circuit region 1B, there is formed the gate electrode GEH formed of the conductive film 24b, and there is formed a gate insulation film GIH formed of the insulation film 23b between the gate electrode GEH and the p type well PW2 of the semiconductor substrate 1. Namely, the gate electrode GEH is formed over the p type well PW2 of the semiconductor substrate 1 via the gate insulation film GIH in the peripheral circuit region 1B.

Whereas, in the peripheral circuit region 1C, there is formed the gate electrode GEL formed of the conductive film 24c, and there is formed the gate insulation film GIL formed of the insulation film 23c between the gate electrode GEL and the p type well PW3 of the semiconductor substrate 1. Namely, the gate electrode GEL is formed over the p type well PW3 of the semiconductor substrate 1 via the gate insulation film GIL in the peripheral circuit region 1C.

On the other hand, in the memory cell region 1A, the memory gate electrode MG and the control gate electrode CG are covered with the resist pattern via the insulation film 21 and the insulation film 22. For this reason, the memory gate electrode MG and the control gate electrode CG are not etched. Then, the resist pattern, namely, the resist film is removed.

Incidentally, in the peripheral circuit region 1B, the insulation film 23b at a portion thereof not covered with the gate electrode GEH can be removed by being subjected to dry etching of Step S16, or by being subjected to wet etching after dry etching of Step S16. Whereas, in the peripheral circuit region 1C, the insulation film 23c at a portion thereof not covered with the gate electrode GEL can be removed by being subjected to dry etching of Step S16, or by being subjected to wet etching after dry etching of Step S16.

As described previously, when the film thickness TIb (see FIG. 14) of the insulation film 23b is larger than the film thickness TIc (see FIG. 14) of the insulation film 23c, the film thickness TIH of the gate insulation film GIH formed of the insulation film 23b is larger than the film thickness TIL of the gate insulation film GIL formed of the insulation film 23c. As a result, the gate insulation film GIH can be allowed to serve as the gate insulation film of the high breakdown voltage MISFET QH (see FIG. 19 described later), and the gate insulation film GIL can be allowed to serve as the gate insulation film of the low breakdown voltage MISFET QL (see FIG. 19 described later).

Further, as described previously, the film thickness TEc (see FIG. 14) of the conductive film 24c can be set equal to the film thickness TEb (see FIG. 14) of the conductive film 24b. Each of the film thickness TEb of the conductive film 24b and the film thickness TEc of the conductive film 24c can be set different from the film thickness TG of the control gate electrode CG. Therefore, the film thickness TEL of the gate electrode GEL formed of the conductive film 24c can be set equal to the film thickness TEH of the gate electrode GEH formed of the conductive film 24b. Each of the film thickness TEH of the gate electrode GEH and the film thickness TEL of the gate electrode GEL can be set different from the film thickness TG of the control gate electrode CG.

Figure 17:
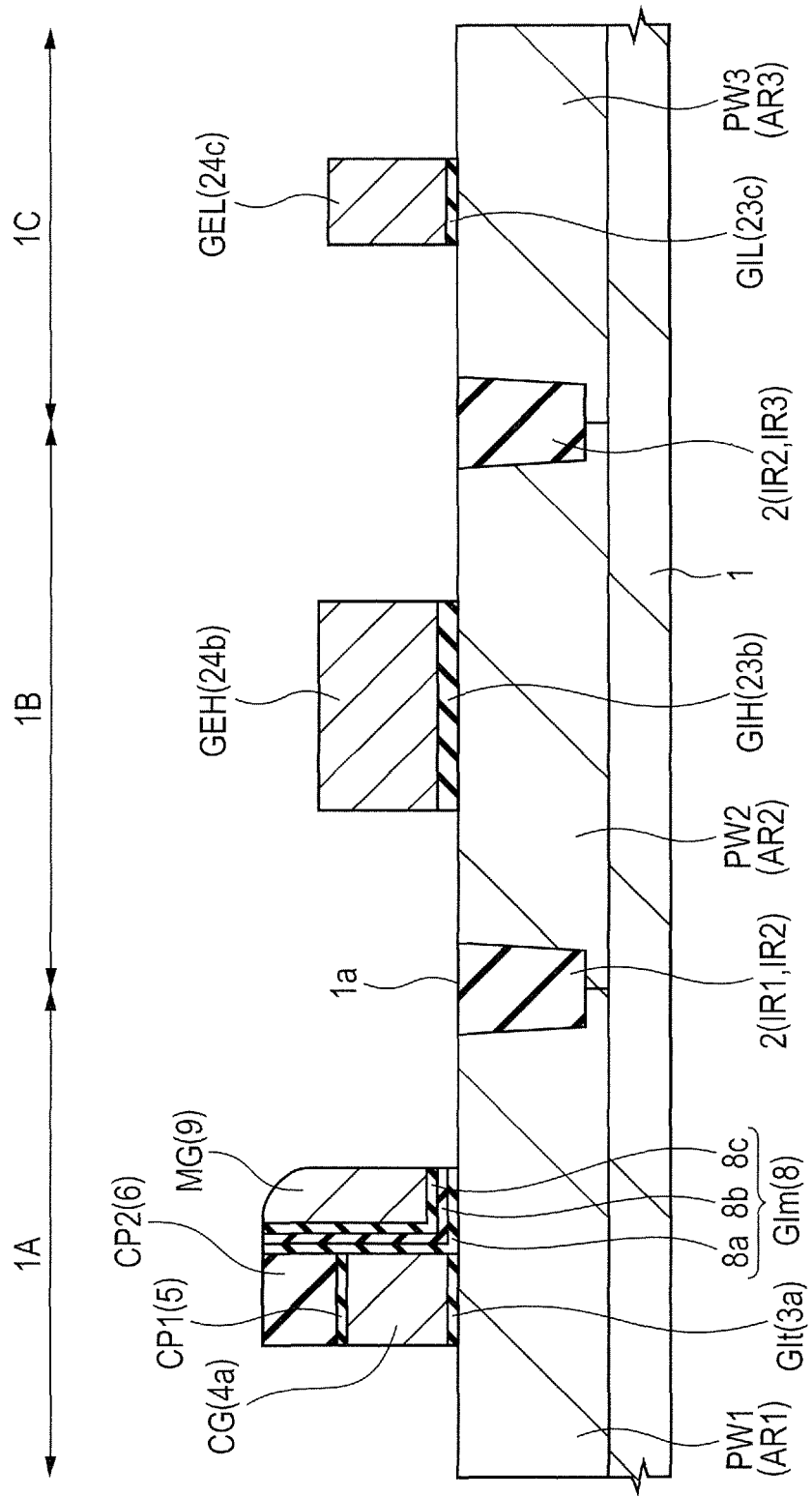
FIG. 17 is an essential part cross sectional view of the semiconductor device of First Embodiment during a manufacturing step.

Then, as shown in FIG. 17, the insulation film 22 and the insulation film 21 are removed (Step S17 of FIG. 5).

In Step S17, first, in the memory cell region 1A, a resist film (not shown) is formed in such a manner as to cover the cap insulation film CP2, the control gate electrode CG, and the memory gate electrode MG via the insulation film 21 and the insulation film 22. Whereas, a resist film (not shown) is formed in such a manner as to cover the gate electrode GEH in the peripheral circuit region 1B, and to cover the gate electrode GEL in the peripheral circuit region 1C.

Then, the resist film is subjected to pattern exposure, followed by development. As a result, the resist film is patterned. Thus, the resist film is removed in the memory cell region 1A, and the resist film is left in the peripheral circuit regions 1B and 1C. This results in the formation of a resist pattern formed of the resist film at a portion thereof left in the peripheral circuit regions 1B and 1C.

Then, using the resist pattern as an etching mask, the insulation film 22 and the insulation film 21 are etched and removed by, for example, dry etching. As a result, as shown in FIG. 17, the insulation film 22 at a portion thereof left in the memory cell region 1A, and the insulation film 21 at a portion thereof left in the memory cell region 1A can be fully removed. Then, the resist film at a portion thereof left in the peripheral circuit regions 1B and 1C, namely, the resist pattern is removed.

Figure 18:
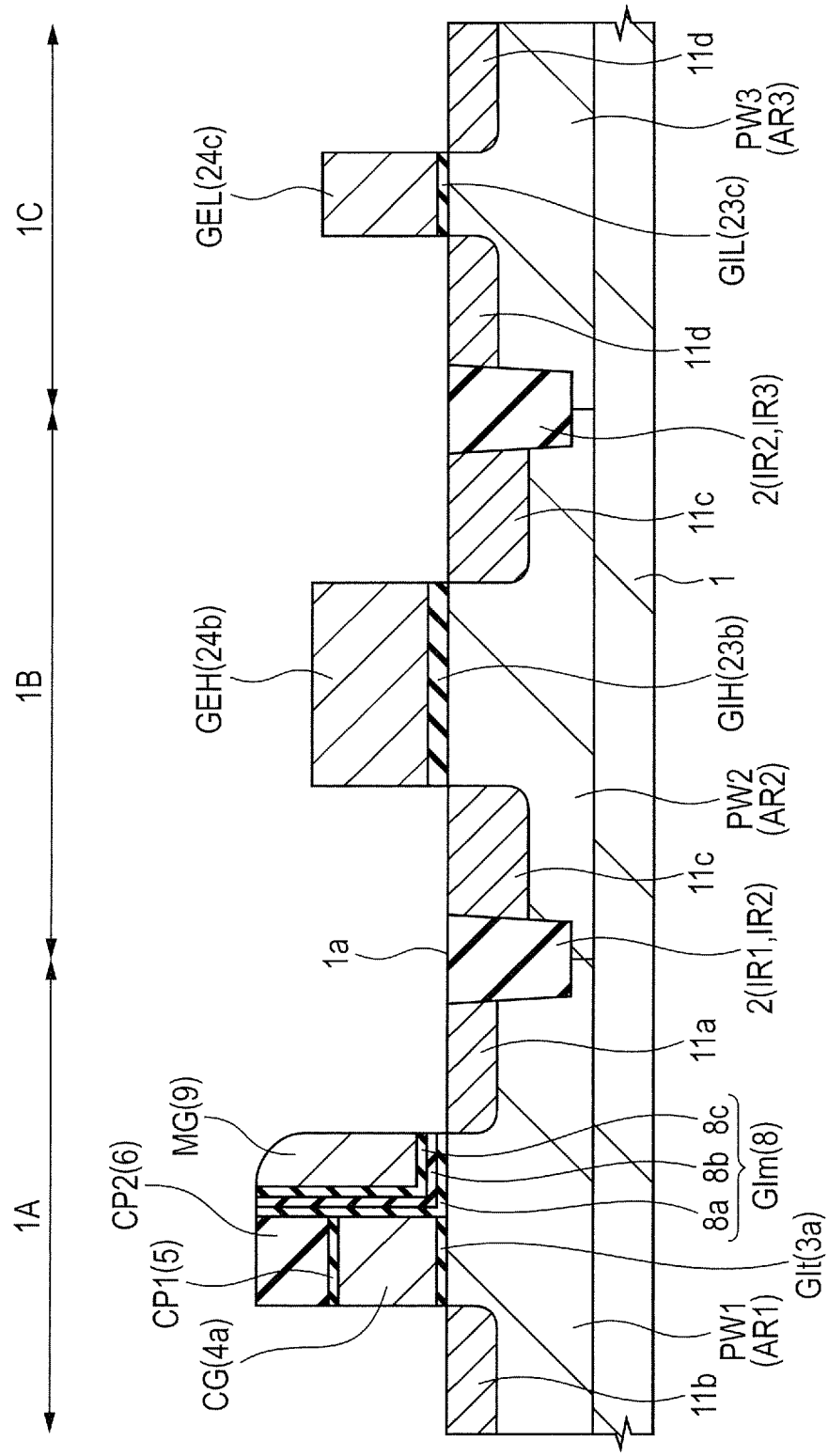
FIG. 18 is an essential part cross sectional view of the semiconductor device of First Embodiment during a manufacturing step.

Then, as shown in FIG. 18, n⁻ type semiconductor regions 11a, 11b, 11c, and 11d are formed using an ion implantation method, or the like (Step S18 of FIG. 5). In the Step S18, an n type impurity such as arsenic (As) or phosphorus (P) is doped into the p type wells PW1, PW2, and PW3 of the semiconductor substrate 1 using the control gate electrode CG, the memory gate electrode MG, the gate electrode GEH, and the gate electrode GEL as a mask. This results in the formation of n⁻ type semiconductor regions 11a, 11b, 11c, and 11d.

At this step, the n⁻ type semiconductor region 11a is formed in self-alignment with the side surface of the memory gate electrode MG in the memory cell region 1A. The n⁻ type semiconductor region 11b is formed in self-alignment with the side surface of the control gate electrode CG in the memory cell region 1A. Further, the n⁻ type semiconductor region 11c is formed in self-alignment with the side surface of the gate electrode GEH in the peripheral circuit region 1B. The n⁻ type semiconductor region 11d is formed in self-alignment with the side surface of the gate electrode GEL in the peripheral circuit region 1C.

In the example shown in FIG. 18, the injection energy for forming the n⁻ type semiconductor region 11c with an ion implantation method is set larger than the injection energy for forming the n⁻ type semiconductor region 11d by an ion implantation method. As a result, the depth position of the bottom surface of the n⁻ type semiconductor region 11c can be set deeper than the depth position of the bottom surface of the n⁻ type semiconductor region 11d.

Incidentally, the n⁻ type semiconductor regions 11a, 11b, 11c, and 11d can also be formed by the same ion implantation step.

Figure 19:
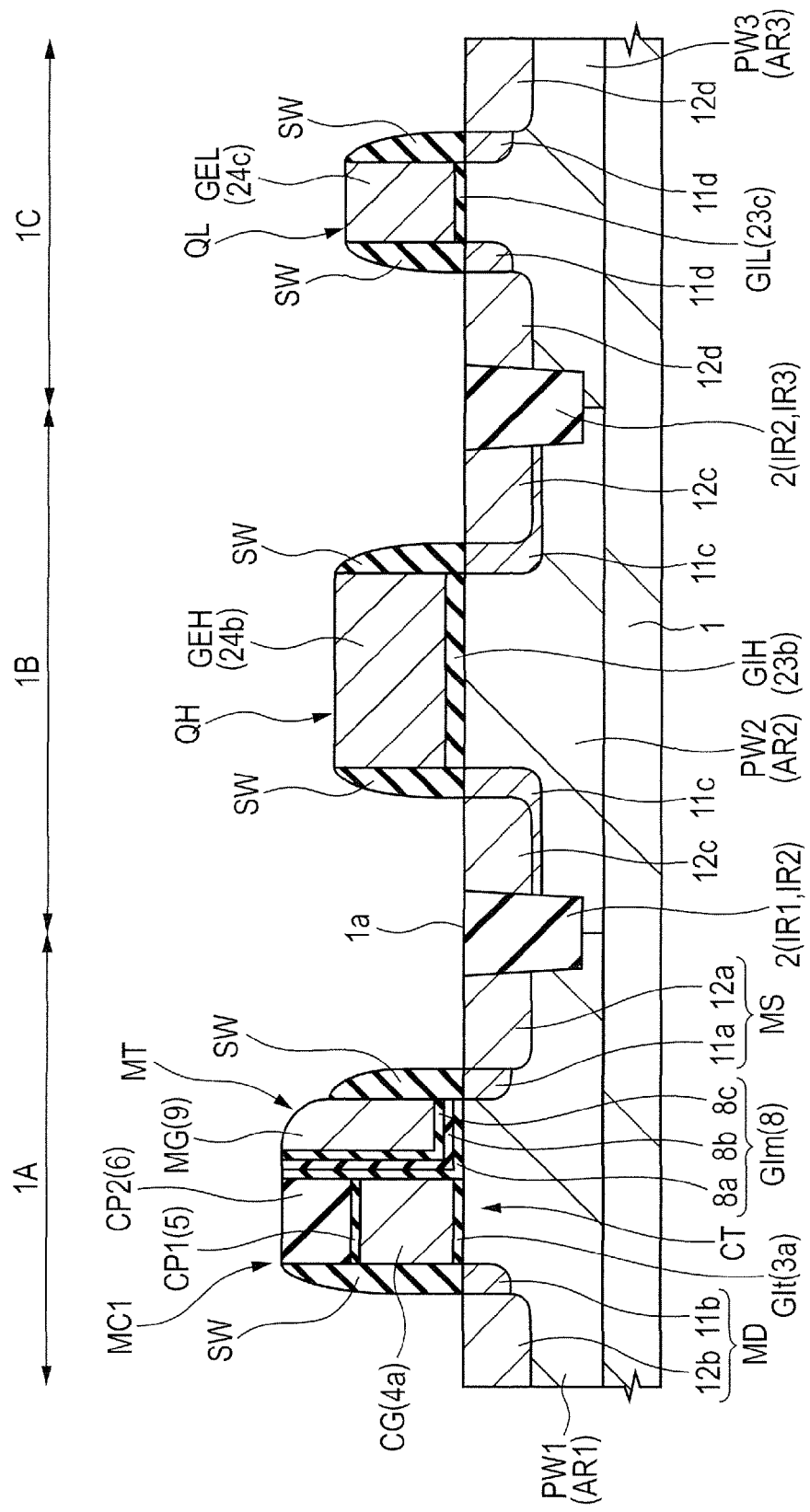
FIG. 19 is an essential part cross sectional view of the semiconductor device of First Embodiment during a manufacturing step.

Then, as shown in FIG. 19, sidewall spacers SW are formed over the sidewall of the control gate electrode CG, over the sidewall of the memory gate electrode MG, over the sidewall of the gate electrode GEH, and, over the sidewall of the gate electrode GEL (Step S19 of FIG. 5).

First, entirely over the main surface 1a of the semiconductor substrate 1, an insulation film for the sidewall spacer SW is formed. The formed insulation film is etched back by, for example, anisotropic etching. In this manner, the insulation film is selectively left over the sidewall of the control gate electrode CG, over the sidewall of the memory gate electrode MG, over the sidewall of the gate electrode GEH, and over the sidewall of the gate electrode GEL, thereby to form the sidewall spacers SW. The sidewall spacer SW is formed of an insulation film such as a silicon oxide film or a silicon nitride film, or a lamination film thereof.

Then, as shown in FIG. 19, n⁺ type semiconductor regions 12a, 12b, 12c, and 12d are formed using an ion implantation method or the like (Step S20 of FIG. 5). In the Step S20, an n type impurity such as arsenic (As) or phosphorus (P) is doped into the p type wells PW1, PW2, and PW3 of the semiconductor substrate 1, using the control gate electrode CG, the memory gate electrode MG, the gate electrode GEH, and the gate electrode GEL, and the sidewall spacers SW over their respective sidewalls as a mask. This results in the formation of the n+ type semiconductor regions 12a, 12b, 12c, and 12d.

At this step, the n+ type semiconductor region 12a is formed in self-alignment with the sidewall spacer SW over the sidewall of the memory gate electrode MG in the memory cell region 1A. Whereas, the n+ type semiconductor region 12b is formed in self-alignment with the sidewall spacer SW over the sidewall of the control gate electrode CG in the memory cell region 1A. Further, the n+ type semiconductor regions 12c are formed in self-alignment with the sidewall spacers SW over the opposite sidewalls of the gate electrode GEH in the peripheral circuit region 1B. The n+ type semiconductor regions 12d are formed in self-alignment with the sidewall spacers SW over the opposite sidewalls of the gate electrode GEL in the peripheral circuit region 1C. As a result, a LDD structure is formed.

In the present First Embodiment, the injection energy for forming the n+ type semiconductor regions 12c by an ion implantation method is set substantially equal to the injection energy for forming the n+ type semiconductor regions 12d by an ion implantation method. As a result, the depth position of the bottom surface of each n+ type semiconductor region 12c can be set substantially equal to the depth position of the bottom surface of each n+ type semiconductor region 12d. Therefore, the depth position of the bottom surface of each n+ type semiconductor region 12c can be set shallower than the depth position of the bottom surface of each n− type semiconductor region 11c, and the depth position of the bottom surface of each n+ type semiconductor region 12d can be set deeper than the depth position of the bottom surface of each n− type semiconductor region 11d.

Incidentally, the n− type semiconductor regions 12a, 12b, 12c, and 12d can also be formed by mutually different ion implantation steps, respectively.

In this manner, the n− type semiconductor region 11a, and the n+ type semiconductor region 12a having a higher impurity concentration than that form an n type semiconductor region MS functioning as the source region of the memory transistor MT. Whereas, the n− type semiconductor region 11b, and the n+ type semiconductor region 12b having a higher impurity concentration than that form an n type semiconductor region MD functioning as the drain region of the control transistor CT. The semiconductor region MS is, in a plan view, formed in the upper layer part of the p type well PW1 at a portion thereof situated opposite to the control gate electrode CG across the memory gate electrode MG. The semiconductor region MD is, in a plan view, formed in the upper layer part of the p type well PW1 at a portion thereof situated opposite to the memory gate electrode MG across the control gate electrode CG.

Then, there is performed activating annealing which is a heat treatment for activating the impurities doped into the n− type semiconductor regions 11a, 11b, 11c, and 11d, the n+ type semiconductor regions 12a, 12b, 12c, and 12d, and the like.

As a result, as shown in FIG. 19, in the memory cell region 1A, there are formed the control transistor CT and the memory transistor MT. The control transistor CT and the memory transistor MT form a memory cell MC1 as a nonvolatile memory. Namely, the control gate electrode CG, the gate insulation film GIt, the memory gate electrode MG, and the gate insulation film GIm form the memory cell MC1 as a nonvolatile memory.

Further, as shown in FIG. 19, in the peripheral circuit region 1B, there is formed a high breakdown voltage MISFET QH. In the peripheral circuit region 1C, there is formed a low breakdown voltage MISFET QL. Namely, the gate electrode GEH and the gate insulation film GIH form a high breakdown voltage MISFET QH, and the gate electrode GEL and the gate insulation film GIL form a low breakdown voltage MISFET QL.

Figure 20:
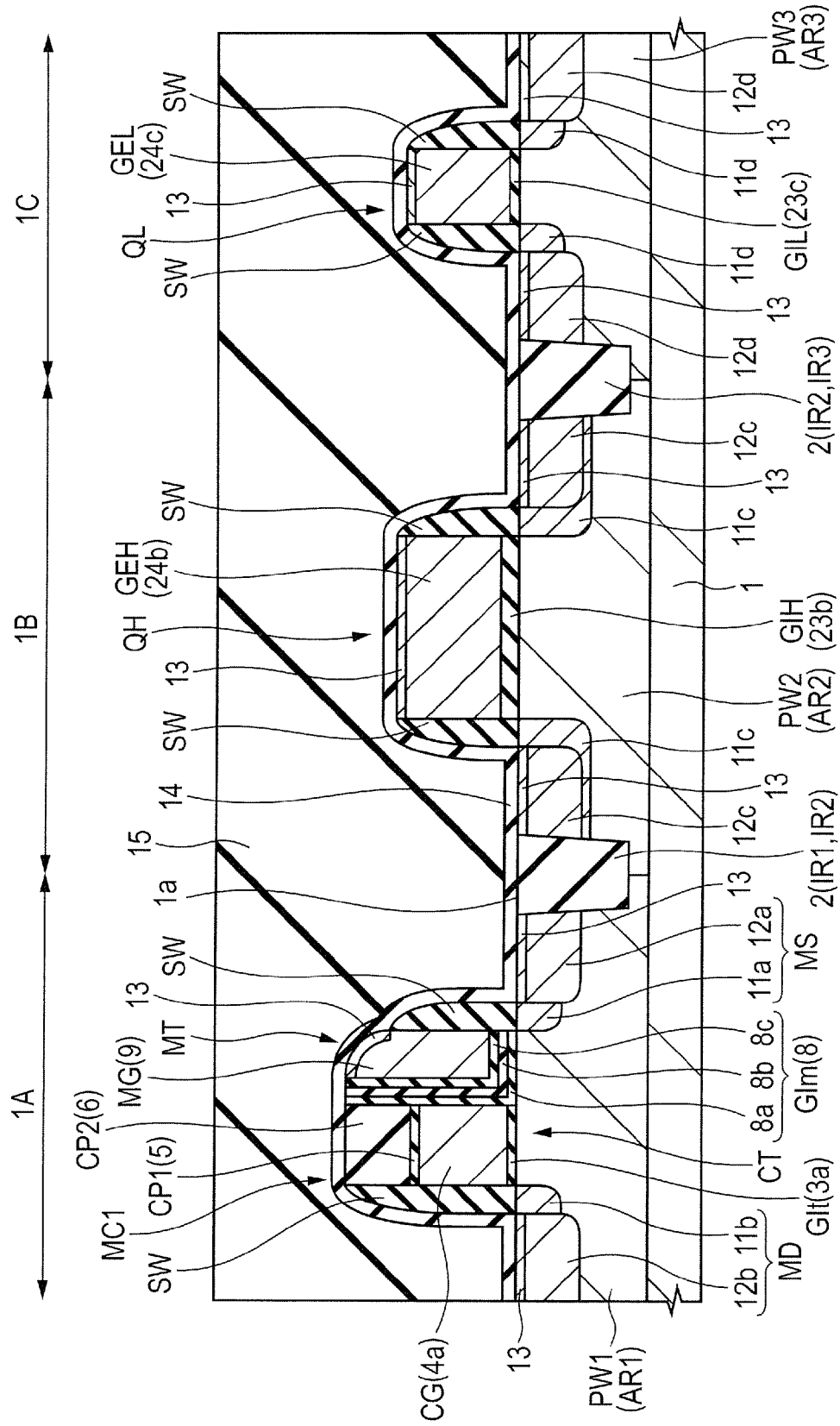
FIG. 20 is an essential part cross sectional view of the semiconductor device of First Embodiment during a manufacturing step.

Then, as shown in FIG. 20, there are formed a metal silicide layer 13, an insulation film 14, and an interlayer insulation film 15 (Step S21 of FIG. 5).

In Step S21, first, as shown in FIG. 20, there is formed the metal silicide layer 13. Entirely over the main surface 1a of the semiconductor substrate 1, a metal film is formed in such a manner as to cover the cap insulation film CP2, the gate insulation film GIm, the memory gate electrode MG, the gate electrodes GEH and GEL, and the sidewall spacers SW. The metal film is formed of, for example, a cobalt (Co) film, a nickel (Ni) film, or a nickel platinum alloy film, and can be formed using a sputtering method, or the like. Then, the semiconductor substrate 1 is subjected to a heat treatment. As a result, respective upper layer parts of the n+ type semiconductor regions 12a, 12b, 12c, and 12d are allowed to react with the metal film. This results in the formation of the metal silicide layer 13 over each of the n+ type semiconductor regions 12a, 12b, 12c, and 12d.

The metal silicide layer 13 can be set as, for example, a cobalt silicide layer, a nickel silicide layer, or a platinum-doped nickel silicide layer. Then, the unreacted metal film is removed. By performing such a so-called salicide process, the metal silicide layer 13 can be formed over each of the n+ type semiconductor regions 12a, 12b, 12c, and 12d as shown in FIG. 20. Incidentally, the metal silicide layers 13 can also be formed over the memory gate electrode MG, over the gate electrode GEH, and over the gate electrode GEL.

In Step S21, then, as shown in FIG. 20, there is formed an insulation film 14. The insulation film 14 is formed in such a manner as to cover the cap insulation film CP2, the gate insulation film GIm, the memory gate electrode MG, the gate electrodes GEH and GEL, and the sidewall spacers SW. The insulation film 14 is formed of, for example, a silicon nitride film. The insulation film 14 can be formed by, for example, a CVD method.

In Step S21, then, as shown in FIG. 20, an interlayer insulation film 15 is formed over the insulation film 14. The interlayer insulation film 15 is formed of a single film of a silicon oxide film, a lamination film of a silicon nitride film and a silicon oxide film, or the like. After forming the interlayer insulation film 15 by, for example, a CVD method, the top surface of the interlayer insulation film 15 is planarized.

Then, as shown in FIG. 1, there are formed plugs PG penetrating through the interlayer insulation film 15 (Step S22 of FIG. 5). First, using the resist pattern (not shown) formed over the interlayer insulation film 15 using photolithography as an etching mask, the interlayer insulation film 15 is dry etched. As a result, contact holes CNT are formed in the interlayer insulation film 15. Then, in each contact hole CNT, there is formed a conductive plug PG formed of tungsten (W) or the like as a conductor part.

For forming the plugs PG, for example, over the interlayer insulation film 15 including the insides of the contact holes CNT, there is formed a barrier conductor film formed of, for example, a titanium (Ti) film, a titanium nitride (TiN) film, or a lamination film thereof. Then, over the barrier conductor film, a main conductor film formed of a tungsten (W) film, or the like is formed in such a manner as to fill the contact holes CNT. The unnecessary portions of the main conductor film and the barrier conductor film over the interlayer insulation film 15 are removed by a CMP (Chemical Mechanical Polishing) method, an etch back method, or the like. As a result, the plugs PG can be formed. Incidentally, for simplification of the drawing, the barrier conductor film and the main conductor film forming the plug PG are integrally shown.

The contact holes CNT and the plugs PG embedded therein are formed over the $n^+$ type semiconductor regions 12a, 12b, 12c, and 12d, over the control gate electrode CG, over the memory gate electrode MG, over the gate electrode GEH, over the gate electrode GEL, and the like. At the bottom of each contact hole CNT, there is exposed, for example, a part of the metal silicide layer 13 over the surface of each of the $n^+$ type semiconductor regions 12a, 12b, 12c, and 12d, a part of the metal silicide layer 13 over the surface of the control gate electrode CG, or a part of the metal silicide layer 13 over the surface of the memory gate electrode MG. Alternatively, at the bottom of each contact hole CNT, there is exposed, for example, a part of the metal silicide layer 13 over the gate electrode GEH or a part of the metal silicide layer 13 over the gate electrode GEL.

Incidentally, FIG. 1 shows a cross section in which a part of the metal silicide layer 13 over each of the $n^+$ type semiconductor regions 12b, 12c, and 12d is exposed at the bottom of the contact hole CNT, and electrically coupled with the plug PG filling the contact hole CNT.

In the manner up to this point, there is manufactured the semiconductor device of the present First Embodiment described by reference to FIG. 1. Incidentally, over the interlayer insulation film 15 including the plugs PG embedded therein, a wire including, for example, copper (Cu) as the main conductive film can be formed using, for example, a damascene technology, but a description thereon is herein omitted.

<Regarding the Characteristic Variations of MISFETs Formed in the Peripheral Circuit Regions>

Figure 21:
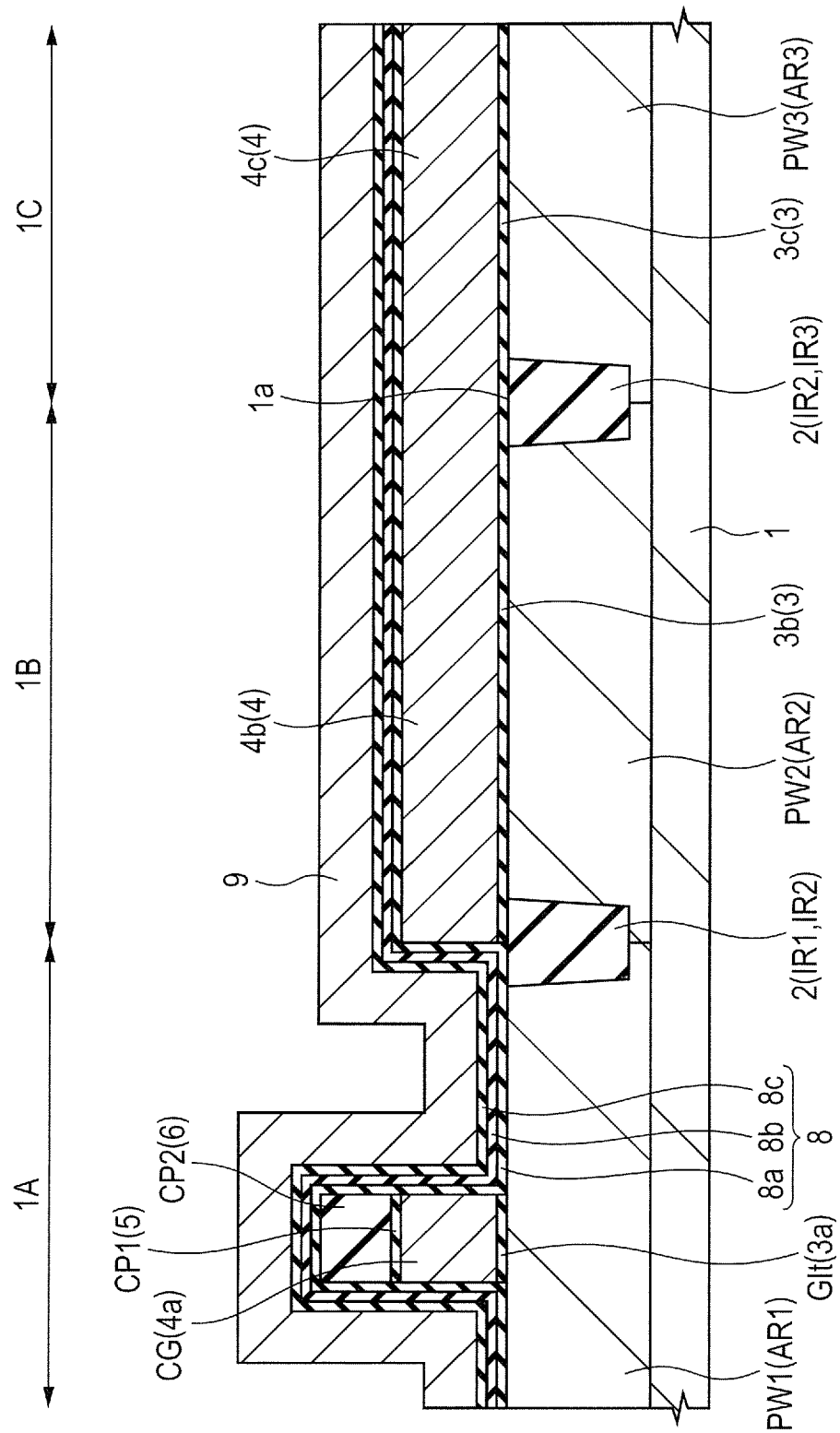
FIG. 21 is an essential part cross sectional view of a semiconductor device of Comparative Example during a manufacturing step.

Then, the characteristic variations of a MISFETs formed in the peripheral circuit regions will be described with comparison with a manufacturing method of a semiconductor device of Comparative Example. FIG. 21 is an essential part cross sectional view of the semiconductor device of Comparative Example during a manufacturing step.

With the method for manufacturing the semiconductor device of Comparative Example, in the same manner as with the method for manufacturing the semiconductor device of First Embodiment, the steps corresponding to Step S1 and Step S2 of FIG. 4 are performed. Then, with the method for manufacturing the semiconductor device of Comparative Example, as distinct from the manufacturing step of the semiconductor device of First Embodiment, in the step corresponding to Step S3 of FIG. 4, in the peripheral circuit region 1B, a p type well PW2 is formed in the active region AR2, and in the peripheral circuit region 1C, a p type well PW3 is formed in the active region AR3.

With the method for manufacturing the semiconductor device of Comparative Example, then, the steps corresponding to Step S4 to Step S8 of FIG. 4 are performed. As a result, as shown in FIG. 21, there are formed an insulation film 8 as an ONO film and a conductive film 9.

However, when the insulation film 8 as an ONO film is formed, as described previously, a high temperature treatment at, for example, 1025° C. is carried out. Therefore, in Comparative Example, before forming the insulation film 8, the p type well PW3 as a semiconductor region has already been formed in the peripheral circuit region 1C. For this reason, the n type impurity doped into the p type well PW3 for forming the insulation film 8 is diffused at high temperatures. This results in a change in impurity concentration distribution in the p type well PW3. Therefore, the threshold voltage of the MISFET QL formed in the peripheral circuit region 1C, and the like vary. This makes it impossible to improve the performances of a semiconductor device having a nonvolatile memory.

Features and Effects of the Present Embodiment

On the other hand, with the method for manufacturing the semiconductor device of the present First Embodiment, in the memory cell region 1A, over the main surface 1a of the semiconductor substrate 1, there is formed the control gate electrode CG formed of a conductive film 4a. Then, the insulation film 8 as an ONO film and the conductive film 9 are formed in such a manner as to cover the control gate electrode CG. Thus, the conductive film 9 is etched back. As a result, the conductive film 9 is left over the sidewall of the control gate electrode CG via the insulation film 8 to form the memory gate electrode MG. Then, in the peripheral circuit region 1C, a p type well PW3 is formed in the main surface 1a of the semiconductor substrate 1. Over the p type well PW3, there is formed a conductive film 24. Then, there is formed a gate electrode GEL formed of the conductive film 24.

In the step of forming the insulation film 8 as an ONO film, as described previously, a high temperature treatment at, for example, about 1025° C. is performed. Therefore, in accordance with the present First Embodiment, after forming the insulation film 8, the p type well PW3 is formed. For this reason, the n type impurity doped into the p type well PW3 can be prevented from being diffused at high temperatures when the insulation film 8 is formed. Then, the concentration distribution of the impurity in the p type well PW3 can be prevented from being changed. Therefore, it is possible to prevent or inhibit a variation in threshold voltage of the MISFET QL formed in the peripheral circuit region 1C, or the like. This can improve the performances of a semiconductor device having a nonvolatile memory.

Incidentally, in the present First Embodiment, a description has been given by taking as an example the case where, when the p type well PW3 is formed after forming the memory gate electrode MG, the p type well PW2 is formed; and when the gate electrode GEL is formed over the p type well PW3, the gate electrode GEH is formed over the p type well PW2. However, the following may also be adopted: after forming the memory gate electrode MG, and before forming the p type well PW3, the p type well PW2 is formed; and over the p type well PW2, there is formed the gate electrode GEH.

Second Embodiment

With the method for manufacturing the semiconductor device of First Embodiment, in both of the high voltage type MIS region and the low voltage type MIS region, after forming the insulation film as an ONO film, the p type well was formed. In contrast, with a method for manufacturing a semiconductor device of Second Embodiment, in the low voltage type MIS region, after forming an insulation film as an ONO film, a p type well is formed. However, in the high voltage type MIS region, before forming an insulation film as an ONO film, a p type well is formed.

<Structure of Semiconductor Device>

Figure 22:
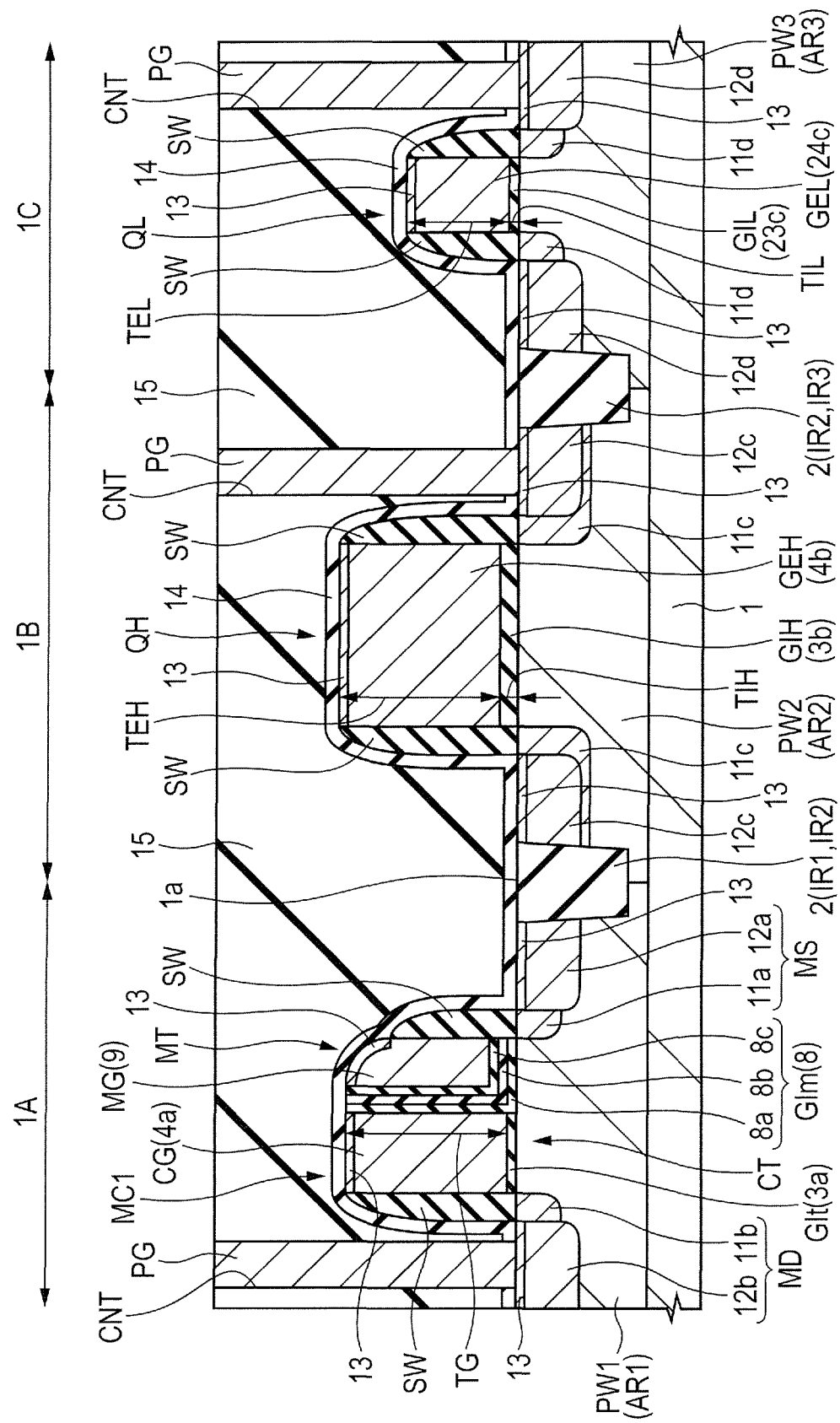
FIG. 22 is an essential part cross sectional view of a semiconductor device of Second Embodiment.

First, the structure of the semiconductor device of the present Second Embodiment will be described by reference to the accompanying drawings. FIG. 22 is an essential part cross sectional view of the semiconductor device of Second Embodiment.

Also in the present Second Embodiment, as in First Embodiment, the semiconductor device has a memory cell region 1A, and peripheral circuit regions 1B and 1C as some regions of the main surface 1a of the semiconductor substrate 1. In the memory cell region 1A, there is formed a memory cell MC1. In the peripheral circuit region 1B, there is formed a MISFET QH. In the peripheral circuit region 1C, there is formed a MISFET QL.

Also in the present Second Embodiment, as in First Embodiment, the peripheral circuit region 1B is a high voltage type MIS region, and the peripheral circuit region 1C is a low voltage type MIS region. Therefore, the MISFET QH formed in the peripheral circuit region 1B is a high breakdown voltage MISFET, and the MISFET QL formed in the peripheral circuit region 1C is a low breakdown voltage MISFET.

In the present Second Embodiment, as in First Embodiment, the memory cell MC1 has an n type semiconductor region MS, an n type semiconductor region MD, a control gate electrode CG, and a memory gate electrode MG. Further, the memory cell MC1 has a gate insulation film GIt formed between the control gate electrode CG and the semiconductor substrate 1, and a gate insulation film GIm formed between the memory gate electrode MG and the semiconductor substrate 1, and between the memory gate electrode MG and the control gate electrode CG.

In the present Second Embodiment, as described later, the film thickness TG of the control gate electrode CG can be set larger than the film thickness TEL of the gate electrode GEL. Accordingly, in the present Second Embodiment, as distinct from First Embodiment, the film thickness TG of the control gate electrode CG can be set equal to the height of the memory gate electrode MG. For this reason, over the control gate electrode CG, a cap insulation film CP2 (see FIG. 1) is not required to be formed via the cap insulation film CP1 (see FIG. 1).

Incidentally, when a metal silicide layer 13 is formed over the control gate electrode CG, the film thickness TG of the control gate electrode CG can be defined as the distance from the bottom surface of the control gate electrode CG to the top surface of the metal silicide layer 13 formed over the control gate electrode CG.

Further, also in the present Second Embodiment, as in First Embodiment, the high breakdown voltage MISFET QH has a semiconductor region formed of an n⁻ type semiconductor region 11c and an n⁺ type semiconductor region 12c, a gate insulation film GIH formed over the p type well PW2, and a gate electrode GEH formed over the gate insulation film GIH.

On the other hand, in the present Second Embodiment, as distinct from First Embodiment, the gate electrode GEH is formed of a conductive film 4b. As the conductive film 4b, there can be used a conductive film formed at the same layer as the conductive film 4a included in the control gate electrode CG of the memory cell MC1. For this reason, the film thickness TEH of the gate electrode GEH can be set equal to the film thickness TG of the control gate electrode CG.

Incidentally, when the metal silicide layer 13 is formed over the gate electrode GEH, the film thickness TEH of the gate electrode GEH can be defined as the distance from the bottom surface of the gate electrode GEH to the top surface of the metal silicide layer 13 formed over the gate electrode GEH.

Further, also in the present Second Embodiment, as in First Embodiment, the low breakdown voltage MISFET QL has a semiconductor region formed of an n⁻ type semiconductor region 11d and an n⁺ type semiconductor region 12d, a gate insulation film GIL formed over a p type well PW3, and a gate electrode GEL formed over the gate insulation film GIL.

In the present Second Embodiment, as in First Embodiment, the gate electrode GEL is formed of a conductive film 24c. The conductive film 24c is formed of silicon, and is formed of, for example, an n type polysilicon film which is a polycrystal silicon film doped with an n type impurity. Specifically, the gate electrode GEL is formed of the patterned conductive film 24c. As the conductive film 24c, there can be used a conductive film different from both of the conductive film 4a included in the control gate electrode CG of the memory cell MC1, and the conductive film 4b included in the gate electrode GEH of the MISFET QH. For this reason, the film thickness TEL of the gate electrode GEL can be set different from the film thickness TEH of the gate electrode GEH.

Incidentally, when the metal silicide layer 13 is formed over the gate electrode GEL, the film thickness TEL of the gate electrode GEL can be defined as the distance from the bottom surface of the gate electrode GEL to the top surface of the metal silicide layer 13 formed over the gate electrode GEL.

Also in the present Second Embodiment, as in First Embodiment, the gate length of the high breakdown voltage MISFET QH is larger than the gate length of the low breakdown voltage MISFET QL. Whereas, the driving voltage of the high breakdown voltage MISFET QH is higher than the driving voltage of the low breakdown voltage MISFET QL. The breakdown voltage of the high breakdown voltage MISFET QH is higher than the breakdown voltage of the low breakdown voltage MISFET QL.

Preferably, the film thickness TIH of the gate insulation film GIH is larger than the film thickness TIL of the gate insulation film GIL. As a result, the driving voltage of the high breakdown voltage MISFET QH can be set higher than the driving voltage of the low breakdown voltage MISFET QL.

Alternatively, preferably, the p type impurity concentration in the p type well PW2 is lower than the p type impurity concentration in the p type well PW3. As a result, the driving voltage of the high breakdown voltage MISFET QH can be set higher than the driving voltage of the low breakdown voltage MISFET QL.

Alternatively, preferably, the film thickness TEL of the gate electrode GEL is smaller than the film thickness TEH of the gate electrode GEH. Namely, the film thickness TEL of the gate electrode GEL is smaller than the film thickness TG of the control gate electrode CG. As a result, even when the gate length of the low breakdown voltage MISFET QL is smaller than the gate length of the high breakdown voltage MISFET QH, the gate electrode GEL can be formed with precision in shape. Alternatively, even when, in the peripheral circuit region 1C, the distance between the adjacent two gate electrodes GEL is relatively smaller, the space between the adjacent two gate electrodes GEL can be readily filled with the interlayer insulation film 15 via the insulation film 14.

Incidentally, the depth position of the bottom surface of the n⁻ type semiconductor region 11c can be set deeper than the depth position of the bottom surface of the n⁻ type semiconductor region 11d. The depth position of the bottom surface of the n⁺ type semiconductor region 12c can be set substantially equal to the depth position of the bottom surface of the n⁺ type semiconductor region 12d. At this step, in the high breakdown voltage MISFET QH, the depth position of the bottom surface of the n⁺ type semiconductor region 12c is shallower than the depth position of the bottom surface of the n⁻ type semiconductor region 11c. On the other hand, in the low breakdown voltage MISFET QL, the depth position of the bottom surface of the n⁺ type semiconductor region 12d is deeper than the depth position of the bottom surface of the n⁻ type semiconductor region 11d.

Also in the present Second Embodiment, the operation of the memory cell MC1 formed in the memory cell region 1A can be set equal to the operation of the memory cell MC1 formed in the memory cell region 1A in First Embodiment.

<Manufacturing Steps of Semiconductor Device>

Figure 23:
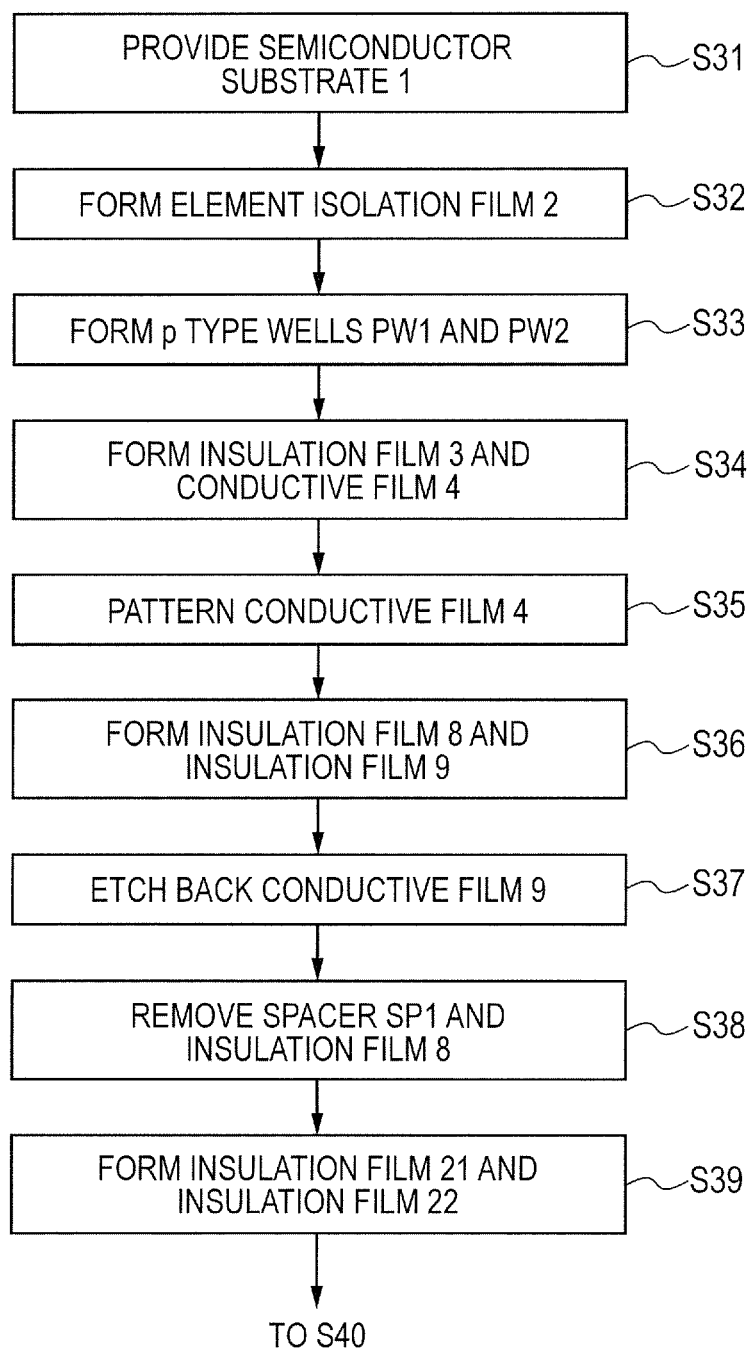
FIG. 23 is a process flowchart showing some of manufacturing steps of the semiconductor device of Second Embodiment.
Figure 24:
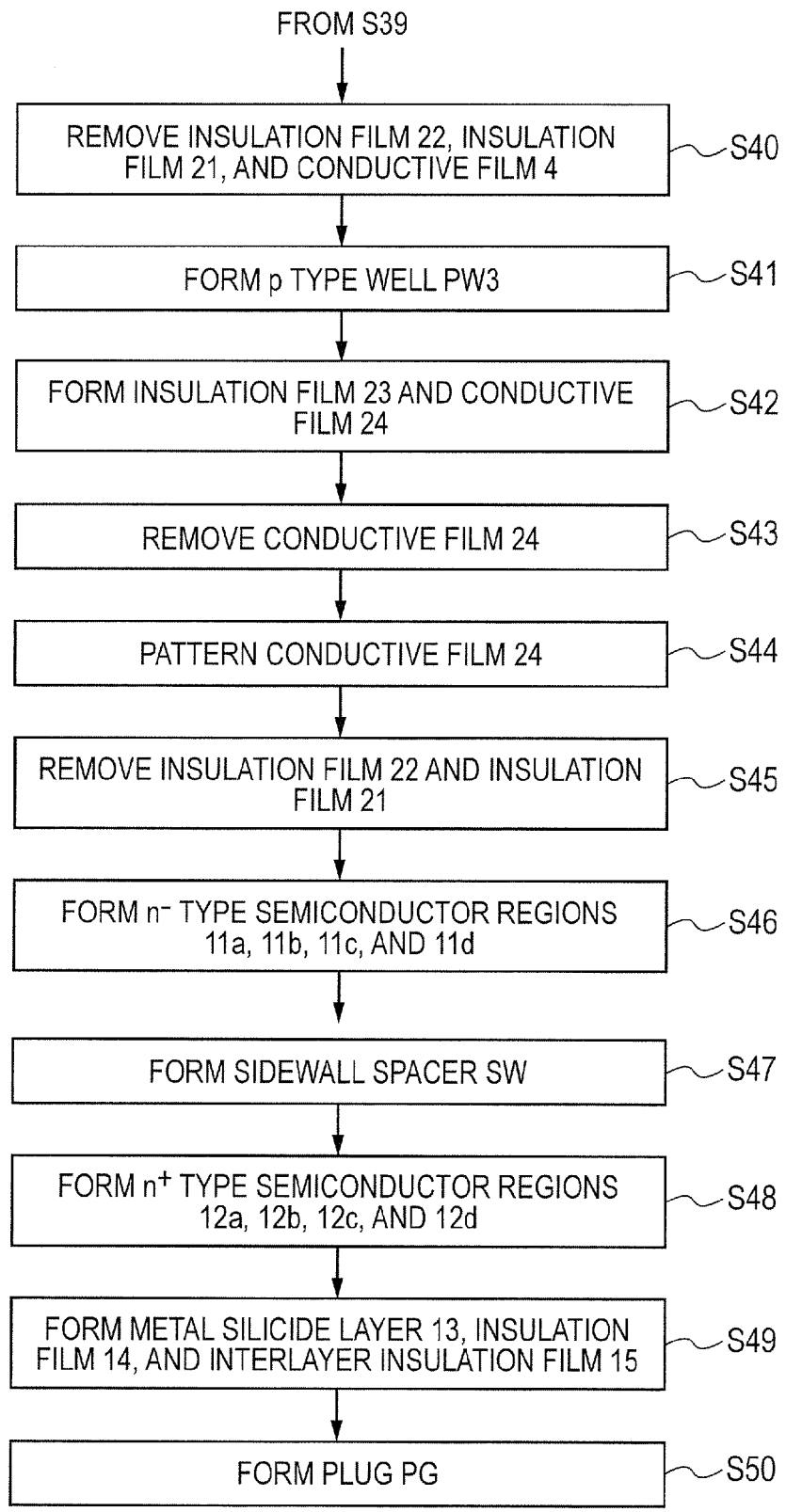
FIG. 24 is a process flowchart showing others of manufacturing steps of the semiconductor device of Second Embodiment.

FIGS. 23 and 24 are each a process flowchart showing some of the manufacturing steps of the semiconductor device of Second Embodiment. FIGS. 25 to 38 are each an essential part cross sectional view of the semiconductor device of Second Embodiment during a manufacturing step. In each cross sectional view of FIGS. 25 to 38, there is shown an essential part cross sectional view of the memory cell region 1A and the peripheral circuit regions 1B and 1C. Therein, there are shown the manners in which the memory cell MC1 is formed in the memory cell region 1A, the MISFET QH is formed in the peripheral circuit region 1B, and the MISFET QL is formed in the peripheral circuit region 1C.

Figure 25:
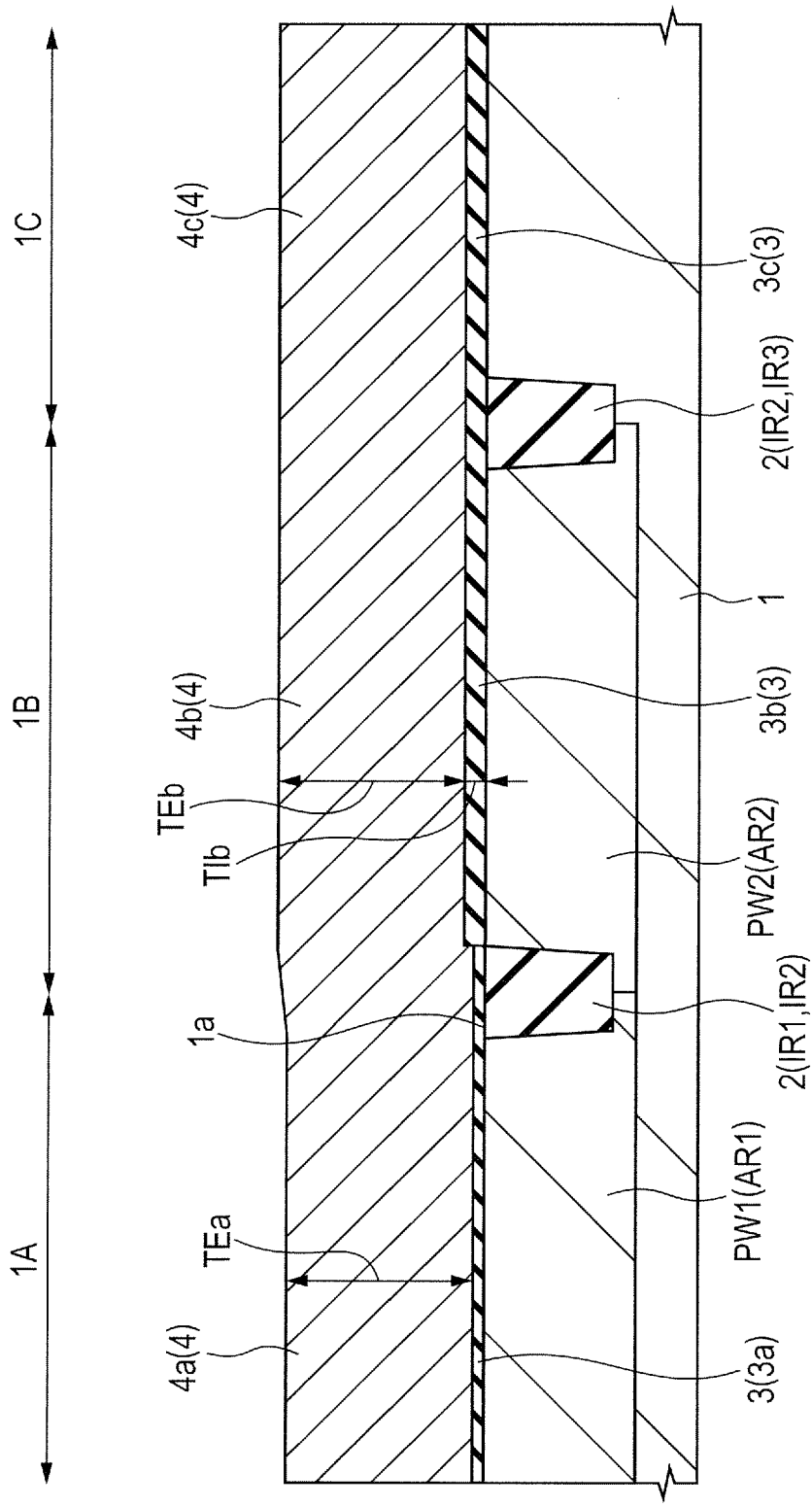
FIG. 25 is an essential part cross sectional view of the semiconductor device of Second Embodiment during a manufacturing step.

In the present Second Embodiment, in the same manner as in First Embodiment, after performing the same steps (Step S31 and Step S32 of FIG. 23) as Step S1 and Step S2 of FIG. 6, as shown in FIG. 25, in the memory cell region 1A, a p type well PW1 is formed in the active region AR1 (Step S33 of FIG. 23).

However, in the present Second Embodiment, as distinct from First Embodiment, when the p type well PW1 is formed, in the peripheral circuit region 1B, a p type well PW2 is formed in the active region AR2. The step of forming the p type well PW1 can be performed in the same manner as Step S3 of FIG. 4. The step of forming the p type well PW2 can be performed in the same manner as Step S13 of FIG. 5.

Preferably, the p type impurity concentration in the p type well PW2 is lower than the p type impurity concentration in a p type well PW3 (see FIG. 31 described later). As a result, the driving voltage of the high breakdown voltage MISFET QH (see FIG. 37 described later) can be set higher than the driving voltage of the low breakdown voltage MISFET QL (see FIG. 37 described later).

Then, as shown in FIG. 25, entirely over the main surface 1a of the semiconductor substrate 1, there are formed an insulation film 3 and a conductive film 4 (Step S34 of FIG. 23).

In Step S34, first, as shown in FIG. 25, in the memory cell region 1A, and the peripheral circuit regions 1B and 1C, over the main surface 1a of the semiconductor substrate 1, there is formed an insulation film 3. Of the insulation film 3, a portion formed in the memory cell region 1A is referred to as an insulation film 3a; a portion formed in the peripheral circuit region 1B is referred to as an insulation film 3b; and a portion formed in the peripheral circuit region 1C is referred to as an insulation film 3c. The insulation film 3b is formed at the same layer as the insulation film 3a, and the insulation film 3c is formed at the same layer as the insulation film 3a. The insulation film 3a is an insulation film for the gate insulation film GIt (see FIG. 26 described later) of the memory cell MC1 (see FIG. 37 described later). The insulation film 3b is an insulation film for the gate insulation film GIH (see FIG. 26 described later) of the MISFET QH (see FIG. 37 described later). Whereas, the insulation film 3a is formed over the p type well PW1, and the insulation film 3b is formed over the p type well PW2.

In the example shown in FIG. 25, the insulation film 3b is formed integrally with the insulation film 3a, and the insulation film 3c is formed integrally with the insulation film 3a. However, the insulation film 3b may be formed apart from the insulation film 3a, and the insulation film 3c may be formed apart from the insulation film 3a.

As in First Embodiment, as the insulation film 3, there can be used a silicon oxide film, a silicon nitride film, or a silicon oxynitride film, or a High-k film, namely, a high dielectric constant film. Examples of the material usable as the insulation film 3 are as described previously in First Embodiment. Further, the insulation film 3 can be formed using a thermal oxidation method, a sputtering method, an ALD method, a CVD method, or the like.

As described previously, the MISFET QH (see FIG. 37 described later) formed in the peripheral circuit region 1B is a high breakdown voltage MISFET. Accordingly, preferably, the film thickness TIb of the insulation film 3b for the gate insulation film GIH (see FIG. 26 described later) is larger than the film thickness TIc (see FIG. 32 described later) of the insulation film 23c for the gate insulation film GIL (see FIG. 34 described later). The insulation film 3b can be formed of a lamination film of an insulation film formed by oxidizing the top surface of the p type well PW2, and an insulation film formed by, for example, a CVD method. With such a method, the film thickness TIb of the insulation film 3b can be set larger than the film thickness TIc of the insulation film 23c.

Incidentally, in the example shown in FIG. 25, the film thickness of the insulation film 3c is equal to the film thickness TIb of the insulation film 3b. However, the film thickness of the insulation film 3c can be set smaller than the film thickness TIb of the insulation film 3b. Whereas, as shown in FIG. 25, the film thickness of the insulation film 3a can be set smaller than the film thickness TIb of the insulation film 3b.

In Step S34, then, as shown in FIG. 25, in the memory cell region 1A, and the peripheral circuit regions 1B and 1C, over the insulation film 3, there is formed a conductive film 4. Of the conductive film 4, a portion formed in the memory cell region 1A is referred to as a conductive film 4a; a portion formed in the peripheral circuit region 1B is referred to as a conductive film 4b; and a portion formed in the peripheral circuit region 1C is referred to as a conductive film 4c. The conductive film 4b is formed at the same layer as the conductive film 4a, and the conductive film 4c is formed at the same layer as the conductive film 4a. The conductive film 4a is a conductive film for the control gate electrode CG (see FIG. 26 described later) of the memory cell MC1 (see FIG. 37 described later). The conductive film 4b is a conductive film for the gate electrode GEH (see FIG. 26 described later) of the high breakdown voltage MISFET QH (see FIG. 37 described later).

In the example shown in FIG. 25, the conductive film 4b is formed integrally with the conductive film 4a, and the conductive film 4c is formed integrally with the conductive film 4a. However, the conductive film 4b may be formed apart from the conductive film 4a, and the conductive film 4c may be formed apart from the conductive film 4a.

The step of forming the conductive film 4 can be performed in the same manner as the step of forming the conductive film 4 in Step S4 of FIG. 4. Whereas, the film thickness TEb of the conductive film 4b can be set equal to the film thickness TEa of the conductive film 4a.

Figure 26:
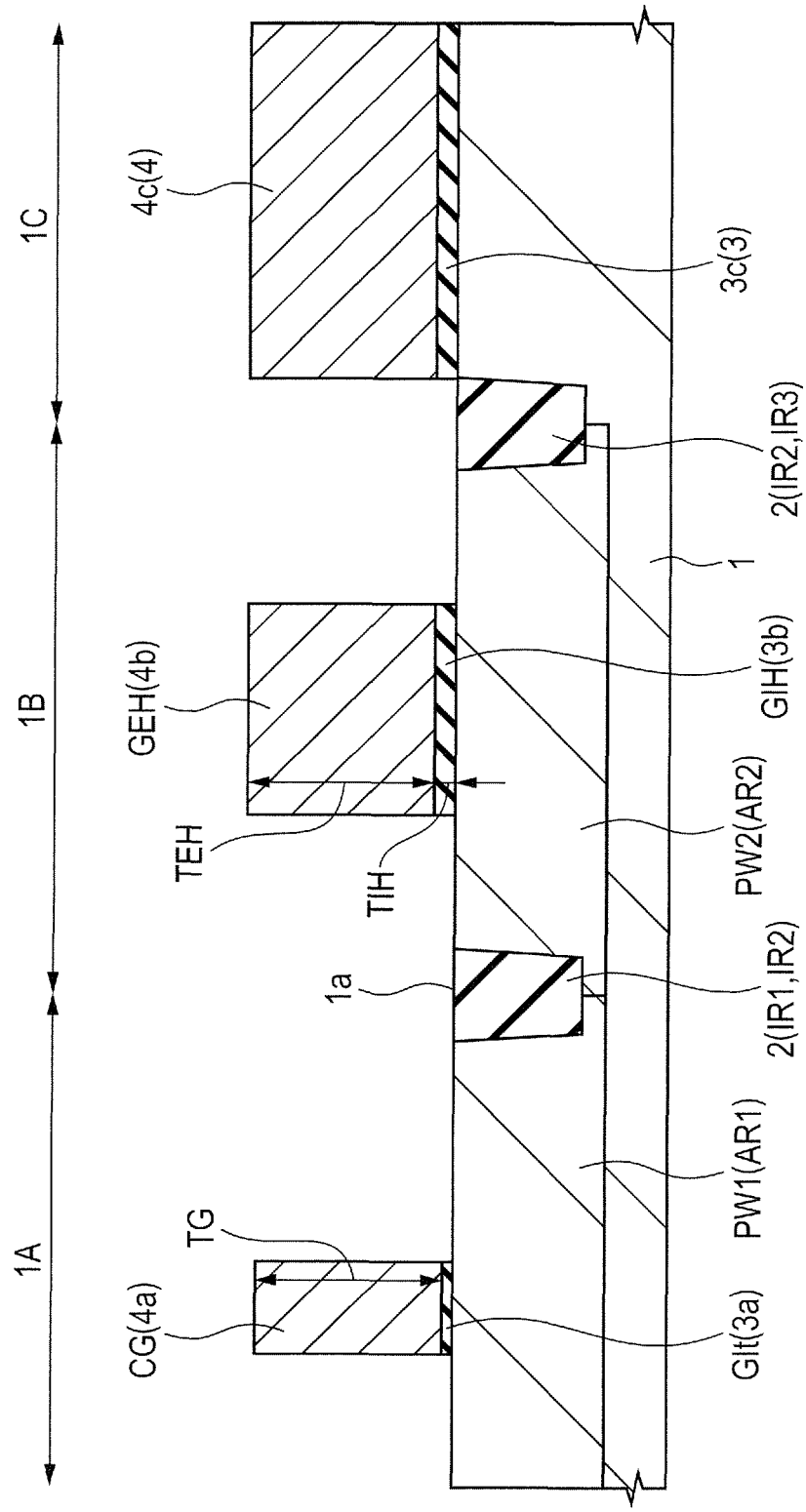
FIG. 26 is an essential part cross sectional view of the semiconductor device of Second Embodiment during a manufacturing step.

Then, as shown in FIG. 26, the conductive film 4 is patterned (Step S35 of FIG. 23). In the Step S35, using, for example, photolithography and etching, the conductive film 4 is patterned.

In the same manner as in the step of Step S6 of FIG. 4, using the resist pattern as an etching mask, the conductive film 4 is etched and patterned by, for example, dry etching. As a result, in the memory cell region 1A, there is formed the control electrode CG formed of the conductive film 4a, and there is formed the gate insulation film GIt formed of the insulation film 3a between the control gate electrode CG and the p type well PW1 of the semiconductor substrate 1. Namely, the control gate electrode CG is formed over the p type well PW1 of the semiconductor substrate 1 via the gate insulation film GIt in the memory cell region 1A.

Whereas, in the peripheral circuit region 1B, there is formed the gate electrode GEH formed of the conductive film 4b, and there is formed the gate insulation film GIH formed of the insulation film 3b between the gate electrode GEH and the p type well PW2 of the semiconductor substrate 1. On the other hand, in the peripheral circuit region 1C, the conductive film 4, namely, the conductive film 4c is left.

Incidentally, in the memory cell region 1A, the insulation film 3a at a portion thereof not covered with the control gate electrode CG can be removed by being subjected to dry etching of Step S35, or by being subjected to wet etching after dry etching of Step S35. Then, in a portion of the memory cell region 1A in which the control gate electrode CG is not formed, there is exposed the p type well PW1 of the semiconductor substrate 1.

Whereas, in the peripheral circuit region 1B, the insulation film 3b at a portion thereof not covered with the gate electrode GEH can be removed by being subjected to dry etching of Step S35, or by being subjected to wet etching after dry etching of Step S35. Then, at a portion of the peripheral circuit region 1B in which the gate electrode GEH is not formed, there is exposed the p type well PW2 of the semiconductor substrate 1.

Incidentally, although not shown, in Step S35, after forming the control gate electrode CG, using the control gate electrode CG as a mask, the p type well PW1 may be doped with an n type impurity by an ion implantation method.

As described previously, when the film thickness TEb (see FIG. 25) of the conductive film 4b is equal to the film thickness TEa (see FIG. 25) of the conductive film 4a, the film thickness TEH of the gate electrode GEH formed of the conductive film 4b is equal to the film thickness TG of the control gate electrode CG formed of the conductive film 4a. Further, the film thickness of the gate insulation film GIH formed of the insulation film 3b having the film thickness TIb is referred to as a film thickness TIH.

Incidentally, FIG. 26 shows an example in which with patterning of the conductive film 4a, the conductive film 4b is patterned, and with formation of the control gate electrode CG, the gate electrode GEH is formed. However, the conductive film 4a and the conductive film 4b may be patterned separately, and the control gate electrode CG and the gate electrode GEH may be formed separately.

Figure 27:
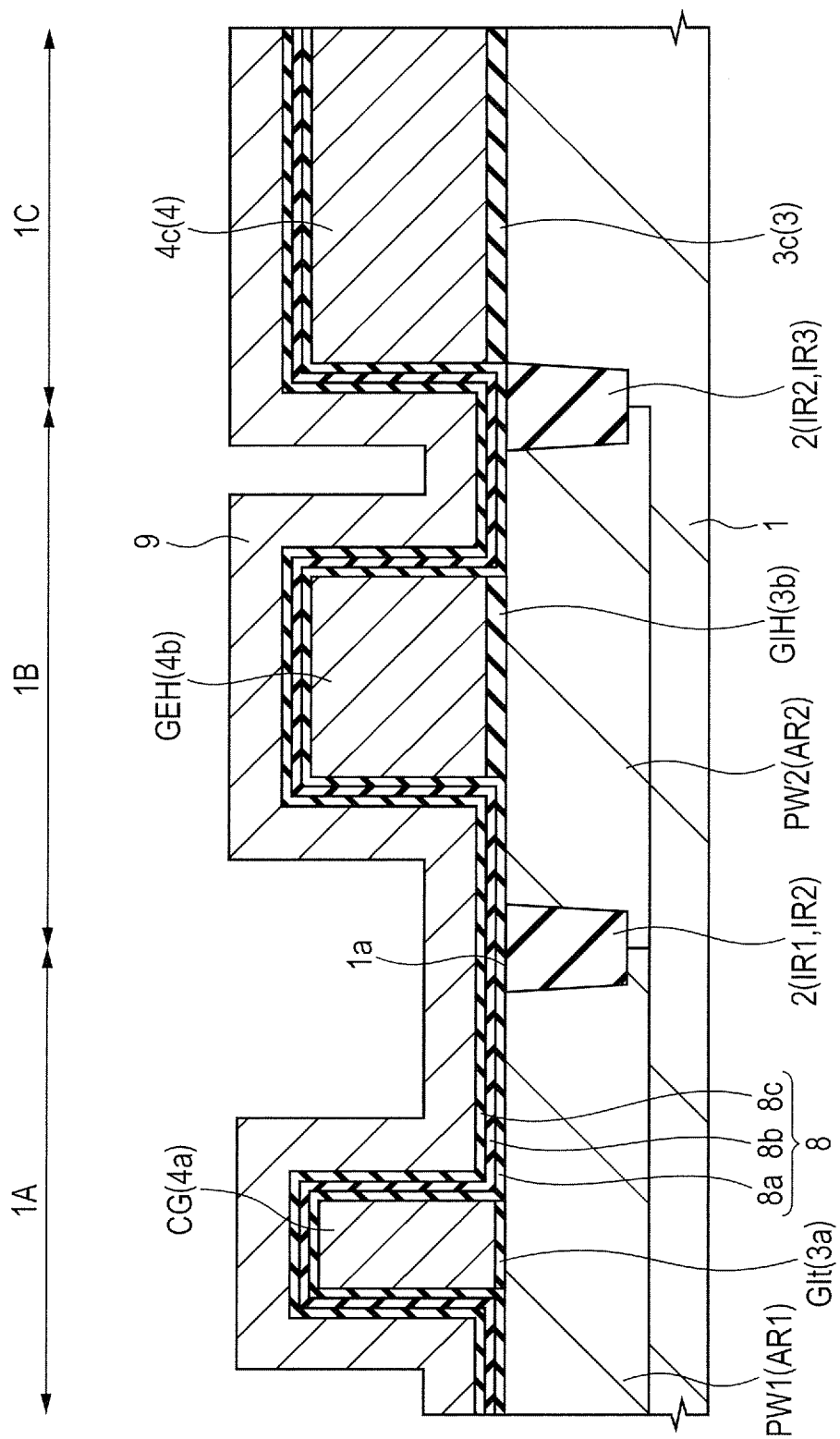
FIG. 27 is an essential part cross sectional view of the semiconductor device of Second Embodiment during a manufacturing step.

Then, as shown in FIG. 27, there are formed an insulation film 8 and a conductive film 9 (Step S36 of FIG. 23).

In Step S36, first, in the memory cell region 1A, and the peripheral circuit regions 1B and 1C, over the main surface 1a of the semiconductor substrate 1, there is formed the insulation film 8 for the gate insulation film GIm (see FIG. 29 described later) of the memory transistor MT (see FIG. 37 described later). The step of forming the insulation film 8 can be performed in the same manner as the step of forming the insulation film 8 in Step S8 of FIG. 4.

At this step, in the memory cell region 1A, at the exposed portions of the main surface 1a of the semiconductor substrate 1, and the top surface and the side surface of the control gate electrode CG, there is formed the insulation film 8. In the peripheral circuit region 1B, at the exposed portions of the main surface 1a of the semiconductor substrate 1, and the top surface and the side surface of the gate electrode GEH, there is formed the insulation film 8. Further, at the conductive film 4 at a portion thereof left in the peripheral circuit region 1C, namely, at the top surface and the side surface of the conductive film 4c, there is formed the insulation film 8. Namely, the insulation film 8 is formed in such a manner as to cover the main surface 1a of the semiconductor substrate 1, the surface of the control gate electrode CG, the surface of the gate electrode GEH, and the surface of the conductive film 4 at a portion thereof left in the peripheral circuit region 1C.

In Step S36, then, in the memory cell region 1A, and the peripheral circuit regions 1B and 1C, over the insulation film 8, there is formed the conductive film 9. The step of forming the conductive film 9 can be performed in the same manner as in the step of removing the conductive film 9 in Step S8 of FIG. 4.

Then, the same step as Step S9 of FIG. 4 is performed. Thus, as shown in FIG. 28, by an anisotropical etching technology, the conductive film 9 is etched back, thereby to form the memory gate electrode MG (Step S37 of FIG. 23).

Figure 28:
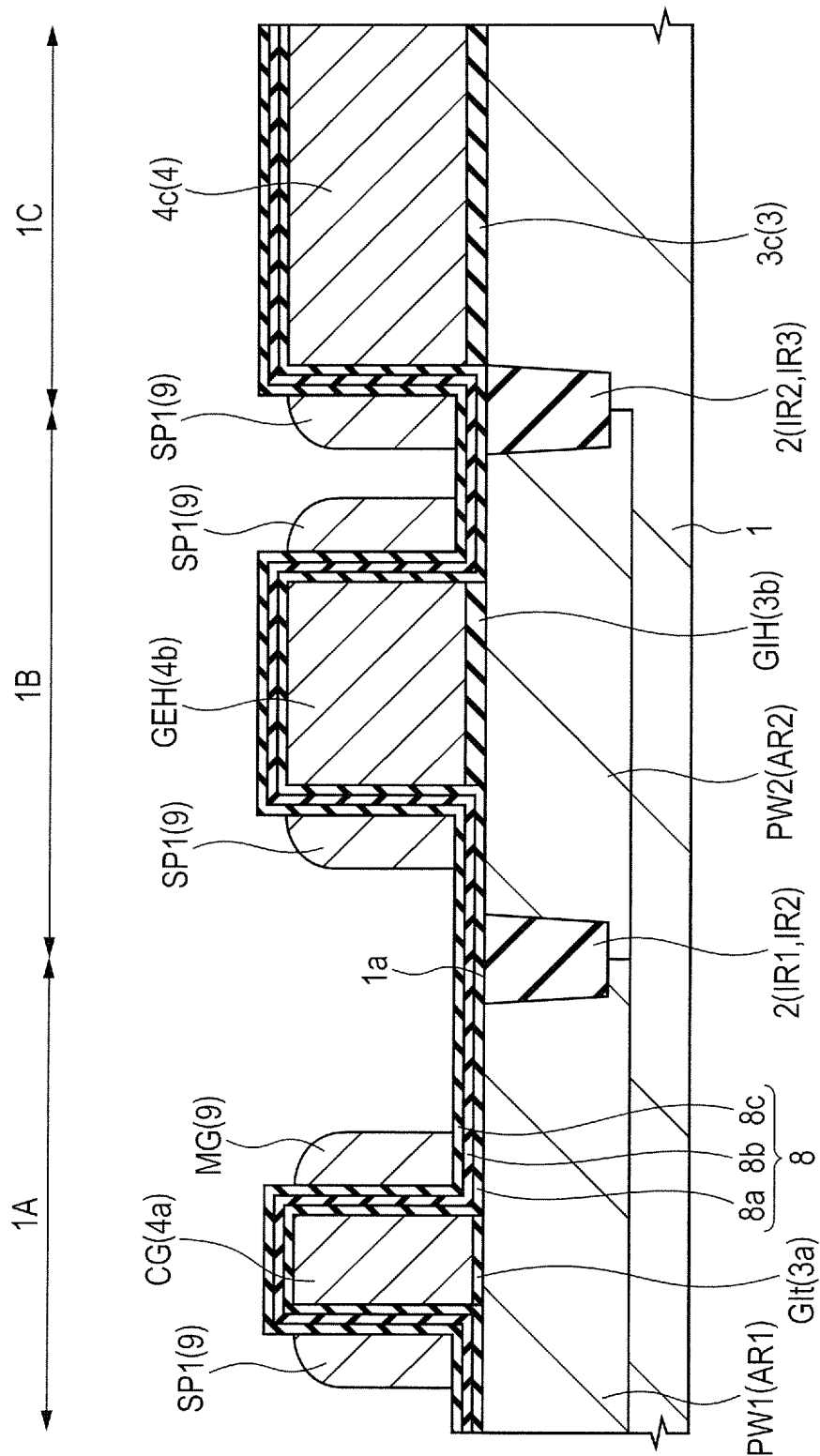
FIG. 28 is an essential part cross sectional view of the semiconductor device of Second Embodiment during a manufacturing step.

As a result, as shown in FIG. 28, in the memory cell region 1A, there is formed a memory gate electrode MG formed of the conductive film 9 left in a sidewall spacer shape via the insulation film 8 over the sidewall of the control gate electrode CG on a first side, namely, on the side on which the memory gate electrode MG adjacent to the control gate electrode CG is arranged, of the sidewalls on the opposite sides of the control gate electrode CG. Whereas, there is formed a spacer SP1 formed of the conductive film 9 left in a sidewall spacer shape via the insulation film 8 over the sidewall of the control gate electrode CG opposite to the first side, namely, opposite to the side on which the memory gate electrode MG adjacent to the control gate electrode CG is arranged, of the sidewalls on the opposite sides of the control gate electrode CG.

Incidentally, also over the sidewall of the gate electrode GEH, there is formed a spacer SP1 formed of the conductive film 9 left in a sidewall spacer shape via the insulation film 8. Whereas, also over the side surface of the conductive film 4 at a portion thereof left in the peripheral circuit region 1C, namely, the conductive film 4c, there is formed a spacer SP1 formed of the conductive film 9 left in a sidewall spacer shape via the insulation film 8.

Figure 29:
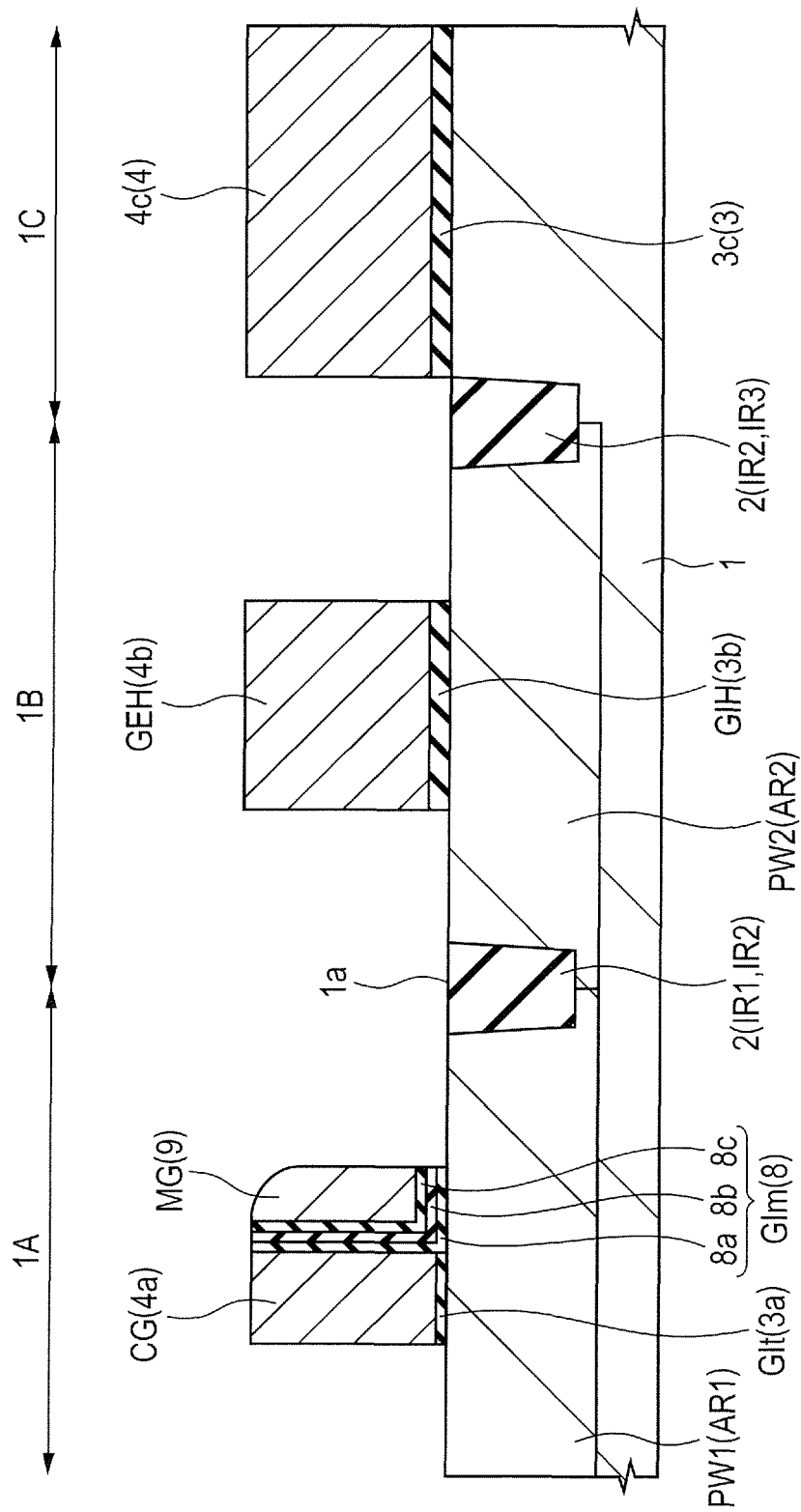
FIG. 29 is an essential part cross sectional view of the semiconductor device of Second Embodiment during a manufacturing step.

Then, the same step as Step S10 of FIG. 4 is performed, thereby to remove the spacer SP1 and the insulation film 8 as shown in FIG. 29 (Step S38 of FIG. 23). At this step, in the memory cell region 1A, there is formed the gate insulation film GIm formed of the insulation film 8 at a portion thereof left between the memory gate electrode MG and the p type well PW1, and at a portion thereof left between the memory gate electrode MG and the control gate electrode CG.

Figure 30:
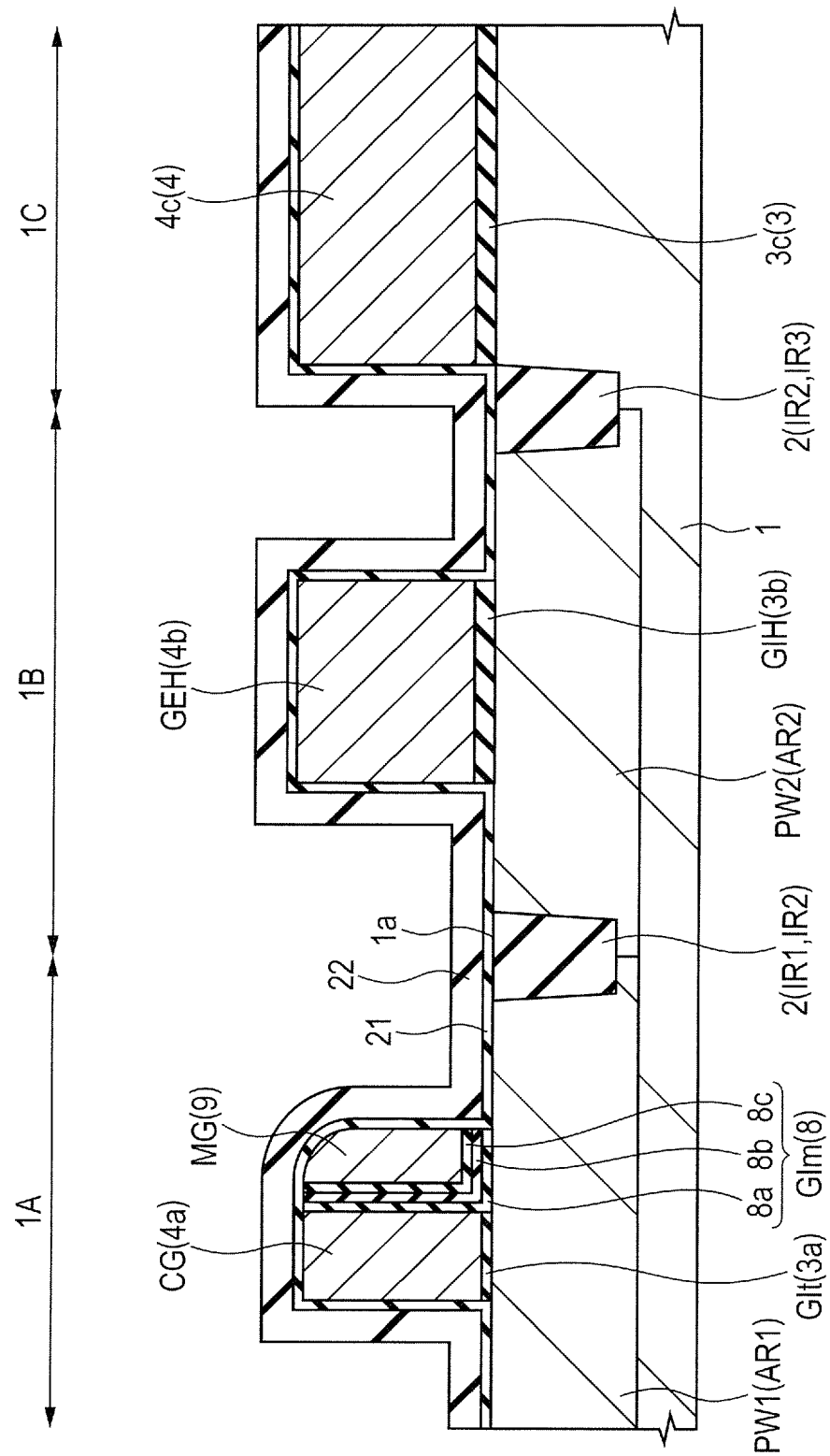
FIG. 30 is an essential part cross sectional view of the semiconductor device of Second Embodiment during a manufacturing step.

Then, as shown in FIG. 30, there are formed an insulation film 21 and an insulation film 22 (Step S39 of FIG. 23).

In Step S39, first, in the memory cell region 1A, and the peripheral circuit regions 1B and 1C, over the main surface 1a of the semiconductor substrate 1, there is formed the insulation film 21. The step of forming the insulation film 21 can be performed in the same manner as the step of forming the insulation film 21 in Step S11 of FIG. 4.

At this step, the insulation film 21 is formed in such a manner as to cover the exposed portions of the main surface 1a of the semiconductor substrate 1, the control gate electrode CG, and the memory gate electrode MG in the memory cell region 1A, and to cover the exposed portions of the main surface 1a of the semiconductor substrate 1, and the gate electrode GEH in the peripheral circuit region 1B. Further, the insulation film 21 is formed in such a manner as to cover the conductive film 4 at a portion thereof left in the peripheral circuit region 1C, namely, the conductive film 4c.

In Step S39, then, in the memory cell region 1A, and the peripheral circuit regions 1B and 1C, over the insulation film 21, there is formed the insulation film 22. The step of forming the insulation film 22 can be performed in the same manner as the step of forming the insulation film 22 in Step S11 of FIG. 4.

Then, the same step as Step S12 of FIG. 5 is performed. As a result, as shown in FIG. 31, in the peripheral circuit region 1C, there are removed the insulation film 22, the insulation film 21, and the conductive film 4 (Step S40 of FIG. 24).

Also in the present Second Embodiment, as in First Embodiment, Step S39 and Step S40 are performed, thereby to leave the insulation film 21 and the insulation film 22 in the memory cell region 1A. As a result, it is possible to prevent or inhibit the following: in the steps (Step S41 to Step S44) subsequent to Step S40, for example, when the insulation film 23 is formed, or the like, the upper layer part of the p type well PW1 situated at a portion thereof adjacent to the control gate electrode CG or the memory gate electrode MG is oxidized, resulting in the formation of a gate bird's beak.

Alternatively, it is possible to prevent or inhibit the following: in the steps (Step S41 to Step S44) subsequent to Step S40, for example, when the insulation film 23 is formed, or the like, the surface of the control gate electrode CG or the memory gate electrode MG is oxidized, resulting in, for example, a variation in gate length. Therefore, it is possible to prevent or inhibit the deterioration of the characteristics of a nonvolatile memory. This can improve the performances of a semiconductor device having a nonvolatile memory.

Further, in the present Second Embodiment, Step S39 and Step S40 are performed, thereby to leave the insulation film 21 and the insulation film 22 in the peripheral circuit region 1B. As a result, it is possible to prevent or inhibit the following: in the steps (Step S41 to Step S44) subsequent to Step S40, for example, when the insulation film 23 is formed, or the like, the upper layer part of the p type well PW2 situated at a portion thereof adjacent to the gate electrode GEH is oxidized, resulting in the formation of a gate bird's beak.

In First Embodiment, as shown in FIG. 14, after forming the control gate electrode CG and the memory gate electrode MG, the insulation film 23b for the gate insulation film GIH was formed. Further, the film thickness TIb of the insulation film 23b for the gate insulation film GIH is larger than the film thickness TIc of the insulation film 23c for the gate insulation film GIL. Therefore, in First Embodiment, when the insulation film 23b for the gate insulation film GIH is formed, the upper layer part of the p type well PW1 situated at a portion thereof adjacent to the control gate electrode CG or the memory gate electrode MG may be oxidized, resulting in the formation of a gate bird's beak. Alternatively, when the insulation film 23b for the gate insulation film GIH is formed, the surface of the control gate electrode CG or the memory gate electrode MG may be oxidized, resulting in, for example, a variation in gate length.

On the other hand, in the present Second Embodiment, after forming the insulation film 3b for the gate insulation film GIH, the control gate electrode CG and the memory gate electrode MG are formed. Therefore, it is possible to prevent or inhibit the following: when the insulation film 3b for the gate insulation film GIH is formed, the surface of the control gate electrode CG or the memory gate electrode MG is oxidized, resulting in, for example, a variation in gate length. Therefore, it is possible to prevent or inhibit the deterioration of the characteristics of the nonvolatile memory. This can improve the performances of a semiconductor device having a nonvolatile memory.

Incidentally, the step of removing the conductive film 4c in Step S40 can be performed at any time, for example, after Step S35, and before Step S40. However, the conductive film 4c is removed at Step S40, namely, immediately before Step S41 described later. As a result, it is possible to protect the main surface 1a of the semiconductor substrate 1 at a portion thereof in which the p type well PW3 (see FIG. 31 described later) is formed.

Figure 31:
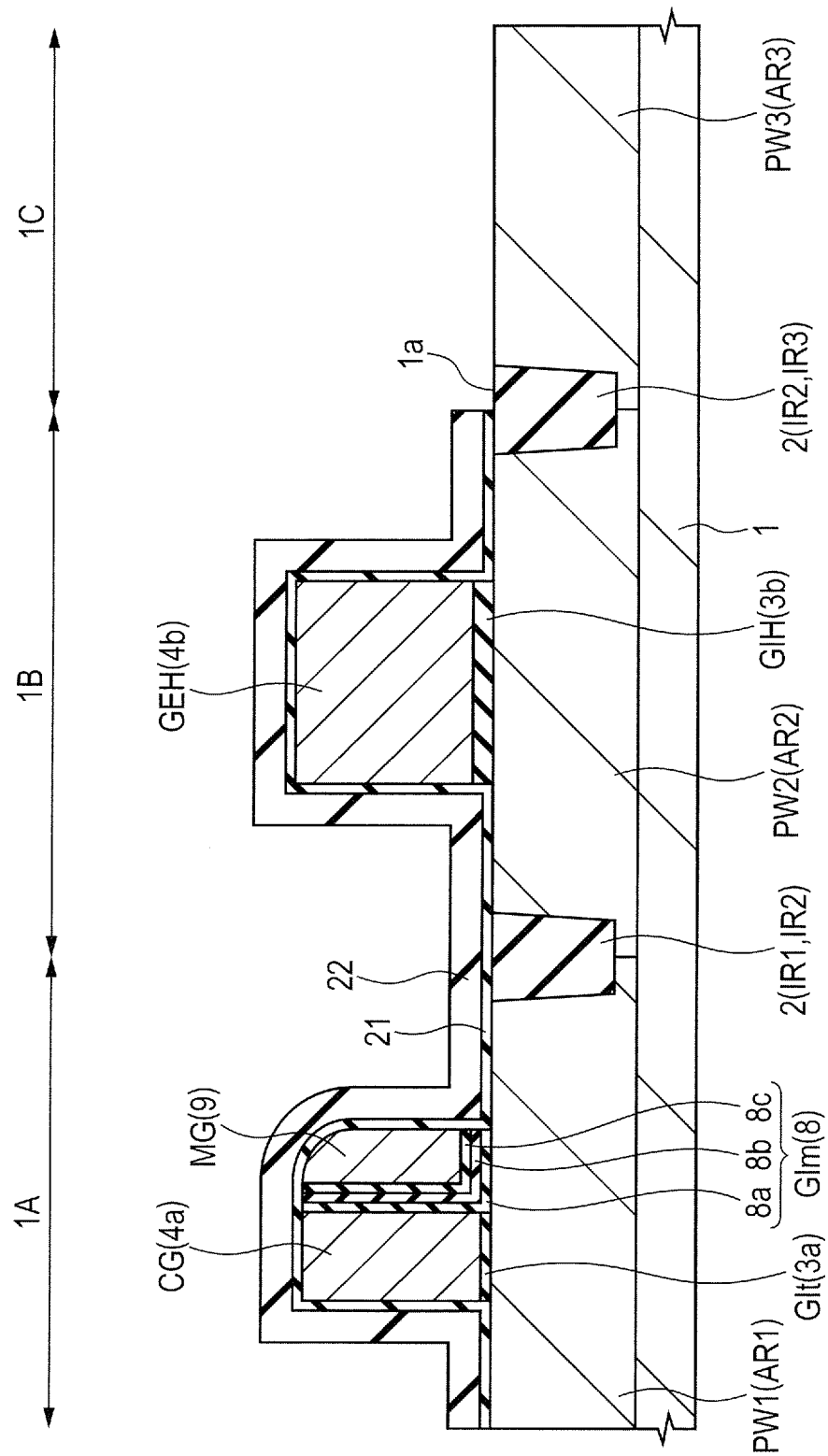
FIG. 31 is an essential part cross sectional view of the semiconductor device of Second Embodiment during a manufacturing step.

Then, as shown in FIG. 31, in the peripheral circuit region 1C, the p type well PW3 is formed in the active region AR3 (Step S41 of FIG. 24). The p type well PW3 can be formed in the same manner as with the p type well PW1 and the p type well PW2, by doping a p type impurity such as boron (B) into the semiconductor substrate 1 by an ion implantation method, or the like. The p type well PW3 is formed to a prescribed depth from the main surface 1a of the semiconductor substrate 1.

As described previously, preferably, the p type impurity concentration in the p type well PW3 is higher than the p type impurity concentration in the p type well PW2. As a result, the driving voltage of the high breakdown voltage MISFET QH (see FIG. 37 described later) can be set higher than the driving voltage of the low breakdown voltage MISFET QL (see FIG. 37 described later).

Then, for example, by wet etching using a hydrofluoric acid (HF) aqueous solution, the natural oxide film at the surface of the semiconductor substrate 1 is removed. Thus, the surface of the semiconductor substrate 1 is cleaned, and thereby the surface of the semiconductor substrate 1 is purified. As a result, in the peripheral circuit region 1C, the surface of the semiconductor substrate 1, namely, the surface of the p type well PW3 is exposed.

Figure 32:
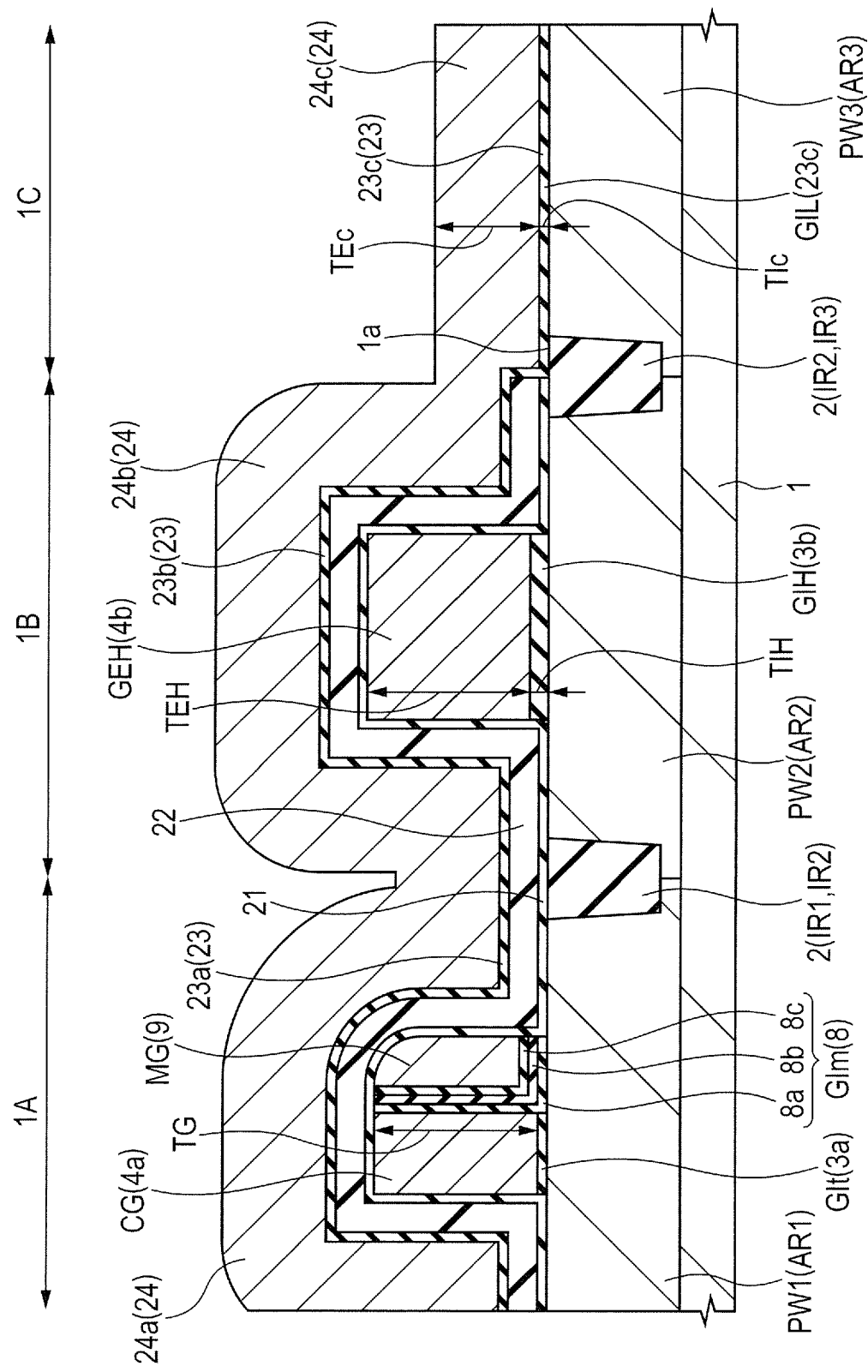
FIG. 32 is an essential part cross sectional view of the semiconductor device of Second Embodiment during a manufacturing step.

Then, as shown in FIG. 32, entirely over the main surface 1a of the semiconductor substrate 1, there are formed an insulation film 23 and a conductive film 24 (Step S42 of FIG. 24).

In Step S42, first, as shown in FIG. 32, in the memory cell region 1A, and the peripheral circuit regions 1B and 1C, the insulation film 23 is formed over the main surface 1a of the semiconductor substrate 1. Of the insulation film 23, a portion formed in the memory cell region 1A is referred to as an insulation film 23a; a portion formed in the peripheral circuit region 1B is referred to as an insulation film 23b; and a portion formed in the peripheral circuit region 1C is referred to as an insulation film 23c. The insulation film 23b is formed at the same layer as the insulation film 23a, and the insulation film 23c is formed at the same layer as the insulation film 23a. The insulation film 23c is an insulation film for a gate insulation film GIL (see FIG. 34 described later) of a MISFET QL (see FIG. 37 described later). Further, the insulation film 23c is formed over the p type well PW3.

In the example shown in FIG. 32, the insulation film 23b is formed integrally with the insulation film 23a. The insulation film 23c is formed integrally with the insulation film 23a. However, the insulation film 23b may be formed apart from the insulation film 23a. The insulation film 23c may be formed apart from the insulation film 23a.

The step of forming the insulation film 23 can be performed in the same manner as the step of forming the insulation film 23 in Step S14 of FIG. 5.

As described previously, the MISFET QH (see FIG. 37 described later) formed in the peripheral circuit region 1B is a high breakdown voltage MISFET. The MISFET QL (see FIG. 37 described later) formed in the peripheral circuit region 1C is a low breakdown voltage MISFET. Accordingly, preferably, the film thickness TIc of the insulation film 23c for the gate insulation film GIL (see FIG. 34 described later) is smaller than the film thickness TIH of the gate insulation film GIH.

In Step S42, then, as shown in FIG. 32, in the memory cell region 1A, and the peripheral circuit regions 1B and 1C, a conductive film 24 is formed over the insulation film 23. Of the conductive film 24, a portion formed in the memory cell region 1A is referred to as a conductive film 24a; a portion formed in the peripheral circuit region 1B is referred to as a conductive film 24b; and a portion formed in the peripheral circuit region 1C is referred to as a conductive film 24c. The conductive film 24b is formed at the same layer as the conductive film 24a, and the conductive film 24c is formed at the same layer as the conductive film 24a. The conductive film 24c is a conductive film for the gate electrode GEL (see FIG. 34 described later) of the MISFET QL (see FIG. 37 described later).

In the example shown in FIG. 32, the conductive film 24b is formed integrally with the conductive film 24a, and the conductive film 24c is formed integrally with the conductive film 24a. However, the conductive film 24b may be formed apart from the conductive film 24a, and the conductive film 24c may be formed apart from the conductive film 24a.

The step of forming the conductive film 24 can be performed in the same manner as the step of forming the conductive film 24 in Step S14 of FIG. 5.

The film thickness TEc of the conductive film 24c can be set smaller the film thickness TEH of the gate electrode GEH. As a result, even when the gate length of the low breakdown voltage MISFET QL (see FIG. 37 described later) is smaller than the gate length of the high breakdown voltage MISFET QH (see FIG. 37 described later), the gate electrode GEL can be formed with precision in shape. Alternatively, even when, in the peripheral circuit region 1C, the distance between the adjacent two gate electrodes GEL is relatively smaller, in Step S49 described later, the space between the adjacent two gate electrodes GEL can be readily filled with the interlayer insulation film 15 via the insulation film 14.

Figure 33:
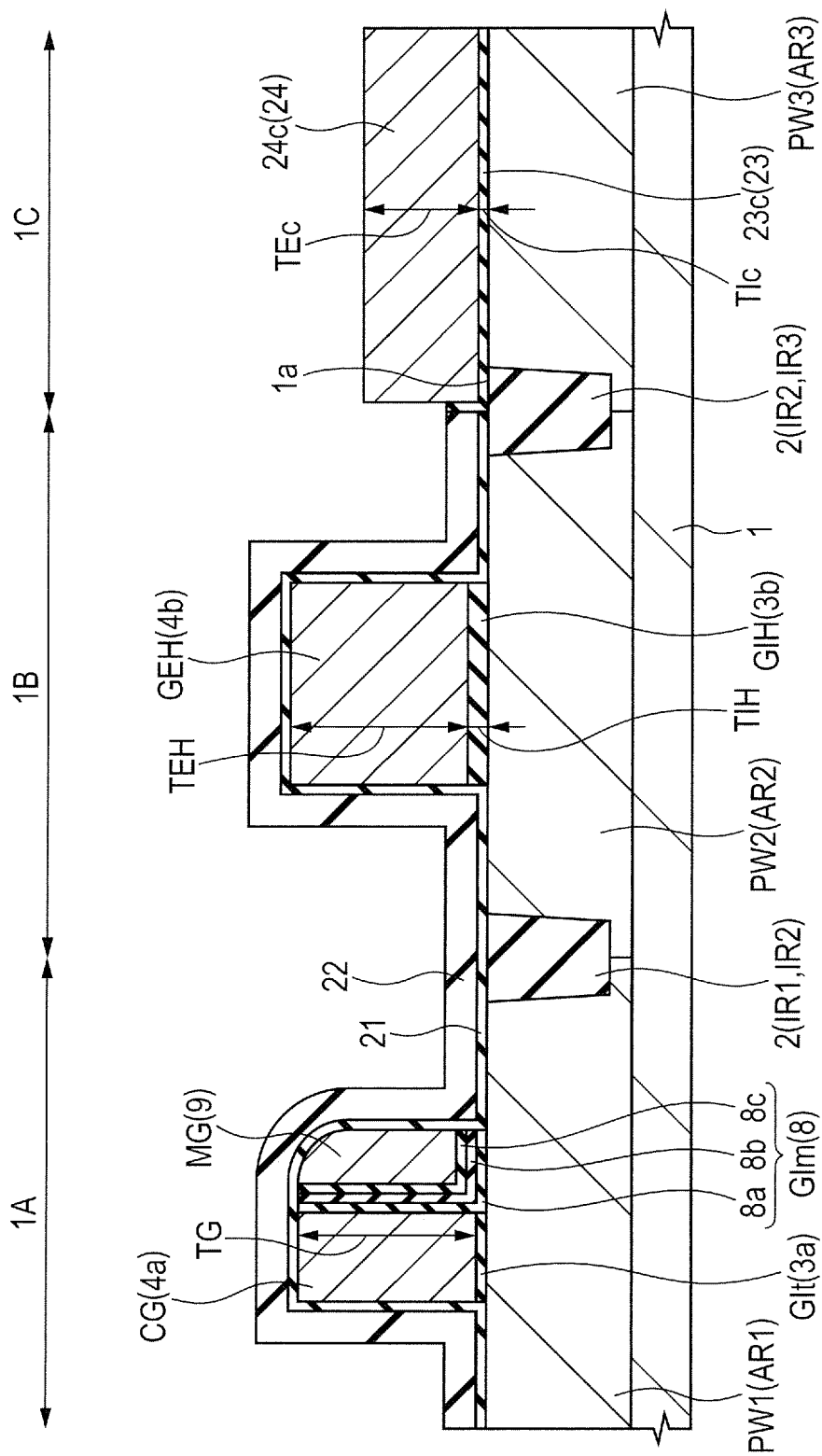
FIG. 33 is an essential part cross sectional view of the semiconductor device of Second Embodiment during a manufacturing step.

Then, as shown in FIG. 33, in the memory cell region 1A and the peripheral circuit region 1B, there is removed the conductive film 24 (Step S43 of FIG. 5).

In Step S43, first, in the memory cell region 1A, and the peripheral circuit regions 1B and 1C, a resist film (not shown) is formed in such a manner as to cover the conductive film 24. Then, the resist film is subjected to pattern exposure, followed by development. As a result, the resist film is patterned. Thus, the resist film is removed in the memory cell region 1A and the peripheral circuit region 1B, and the resist film is left in the peripheral circuit region 1C. This results in the formation of a resist pattern formed of the resist film at a portion thereof left in the peripheral circuit region 1C.

Then, using the resist pattern as an etching mask, the insulation film 24 is etched and removed by, for example, dry etching. As a result, as shown in FIG. 33, the conductive film 24 at a portion thereof arranged in the memory cell region 1A, namely, the conductive film 24a, and the conductive film 24 at a portion thereof arranged in the peripheral circuit region 1B, namely, the conductive film 24b can be removed. Incidentally, in the memory cell region 1A and the peripheral circuit region 1B, when the conductive film 24 is removed, the insulation film 23 may be removed together with the conductive film 24.

Figure 34:
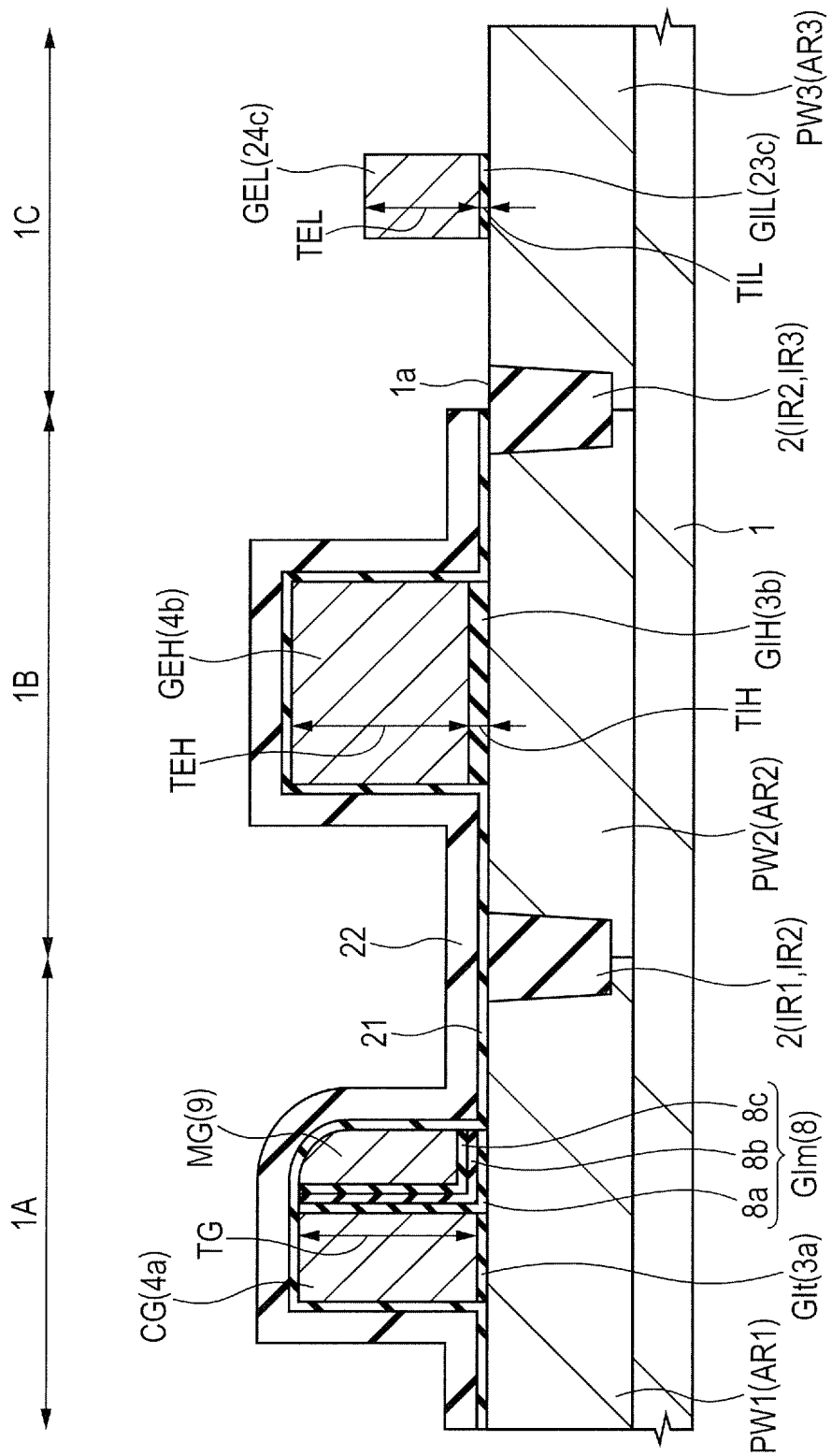
FIG. 34 is an essential part cross sectional view of the semiconductor device of Second Embodiment during a manufacturing step.

Then, as shown in FIG. 34, in the peripheral circuit region 1C, the conductive film 24 is patterned (Step S44 of FIG. 24). In the Step S44, using, for example, photolithography and etching, the conductive film 24 at a portion thereof left in the peripheral circuit region 1C, namely, the conductive film 24c is patterned.

In the same manner as in the step of Step S16 of FIG. 5, using the resist pattern as an etching mask, the conductive film 24c is etched and patterned by, for example, dry etching. As a result, in the peripheral circuit region 1C, there is formed the gate electrode GEL formed of the conductive film 24c, and there is formed the gate insulation film GIL formed of the insulation film 23c between the gate electrode GEL and the p type well PW3 of the semiconductor substrate 1. Namely, the gate electrode GEL is formed over the p type well PW3 of the semiconductor substrate 1 via the gate insulation film GIL in the peripheral circuit region 1C.

On the other hand, in the memory cell region 1A and the peripheral circuit region 1B, the memory gate electrode MG and the control gate electrode CG are covered with a resist pattern. Accordingly, the memory gate electrode MG and the control gate electrode CG are not etched.

Incidentally, in the peripheral circuit region 1C, the insulation film 23c at a portion thereof not covered with the gate electrode GEL can be removed by being subjected to dry etching of Step S44, or by being subjected to wet etching after drying etching of Step S44.

As described previously, when the film thickness TIc (see FIG. 32) of the insulation film 23c is smaller than the film thickness TIH of the gate insulation film GIH, the film thickness TIL of the gate insulation film GIL formed of the insulation film 23c is smaller than the film thickness TIH of the gate insulation film GIH. As a result, the gate insulation film GIH can be allowed to serve as the gate insulation film of the high breakdown voltage MISFET QH (see FIG. 37 described later), and the gate insulation film GIL can be allowed to serve as the gate insulation film of the low breakdown voltage MISFET QL (see FIG. 37 described later).

Further, as described previously, the film thickness TEc (see FIG. 32) of the conductive film 24c can be set smaller than the film thickness TEH of the gate electrode GEH; and the film thickness TEc of the conductive film 24c can be set smaller than the film thickness TG of the control gate electrode CG. Therefore, the film thickness TEL of the gate electrode GEL formed of the conductive film 24c can be set smaller than the film thickness TEH of the gate electrode GEH; and the film thickness TEL of the gate electrode GEL formed of the conductive film 24c can be set smaller than the film thickness TG of the control gate electrode CG.

Figure 35:
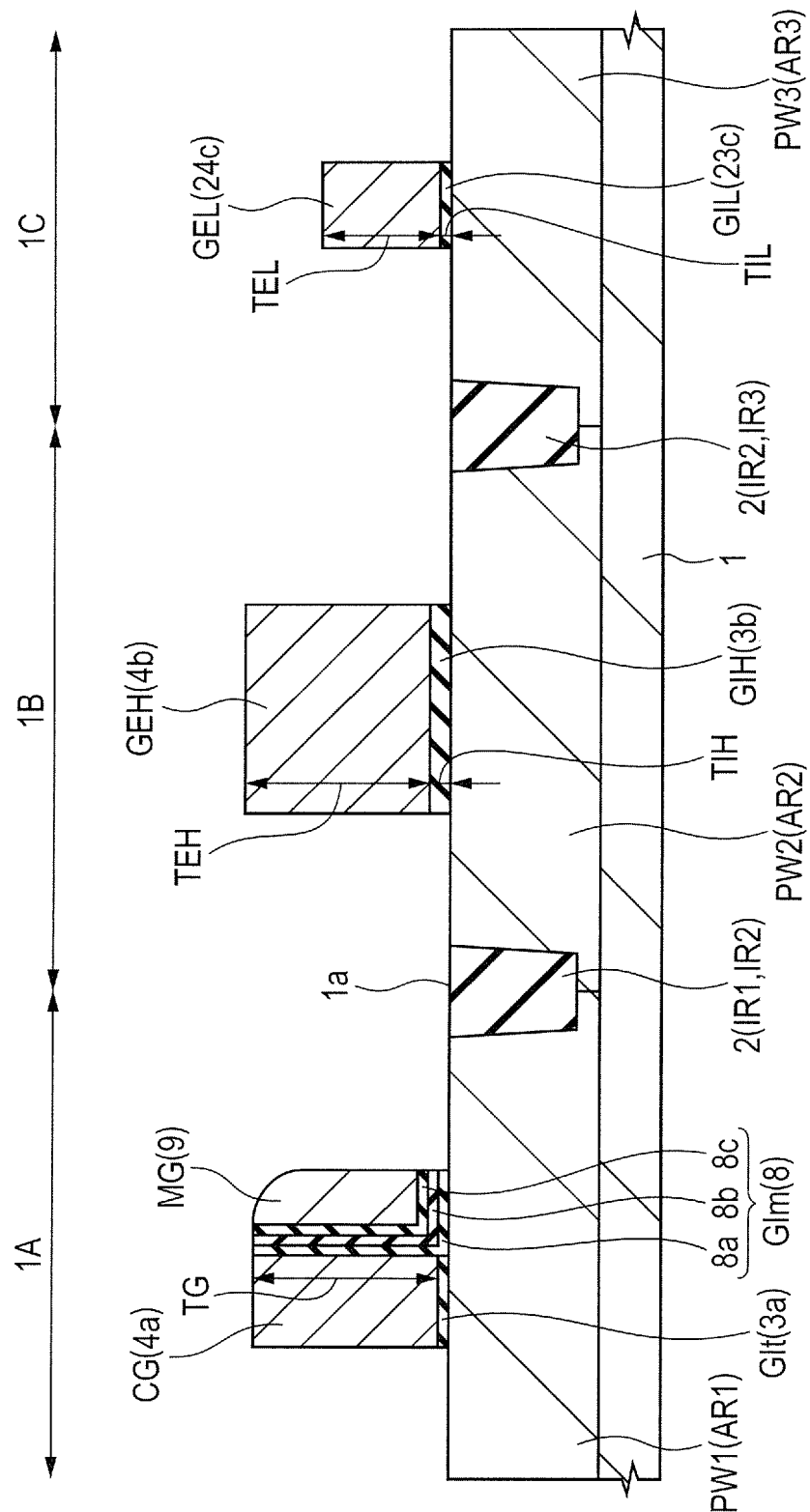
FIG. 35 is an essential part cross sectional view of the semiconductor device of Second Embodiment during a manufacturing step.

Then, as shown in FIG. 35, there are removed the insulation film 22 and the insulation film 21 (Step S45 of FIG. 24).

In the same manner as in Step S17 of FIG. 5, using the resist pattern as an etching mask, the insulation film 22 and the insulation film 21 are etched and removed by, for example, dry etching. As a result, as shown in FIG. 35, it is possible to fully remove the insulation film 22 at a portion thereof left in the memory cell region 1A and the peripheral circuit region 1B, and the insulation film 21 at a portion thereof left in the memory cell region 1A and the peripheral circuit region 1B.

Figure 36:
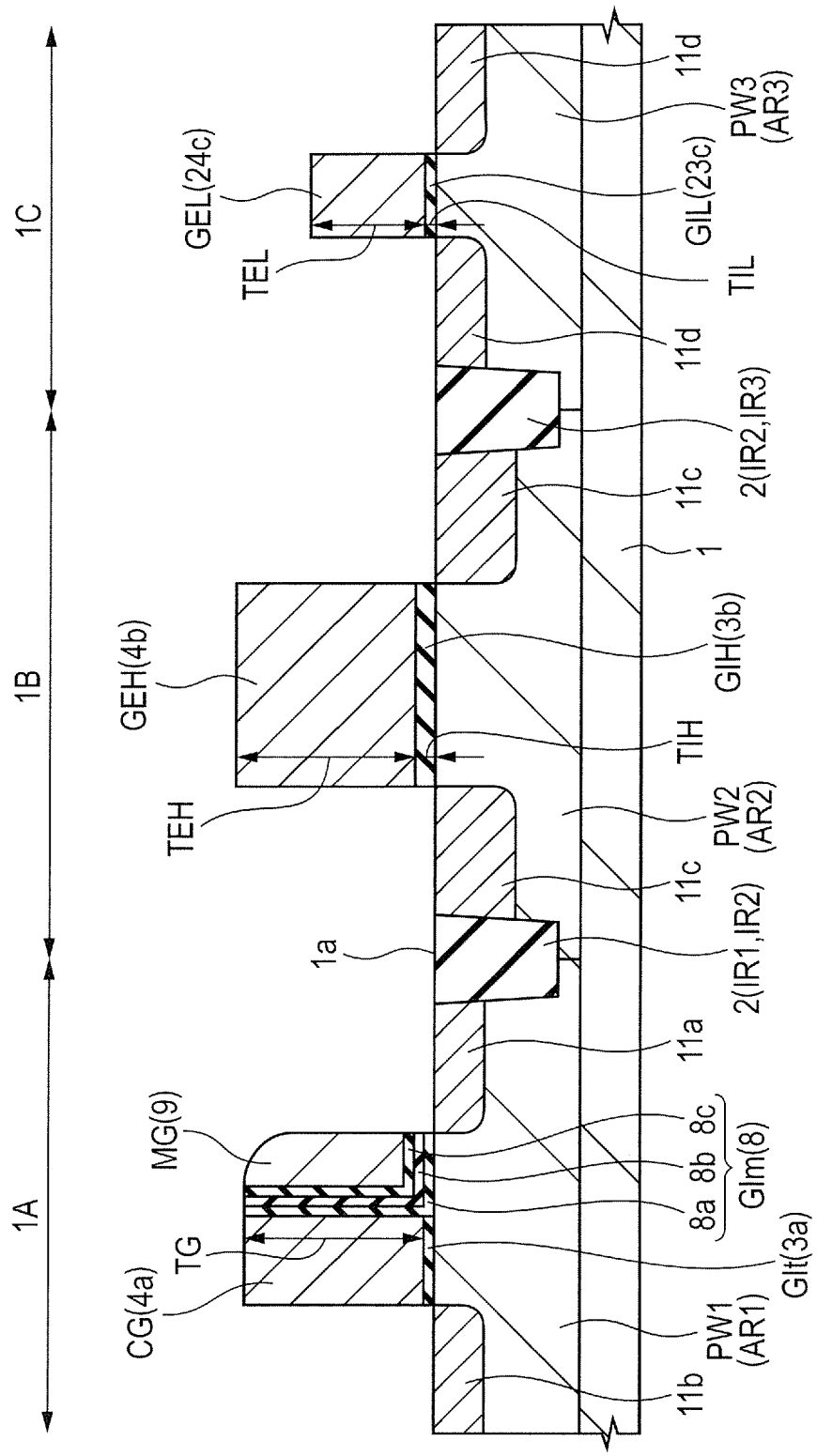
FIG. 36 is an essential part cross sectional view of the semiconductor device of Second Embodiment during a manufacturing step.

Then, the same step as Step S18 of FIG. 5 is performed. As a result, as shown in FIG. 36, the n⁻ type semiconductor regions 11a, 11b, 11c, and 11d are formed using an ion implantation method, or the like (Step S46 of FIG. 24).

In the present Second Embodiment, the film thickness TEH of the gate electrode GEH is larger than the film thickness TEL of the gate electrode GEL. Accordingly, the injection energy for performing ion implantation using the gate electrode GEH as a mask can be set larger than the injection energy for performing ion implantation using the gate electrode GEL as a mask. Therefore, the depth position of the bottom surface of the n⁻ type semiconductor region 11c can be readily set deeper than the depth position of the bottom surface of the n⁻ type semiconductor region 11d.

Then, the same step as Step S19 of FIG. 5 is performed. As a result, as shown in FIG. 37, sidewall spacers SW are formed over the sidewall of the control gate electrode CG, over the sidewall of the memory gate electrode MG, over the sidewalls of the gate electrode GEH, and over the sidewalls of the gate electrode GEL (Step S47 of FIG. 24).

Then, the same step as Step S20 of FIG. 5 is performed. As a result, as shown in FIG. 37, the n$^+$ type semiconductor regions 12a, 12b, 12c, and 12d are formed using an ion implantation method, or the like (Step S48 of FIG. 24).

Figure 37:
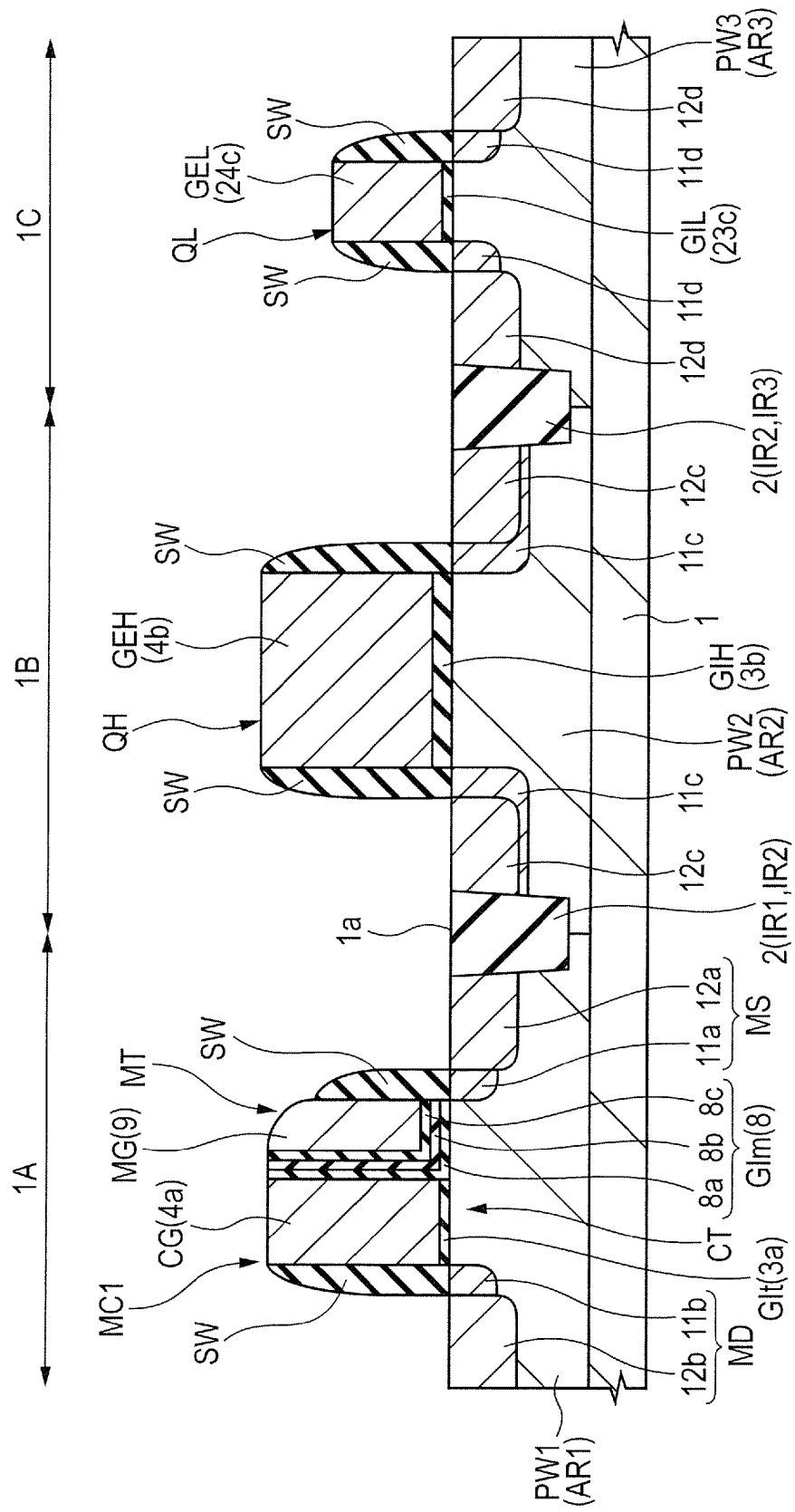
FIG. 37 is an essential part cross sectional view of the semiconductor device of Second Embodiment during a manufacturing step.

As a result, as shown in FIG. 37, a control transistor CT and a memory transistor MT are formed in the memory cell region 1A. The control transistor CT and the memory transistor MT form a memory cell MC1 as a nonvolatile memory. Namely, the control gate electrode CG, the gate insulation film GIt, the memory gate electrode MG, and the gate insulation film GIm form the memory cell MC1 as a nonvolatile memory.

Further, as shown in FIG. 37, a high breakdown voltage MISFET QH is formed in the peripheral circuit region 1B, and a low breakdown voltage MISFET QL is formed in the peripheral circuit region 1C. Namely, the gate electrode GEH and the gate insulation film GIH form a high breakdown voltage MISFET QH; and the gate electrode GEL and the gate insulation film GIL form a low breakdown voltage MISFET QL.

Figure 38:
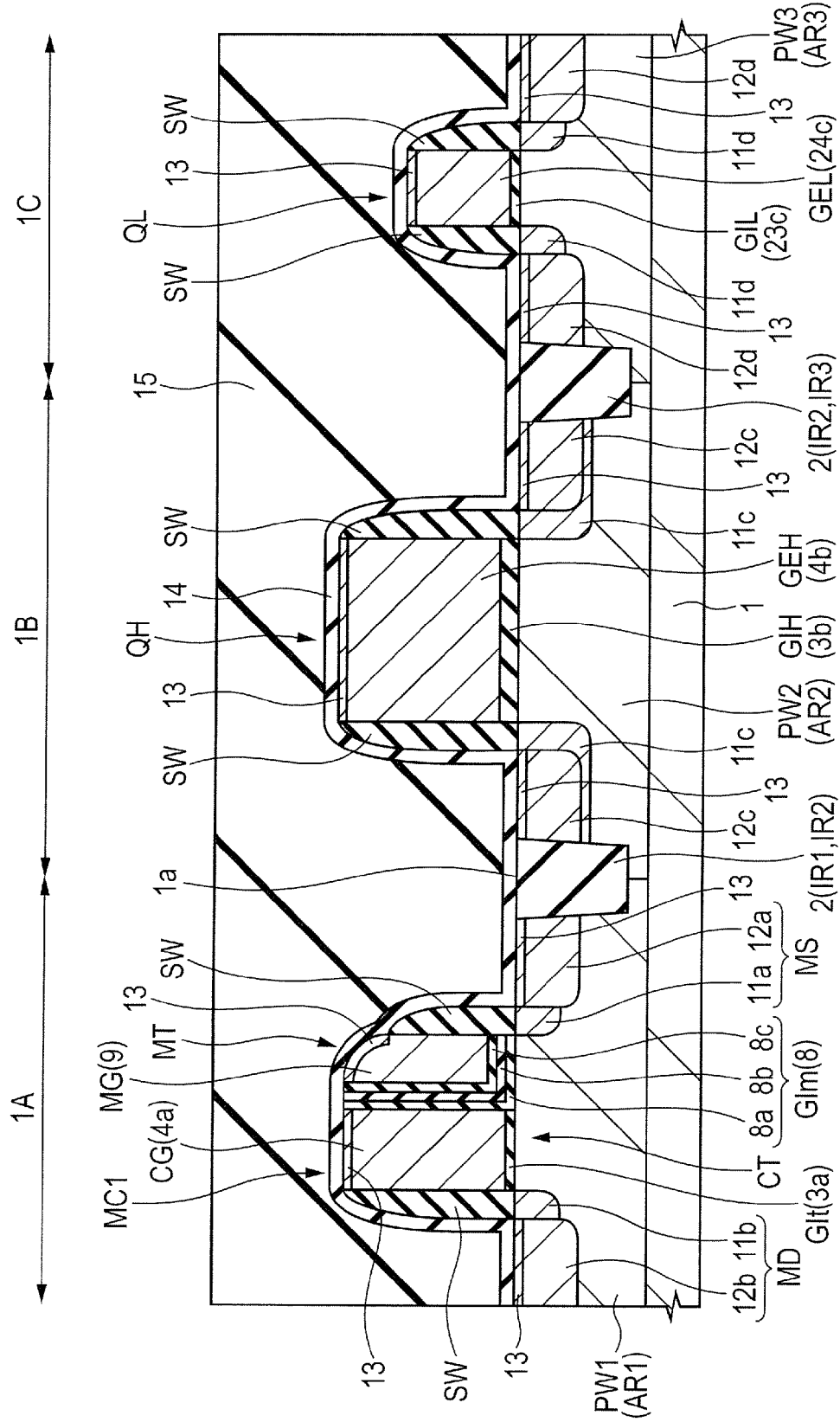
FIG. 38 is an essential part cross sectional view of the semiconductor device of Second Embodiment during a manufacturing step.

Then, the same step as Step S21 of FIG. 5 is performed. As a result, as shown in FIG. 38, there are formed a metal silicide layer 13, an insulation film 14, and an interlayer insulation film 15 (Step S49 of FIG. 24).

Then, the same step as Step S22 of FIG. 5 is performed, thereby to form a plug PG (Step S50 of FIG. 24). As a result, as shown in FIG. 22, the semiconductor device of the present Second Embodiment is manufactured.

Features and Effects of the Present Embodiment

With the method for manufacturing a semiconductor device of the present Second Embodiment, as in First Embodiment, in the memory cell region 1A, a control gate electrode CG formed of a conductive film 4a is formed over the main surface 1a of the semiconductor substrate 1. Then, an insulation film 8 as an ONO film and a conductive film 9 are formed in such a manner as to cover the control gate electrode CG. The conductive film 9 is etched back. As a result, the conductive film 9 is left over the sidewall of the control gate electrode CG via the insulation film 8, thereby to form the memory gate electrode MG. Then, in the peripheral circuit region 1C, in the main surface 1a of the semiconductor substrate 1, there is formed a p type well PW3. Over the p type well PW3, there is formed a conductive film 24. Then, there is formed a gate electrode GEL formed of the conductive film 24. This produces the same effects as those of the method for manufacturing a semiconductor device of First Embodiment.

Further, in the present Second Embodiment, as distinct from First Embodiment, before forming the control gate electrode CG formed of the conductive film 4a, in the peripheral circuit region 1B, the p type well PW2 is formed in the main surface 1a of the semiconductor substrate 1. Furthermore, in the present Second Embodiment, as distinct from First Embodiment, when the control gate electrode CG is formed, over the p type well PW2, there is formed the gate electrode GEH formed of the conductive film 4b.

In the present Second Embodiment, when the insulation film 8 as an ONO film is formed, the p type well PW2 has already been formed. The n type impurity doped into the p type well PW2 may be diffused a little at high temperatures when the insulation film 8 is formed. However, even when the n type impurity doped into the p type well PW2 is diffused a little, the variation amount of a variation in threshold voltage of the high breakdown voltage MISFET QH is smaller than the variation amount of a variation in threshold voltage of the low breakdown voltage MISFET QL because the gate length of the high breakdown voltage MISFET QH is larger than the gate length of the low breakdown voltage MISFET QL, or for other reasons. Namely, the effect exerted by the formation of the insulation film 8 as an ONO film at high temperatures on the characteristics of the high breakdown voltage MISFET QH is smaller than the effect exerted by the formation of the insulation film 8 as an ONO film at high temperatures on the characteristics of the low breakdown voltage MISFET QL.

Therefore, the gate electrode GEH of the high breakdown voltage MISFET QH less affected by the high temperatures for forming the insulation film 8 as an ONO film is formed with the control gate electrode CG of the memory cell MC1 before the formation of the insulation film 8. This can simplify the manufacturing steps of the semiconductor device.

Up to this point, the invention completed by the present inventors was specifically described by way of embodiments. However, it is naturally understood that the present invention is not limited to the foregoing embodiments, and may be variously changed within the scope not departing from the gist thereof.

What is claimed is:

1. A method for manufacturing a semiconductor device, comprising the steps of:
 (a) providing a semiconductor substrate;
 (b) forming, in a first region of a first main surface of the semiconductor substrate, a first insulation film at the first main surface of the semiconductor substrate, and forming, in a second region of the first main surface of the semiconductor substrate, a second insulation film at the same layer as the first insulation film at the first main surface of the semiconductor substrate;
 (c) forming a first conductive film over the first insulation film, and forming a second conductive film at the same layer as the first conductive film over the second insulation film;
 (d) patterning the first conductive film, thereby forming a first gate electrode formed of the first conductive film, forming a first gate insulation film formed of the first insulation film between the first gate electrode and the semiconductor substrate, and leaving the second conductive film;
 (e) forming a third insulation film having a charge accumulation part in the inside thereof at the first main surface of the semiconductor substrate, and the surface of the first gate electrode in the first region;
 (f) forming a third conductive film over the third insulation film;
 (g) etching back the third conductive film, and thereby leaving the third conductive film over the sidewall of the first gate electrode via the third insulation film, and forming a second gate electrode;
 (h) removing the third insulation film at a portion thereof not covered with the second gate electrode, and leaving the third insulation film between the second gate electrode and the semiconductor substrate, and, between the first gate electrode and the second gate electrode;
 (i) removing the second conductive film;
 (j) after the step (h) and the step (i), forming a first semiconductor region of a first conductivity type in the first main surface of the semiconductor substrate in the second region;
 (k) forming a fourth insulation film over the first semiconductor region;

(l) forming a fourth conductive film over the fourth insulation film; and (m) patterning the fourth conductive film, and thereby forming a third gate electrode formed of the fourth conductive film, and forming a second gate insulation film formed of the fourth insulation film between the third gate electrode and the first semiconductor region.

2. The method for manufacturing a semiconductor device according to claim 1, including a step of:

(n) after the step (a), forming a second semiconductor region of a second conductivity type in the first main surface of the semiconductor substrate in the first region, wherein in the step (b), the first insulation film is formed over the second semiconductor region.

3. The method for manufacturing a semiconductor device according to claim 1, including a step of:

(o) after the step (h), forming a fifth insulation film in such a manner as to cover the first gate electrode and the second gate electrode in the first region, wherein, in the step (i), after the step (o), the second conductive film is removed.

4. The method for manufacturing a semiconductor device according to claim 1, including a step of:

(p) after the step (a), forming a third semiconductor region of a third conductivity type in the first main surface of the semiconductor substrate in a third region of the first main surface of the semiconductor substrate, wherein, in the step (b), over the third semiconductor region, a sixth insulation film is formed at the same layer as the first insulation film, wherein, in the step (c), over the sixth insulation film, a fifth conductive film is formed at the same layer as the first conductive film, wherein, in the step (d), the fifth conductive film is patterned, thereby to form a fourth gate electrode formed of the fifth conductive film, and to form a third gate insulation film formed of the sixth insulation film between the fourth gate electrode and the third semiconductor region, and wherein the film thickness of the sixth insulation film is larger than the film thickness of the fourth insulation film.

5. The method for manufacturing a semiconductor device according to claim 4, wherein, in the step (p), a fourth semiconductor region of a fourth conductivity type is formed in the first main surface of the semiconductor substrate in the first region, and wherein, in the step (b), the first insulation film is formed over the fourth semiconductor region.

6. The method for manufacturing a semiconductor device according to claim 4, including a step of:

(q) after the step (h), forming a seventh insulation film in such a manner as to cover the first gate electrode and the second gate electrode in the first region, and to cover the fourth gate electrode in the third region, wherein in the step (i), after the step (q), the second conductive film is removed.

7. The method for manufacturing a semiconductor device according to claim 4, wherein the film thickness of the fourth conductive film is smaller than the film thickness of the fifth conductive film.

8. The method for manufacturing a semiconductor device according to claim 4, wherein, in the step (b), the sixth insulation film is formed integrally with the first insulation film, and wherein, in the step (c), the fifth conductive film is formed integrally with the first conductive film.

9. The method for manufacturing a semiconductor device according to claim 1, including a step of:

(r) after the step (c), forming an eighth insulation film over the first conductive film, wherein, in the step (d), the eighth insulation film and the first conductive film are patterned, thereby to form a first cap insulation film formed of the eighth insulation film over the first gate electrode, and wherein, in the step (e), the third insulation film is formed at the side surface of the first gate electrode, and the surface of the first cap insulation film.

10. The method for manufacturing a semiconductor device according to claim 1, wherein, in the step (h), a fourth gate insulation film is formed, that is formed of the third insulation film at a portion thereof left between the second gate electrode and the semiconductor substrate, and between the first gate electrode and the second gate electrode.

11. The method for manufacturing a semiconductor device according to claim 1, wherein the third insulation film includes a first silicon oxide film, a first silicon nitride film over the first silicon oxide film, and a second silicon oxide film over the first silicon nitride film, and wherein the step (e) includes the steps of: (e1) forming the first silicon oxide film at the first main surface of the semiconductor substrate, and the surface of the first gate electrode in the first region; (e2) forming the first silicon nitride film over the first silicon oxide film; and (e3) forming the second silicon oxide film over the first silicon nitride film.

12. The method for manufacturing a semiconductor device according to claim 1, wherein the semiconductor device has a nonvolatile memory, and wherein the nonvolatile memory is formed of the first gate electrode and the second gate electrode.

13. The method for manufacturing a semiconductor device according to claim 1, wherein, in the step (b), the second insulation film is formed integrally with the first insulation film, and wherein, in the step (c), the second conductive film is formed integrally with the first conductive film.

* * * * *